United States Patent
Pang et al.

(10) Patent No.: US 6,193,802 B1
(45) Date of Patent: *Feb. 27, 2001

(54) PARALLEL PLATE APPARATUS FOR IN-SITU VACUUM LINE CLEANING FOR SUBSTRATE PROCESSING EQUIPMENT

(75) Inventors: Ben Pang, Oakland; David Cheung, Foster City; William N. Taylor, Jr., Dublin; Sebastien Raoux, San Francisco; Mark Fodor, Los Gatos, all of CA (US)

(73) Assignee: Applied Materials, Inc., Santa Clara, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 08/741,230

(22) Filed: Oct. 30, 1996

Related U.S. Application Data

(63) Continuation-in-part of application No. 08/533,174, filed on Sep. 25, 1995, and a continuation-in-part of application No. 08/579,375, filed on Dec. 27, 1995, now abandoned.

(51) Int. Cl.$^7$ ..................................................... C23C 16/00

(52) U.S. Cl. .................. 118/715; 118/723 R; 118/723 E; 156/345

(58) Field of Search ................................. 118/715, 723 E, 118/723 ER, 723 R; 156/345

(56) References Cited

U.S. PATENT DOCUMENTS

| | | |
|---|---|---|
| 4,608,063 | 8/1986 | Kurokawa ............................... 55/208 |
| 4,657,738 | 4/1987 | Kanter et al. ................... 422/186.04 |
| 4,735,633 | 4/1988 | Chiu . |
| 4,816,046 | 3/1989 | Maeba et al. . |
| 5,000,113 | 3/1991 | Wang et al. . |
| 5,141,714 * | 8/1992 | Obuchi et al. ........................ 422/174 |
| 5,211,729 | 5/1993 | Sherman . |
| 5,323,013 | 6/1994 | Kelly et al. ........................ 250/522.1 |

(List continued on next page.)

FOREIGN PATENT DOCUMENTS

| | | |
|---|---|---|
| 1282732A | 9/1991 | (CA) . |
| 43 19 118 A1 * | 6/1993 | (DE) . |
| 4319118A1 | 12/1994 | (DE) . |

(List continued on next page.)

OTHER PUBLICATIONS

Mocella et al., "Options for Environmentally Impacted Perfluorinated Gases Used in Plasma Processing", 10th Symposium Plasma Etching, pp., 192–200 (1994).

(List continued on next page.)

*Primary Examiner*—Gregory Mills
*Assistant Examiner*—Luz Alejandro
(74) *Attorney, Agent, or Firm*—Townsend & Townsend & Crew

(57) ABSTRACT

An apparatus for minimizing deposition in an exhaust line of a substrate processing chamber. The apparatus includes first and second electrodes having opposing surfaces that define a fluid conduit between them. The fluid conduit includes an inlet, an outlet and a collection chamber between the inlet and the outlet. The apparatus is connected at its inlet to receive the exhaust of the substrate processing chamber. The collection chamber is structured and arranged to collect particulate matter flowing through the fluid conduit and to inhibit egress of the particulate matter from the collection chamber. A plasma generation system supplies power to the electrodes to form a plasma from etchant gases within the fluid conduit. Constituents from the plasma react with the particulate matter collected in the collection chamber to form gaseous products that may be pumped out of the fluid conduit. The apparatus may further include an electrostatic collector to enhance particle collection in the collection chamber and to further inhibit egress of the particulate matter.

34 Claims, 23 Drawing Sheets

U.S. PATENT DOCUMENTS

| | | | |
|---|---|---|---|
| 5,417,826 | 5/1995 | Blalock | 204/176 |
| 5,451,378 | 9/1995 | Russell et al. | 412/186.3 |
| 5,453,125 | 9/1995 | Krogh | 118/723 MR |
| 5,453,305 | 9/1995 | Lee | 427/562 |
| 5,827,370 | 10/1998 | Gu | 118/715 |

FOREIGN PATENT DOCUMENTS

| | | | |
|---|---|---|---|
| 196 01 436 A1 | 7/1997 | (DE) | C23F/4/00 |
| 0 158 823 A2 | 10/1985 | (EP) . | |
| 0 176 295 | 4/1986 | (EP) . | |
| 0 289 858 A1 | 4/1988 | (EP) . | |
| 0 296 720 A2 | 12/1988 | (EP) . | |
| 0 296 720 A3 | 12/1988 | (EP) . | |
| 0 767 254 A1 | 4/1997 | (EP) . | |
| 0 781 599 A2 | 7/1997 | (EP) | B01J/19/08 |
| 0 781 599 A3 | 7/1997 | (EP) | B01J/19/08 |
| 51-129868 | 11/1976 | (JP) . | |
| 52-78176 | 7/1977 | (JP) . | |
| 58-101722 | 6/1983 | (JP) . | |
| 59-18619 | 10/1984 | (JP) . | |
| 60-234313 * | 11/1985 | (JP) . | |
| 63-28869 * | 2/1988 | (JP) . | |
| 01 288 355 | 11/1989 | (JP) . | |
| 2-125876 | 5/1990 | (JP) . | |
| 4-136175 * | 5/1992 | (JP) . | |
| 5-202474 | 8/1993 | (JP) . | |
| 09 010 544 | 1/1997 | (JP) . | |
| WO 80/01363 | 7/1980 | (WO) . | |

OTHER PUBLICATIONS

Mocella et al., "Etch Process Characterization Using Neural Network Methodology: A Case Study", *SPIE Process Module Metrology, Control, and Clustering*, vol. 1594, pp. 232–242 (1991).

Mohindra et al., "Abatement of Perfluorocompounds (PFCs) in a Microwave Tubular Reactor Using $O_2$ As An Additive Gas", *Department of Chemical Engineering*, MIT, pp. 1–59. No Date Available.

Lieberman et al., "Principles of Plasma Discharges and Materials Processing,"*Library of Congress Cataloging in Publication Datat*, pp. 404–410, (1994).

W.H. Hayward, "Introduction to Radio Frequency Design," *Library of Congress Cataloging in Publication Data*, pp. 135–137, (1982).

Danielson et al., "Use DryScrub to Improve Hot Wall Nitride Equipment Reliability," *Product Application Report*, pp. 1–6. No Date Available.

Singer et al., "Pre–pump Scrubbers Simplify Maintenance and Improve Safety," *Semiconductor International*, pp. 1–3. No Date Available.

* cited by examiner

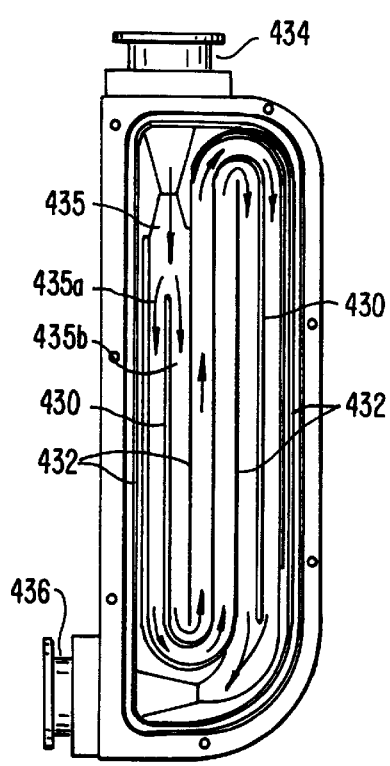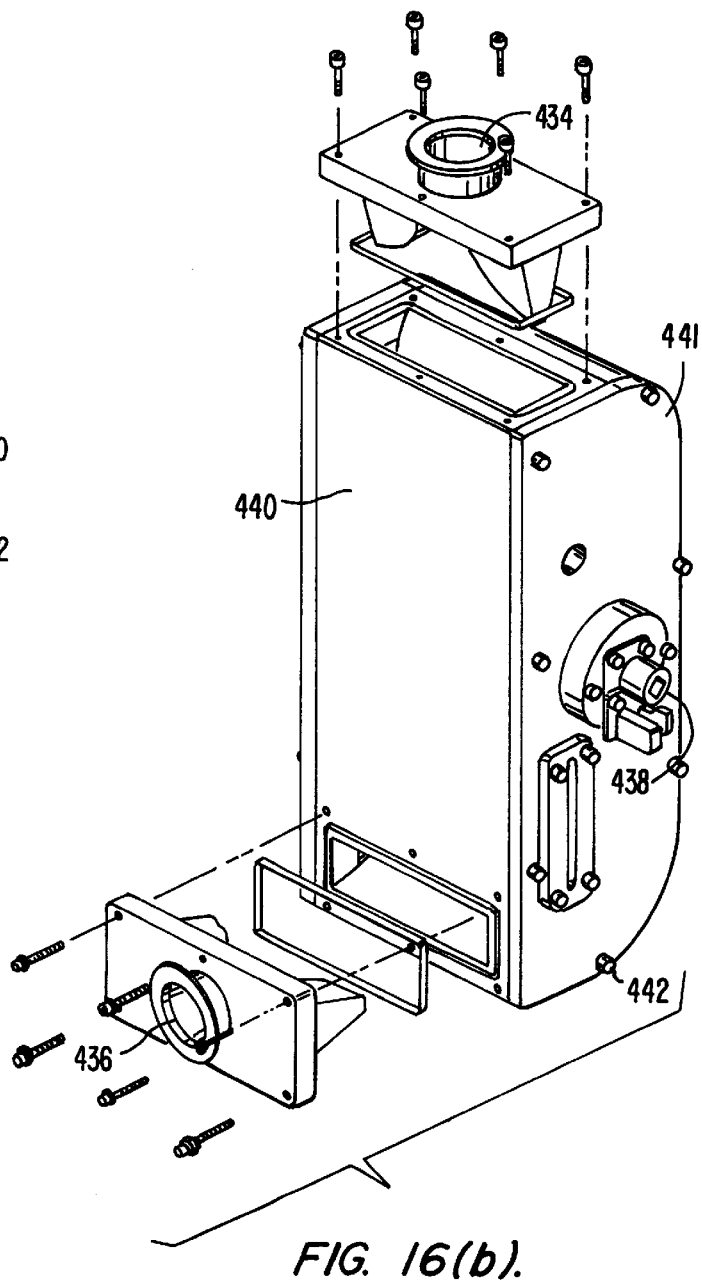
FIG. 16(a).
FIG. 16(b).

PARALLEL PLATE APPARATUS FOR IN-SITU VACUUM LINE CLEANING FOR SUBSTRATE PROCESSING EQUIPMENT

CROSS-REFERENCE TO RELATED APPLICATIONS

This application is a Continuation-In-Part of U.S. patent application "METHOD AND APPARATUS FOR CLEANING A VACUUM LINE IN A CVD SYSTEM," U.S. Ser. No. 08/533,174, filed Sep. 25, 1995, having Ben Pang, David Cheung, William N. Taylor Jr., Sebastien Raoux, and Mark Fodor as inventors and assigned to Applied Materials, Inc. The application is also a continuation-in-part of U.S. patent application "METHOD AND APPARATUS FOR REDUCING PERFLUOROCOMPOUND GASES FROM SUBSTRATE PROCESSING EQUIPMENT EMISSIONS," U.S. Ser. No. 08/579,375, filed Dec. 27, 1995, now abandoned, having David Cheung, Sebastien Raoux, Judy H. Huang, William N. Taylor Jr., Mark Fodor, and Kevin Fairbairn as inventors and assigned to Applied Materials, Inc. Both the Ser. Nos. 08/533,174 and 08/579,375 applications are hereby incorporated by reference in their entirety.

This application is also related to concurrently filed and commonly assigned patent application entitled "METHOD AND APPARATUS FOR REDUCING PERFLUOROCOMPOUND GASES FROM SUBSTRATE PROCESSING EQUIPMENT EMISSIONS", having David Cheung, Sebastien Raoux, Judy H. Huang, William N. Taylor Jr., Mark Fodor and Kevin Fairbairn listed as co-inventors; and to concurrently filed and commonly assigned patent application entitled "MICROWAVE APPARATUS FOR IN-SITU VACUUM LINE CLEANING FOR SUBSTRATE PROCESSING EQUIPMENT", having Sebastien Raoux, Tomi Tanaka, Mukul Kelkar, Hari Ponnekanti, Kevin Fairbairn and David Cheung listed as co-inventors.

BACKGROUND OF THE INVENTION

The present invention relates generally to the field of semiconductor processing equipment and more specifically to a method and apparatus for eliminating contaminants and residues from inside a vacuum exhaust line connected to a processing chamber and to a method and apparatus for reducing perfluorocompound (PFC) gas emissions from a processing chamber.

During chemical vapor deposition (CVD) processing, deposition gases are released inside a processing chamber to form a thin film layer on the surface of a substrate being processed. Unwanted deposition on areas such as the walls of the processing chamber also occurs during such CVD processes. Because the residence time in the chamber of individual molecules in these deposition gases is relatively short, however, only a small portion of the molecules released into the chamber are consumed in the deposition process and deposited on either the wafer or chamber walls.

The unconsumed gas molecules are pumped out of the chamber along with partially reacted compounds and reaction byproducts through a vacuum line that is commonly referred to as the "foreline." Many of the compounds in this exhausted gas are still in highly reactive states and/or contain residues or particulate matter that can form unwanted deposits in the foreline. Given time, this deposition build-up of powdery residue and/or particulate matter presents a problem. First, the matter is often a pyrophoric substance that may present problems when the vacuum seal is broken and the foreline is exposed to ambient conditions during standard, periodic cleaning operations. Second, if enough of the deposition material builds-up in the foreline, the foreline and/or its associated vacuum pump may clog if it is not appropriately cleaned. Even when periodically cleaned, matter build-up interferes with normal operation of the vacuum pump and can drastically shorten the useful life of the pump. Also, the solid matter may backwash from the foreline into the processing chamber and contaminate processing steps adversely effecting wafer yield.

To avoid these problems, the inside surface of the foreline is regularly cleaned to remove the deposited material. This procedure is performed during a standard chamber clean operation that is employed to remove unwanted deposition material from the chamber walls and similar areas of the processing chamber. Common chamber cleaning techniques include the use of an etching gas, such as fluorine, to remove the deposited material from the chamber walls and other areas. The etching gas is introduced into the chamber and a plasma is formed so that the etching gas reacts with and removes the deposited material from the chamber walls. Such cleaning procedures are commonly performed between deposition steps for every wafer or every N wafers.

Removal of deposition material from chamber walls is relatively straightforward in that the plasma is created within the chamber in an area proximate to the deposited material. Removal of deposition material from the foreline is more difficult because the foreline is downstream from the processing chamber. In a fixed time period, most points within the processing chamber come in contact with more of the etchant fluorine atoms than do points within the foreline. Thus, in a fixed time period, the chamber may be adequately cleaned by the clean process while residue and similar deposits remain in the foreline.

To attempt to adequately clean the foreline, the duration of the clean operation must be increased. Increasing the length of the clean operation, however, is undesirable because it adversely effects wafer throughput. Also, such residue build-up can be cleaned only to the extent that reactants from the clean step are exhausted into the foreline in a state that they may react with the residue in the foreline. In some systems and applications, the lifetime of the exhausted reactants is not sufficient to reach the end or even middle portions of the foreline. In these systems and applications, residue build-up is even more of a concern. Accordingly, there is a need for an apparatus for efficiently and thoroughly cleaning the foreline in a semiconductor processing system and a method of doing the same.

One approach that has been employed to clean the foreline relies on a scrubbing system that uses plasma enhanced CVD techniques to extract reactive components in the exhaust gas as film deposits on electrode surfaces. The scrubbing system is designed to maximize the removal of reactants as a solid film and uses large surface area spiral electrodes. The spiral electrodes are contained within a removable canister that is positioned near the end of the foreline between the blower pump and mechanical pump. After a sufficient amount of solid waste has built up on the electrodes, the canisters may be removed for disposal and replacement.

Problems exist in this prior art method in that the system relies on the large surface area of the electrodes to provide an area for deposited solid matter to collect. To accommodate the large surface area of the electrodes, the system is necessarily large and bulky. Furthermore, extra expenses are incurred in the operation of this prior art scrubber system since the removable canister is a disposable product that must be replaced and properly disposed. Also, the scrubbing system is located downstream from a beginning portion of the vacuum foreline and thus does not ensure removal of powdery material or particulate matter that builds-up in this portion of the line.

From the above it can be seen that an improved method and apparatus for cleaning a foreline is desirable.

Another issue of concern in CVD and other substrate processing apparatus relates to the types of gases and byproducts exhausted from the processing chamber through the foreline. For example, because dissociation of gas within the cleaning plasma is not complete (in some applications only 10% of the introduced gas molecules are dissociated), and the residence time in the chamber of individual molecules in the cleaning gas is relatively short, only a small portion of the molecules released into the chamber react with the deposited material. The gas molecules that do not take part in an etchant reaction are pumped out of the chamber along with the etched away material and reaction byproducts through a vacuum line that is commonly referred to as the "foreline." The exhausted gases are emission byproducts of the semiconductor process.

Many of the fluorine containing gases employed in the semiconductor industry as cleaning etchant gases are referred to as perfluorocompounds or "PFC's" for short. Some of the more commonly used PFC's include $CF_4$, $C_2F_6$, $NF_3$ and $SF_6$ or similar gases. These gases are known to have a long lifetime (up to 50,000 years for $CF_4$), and it is also believed that they have a large global warming potential. Thus, their release into the atmosphere is potentially damaging and is becoming the subject of government and other regulations. Accordingly, it is important to reduce PFC emissions from semiconductor processing equipment such as CVD reaction chambers.

SUMMARY OF THE INVENTION

The present invention solves the above problems of the prior art by providing an apparatus that substantially prevents particulate matter and other residual material from building up in an exhaust line of a substrate processing chamber and/or reducing PFC emissions from such a chamber. Different embodiments of the present invention can be specifically designed and optimized for either particle reduction or PFC emissions reduction. It is also possible to design an embodiment optimized for both particle and PFC emissions reduction for use with certain substrate processing operations.

The present invention achieves these goals while being process transparent. That is, in preferred embodiments, operation of the present invention takes no additional processing time to either prevent particulate matter from building up within the foreline or reduce PFC emissions as appropriate. Also, in some preferred embodiments, the present invention does not require the use of additional gases and/or consumable parts.

In one embodiment of the apparatus according to the present invention designed and optimized for particle reduction, a pair of capacitively coupled electrodes define a labyrinthal gas passageway situated between an inlet and outlet of the apparatus. Powder residue and other particulate matter that would otherwise collect in the vacuum line when exhausted from a substrate processing chamber (e.g., during a CVD step) are trapped in the gas passageway. The apparatus can include a plasma generation system that supplies power to the electrodes to form a plasma within the gas passageway. The plasma is formed from unreacted exhaust gases pumped through the gas passageway during a clean cycle. Constituents from the plasma react with the trapped particulate matter to convert the matter into gaseous products that are readily pumped through and out of the exhaust line.

In another embodiment, the apparatus of the present invention includes first and second members having opposing surfaces that define a fluid conduit. The fluid conduit has an inlet, an outlet and a collection chamber between the inlet and the outlet that is structured and arranged to collect particulate matter flowing through the fluid conduit and to inhibit egress of the particulate matter from the collection chamber. A microwave plasma generation system is operatively coupled to the apparatus to form a plasma from etchant gases within said fluid conduit. Constituents from said plasma react with the particulate matter collected in the collection chamber to form gaseous products that may be pumped out of the fluid conduit. In preferred versions of this embodiment of the apparatus, the first and second members are each electrodes and the apparatus also includes a particle trapping system that applies a voltage between the two electrodes to collect particulate matter on the electrode surfaces. The plasma also reacts with this electrically collected matter to convert the matter to gaseous products that may be pumped out of the apparatus.

The gas passageway includes at least one collection chamber that is structured and arranged such that gravitational forces act to collect particulate matter flowing through the passageway and inhibit egress of the particulate matter from the collection chamber. Additionally, a voltage is applied to at least one of the electrodes to create a voltage field between the electrodes that helps collect and trap particulate matter flowing through the passageway.

In other embodiments, the present invention is designed and optimized to reduce PFC emissions from semiconductor processing equipment. One embodiment of such an apparatus includes a vessel chamber that defines a fluid conduit. A source of a PFC oxidizing agent is within the fluid conduit, and a plasma generation system forms a plasma from effluent PFC gases pumped through the apparatus. Constituents from the plasma react with the PFC oxidizing agent to convert the effluent PFC gases to less harmful, water soluble, non-PFC gaseous products and byproducts.

A preferred embodiment of the apparatus of the present invention provides the PFC oxidizing agent within a silicon containing filter. A plasma generation system forms a plasma from effluent PFC gases pumped through the apparatus. Constituents from the plasma react with a silicon containing compound in the filter and convert the effluent PFC gases to less harmful, non-PFC gaseous products and byproducts. In a preferred version of this embodiment, the silicon containing compound is a silicon oxide material.

In another embodiment of the present invention, a gaseous silicon source and/or oxygen source is introduced into the apparatus to provide the PFC oxidizing agent. A plasma is formed from the gaseous silicon source and/or oxygen source and the PFC gas. Constituents from the plasma react to convert the effluent PFC gases to less harmful, non-PFC gaseous products and byproducts.

In still another embodiment of the present invention, a particle trapping and collection system reduces particle build up within an exhaust line connected to a substrate processing chamber and the collected particles and residue provides the PFC oxidizing agent. The particle trapping and collection system traps silicon containing residue from a deposition process that produces such residue. A plasma generation system forms a plasma from the effluent PFC gases. Constituents from the plasma react with the collected residue to convert the effluent PFC gases to less harmful, non-PFC gaseous products and byproducts.

In one version of such an embodiment, a pair of capacitively coupled electrodes define a labyrinthal gas passageway. DC or AC voltage is applied to the electrodes to create a voltage field within the passageway. The voltage field attracts negatively charged particles exhausted through the passageway on one electrode and positively charged particles on the other electrode. The defined passageway also includes at least one area (collection chamber) in which gravitational forces act to trap particulate matter exhausted through the passageway. PFC gases exhausted through the passageway are subjected to RF power applied to the electrodes and excited into a plasma state. Constituents from the plasma react with silicon residue particles trapped in the collection chamber to convert the PFC gases into non-PFC gaseous byproducts.

These and other embodiments of the present invention, as well as its advantages and features are described in more detail in conjunction with the text below and attached figures.

BRIEF DESCRIPTION OF THE DRAWINGS

FIG. 16(a) is a side cross-sectional view of another embodiment of the vacuum line cleaning apparatus of the present invention;

FIG. 16(b) is a perspective view of the vacuum line cleaning apparatus shown in FIG. 16(a);

DETAILED DESCRIPTION OF THE PREFERRED EMBODIMENTS

I. Exemplary Semiconductor Processing Chamber

Figure 1:
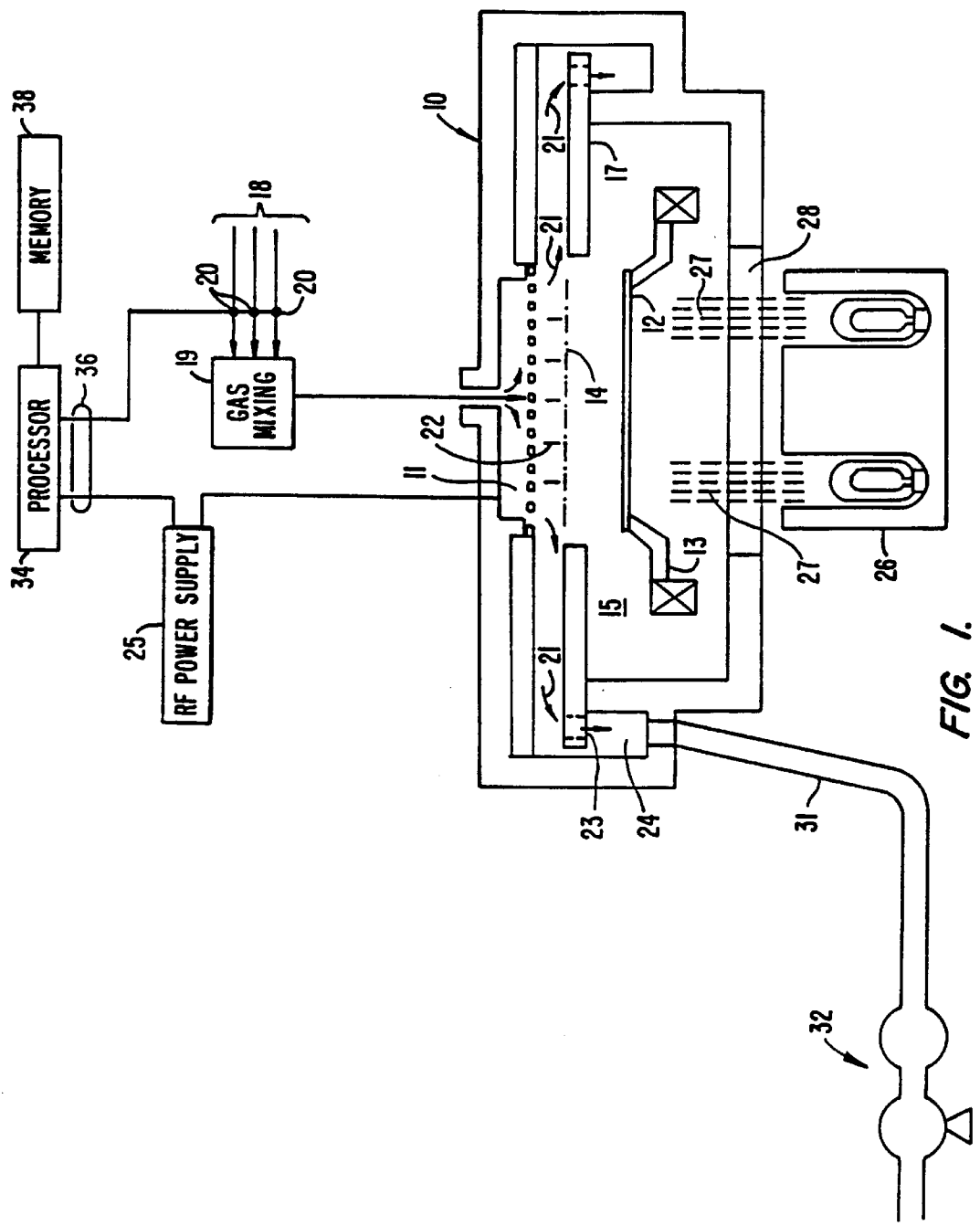
FIG. 1 illustrates one embodiment of a simplified chemical vapor deposition apparatus to which the apparatus of the present invention may be attached.

The apparatus of the present invention can be used in conjunction with a variety of different semiconductor processing devices. One suitable device, a chemical vapor deposition machine, is shown in FIG. 1 which is a cross-sectional view of a simplified, parallel plate chemical vapor deposition system 10. System 10 includes a gas distribution manifold 11 for dispersing deposition gases to a wafer, not shown, that rests on a susceptor 12 in a vacuum chamber 15. Susceptor 12 is highly thermally responsive. Susceptor 12 (and the wafer supported on the upper surface of susceptor 12) can be controllably moved between a lower loading/off-loading position and an upper processing position 14 which is closely adjacent manifold 11.

When susceptor 12 and the wafer are in processing position 14, they are surrounded by a baffle plate 17 having a plurality of spaced holes 23 which exhaust into an annular vacuum manifold 24. During processing, gas inlet to manifold 11 is uniformly distributed radially across the surface of the wafer as indicated by arrows 21. The gas is then exhausted via ports 23 into the circular vacuum manifold 24 and through a vacuum foreline 31 by a vacuum pump system 32. Before reaching manifold 11, deposition and carrier gases are supplied through gas lines 18 into a mixing chamber 19 where they are combined and then sent to manifold 11.

A controlled plasma is formed adjacent to the wafer by RF energy applied to manifold 11 from RF power supply 25. Gas distribution manifold 11 is an RF electrode, while susceptor 12 is grounded. RF power supply 25 can supply either single or mixed frequency RF power (or other desired variations) to manifold 11 to enhance the decomposition of reactive species introduced into chamber 15.

A circular external lamp module 26 provides a collimated annular pattern of light 27 through quartz window 28 onto an annular outer peripheral portion of susceptor 12. Such heat distribution compensates for the natural heat loss pattern of the susceptor and provides rapid thermal and uniform susceptor and wafer heating for effecting deposition.

A motor, not shown, raises and lowers susceptor 12 between a processing position 14 and a lower, wafer-loading position. The motor, gas supply valves (not shown) connected to gas lines 18 and RF power supply 25 are controlled by a processor 34 over control lines 36 of which only some are shown. Processor 34 operates under the control of a computer program stored in a computer-readable medium such as a memory 38. The computer program dictates the timing, mixture of gases, chamber pressure, chamber temperature, RF power levels, susceptor position, and other parameters of a particular process.

Typically, any or all of the chamber lining, gas inlet manifold faceplate, support fingers 13, and various other reactor hardware is fabricated from material such as anodized aluminum. An example of such a PECVD apparatus is described in U.S. Pat. No. 5,000,113 entitled "Thermal CVD/PECVD Reactor and Use for Thermal Chemical Vapor Deposition of Silicon Dioxide and In-situ Multi-step Planarized Process," which is commonly assigned.

The above reactor description is mainly for illustrative purposes, and the present invention may be used with other CVD equipment such as electron cyclotron resonance (ECR) plasma CVD devices, induction coupled RF high density plasma CVD devices, or the like. The present invention may also be used with thermal CVD devices, plasma etching devices, physical vapor deposition devices and other substrate processing devices. The apparatus of the present invention and the method for preventing deposition build-up within a vacuum line is not limited to any specific semiconductor processing apparatus or to any specific deposition or etching process or method.

II. Exemplary Uses of the Present Invention

During semiconductor processing operations such as chemical vapor deposition processes carried out by CVD reactor 10, a variety of gaseous waste products and contaminants are exhausted from vacuum chamber 15 into vacuum line 31. Depending on the particular operation being performed, these exhaust products may include either or both particulate matter, such as partially reacted products and byproducts that leaves a residue or similar powdery material within the foreline as it is exhausted through the foreline, or PFC gases. The present invention prevents build-up of such particulate matter in the foreline and/or reduces PFC gases emitted from vacuum chamber 15. Different embodiments of the present invention can be specifically designed and optimized to either prevent such particle build-up or reduce PFC gas emissions. Also, some embodiments of the present invention may be optimized to reduce both particle build-up and PFC emissions.

Figure 2:
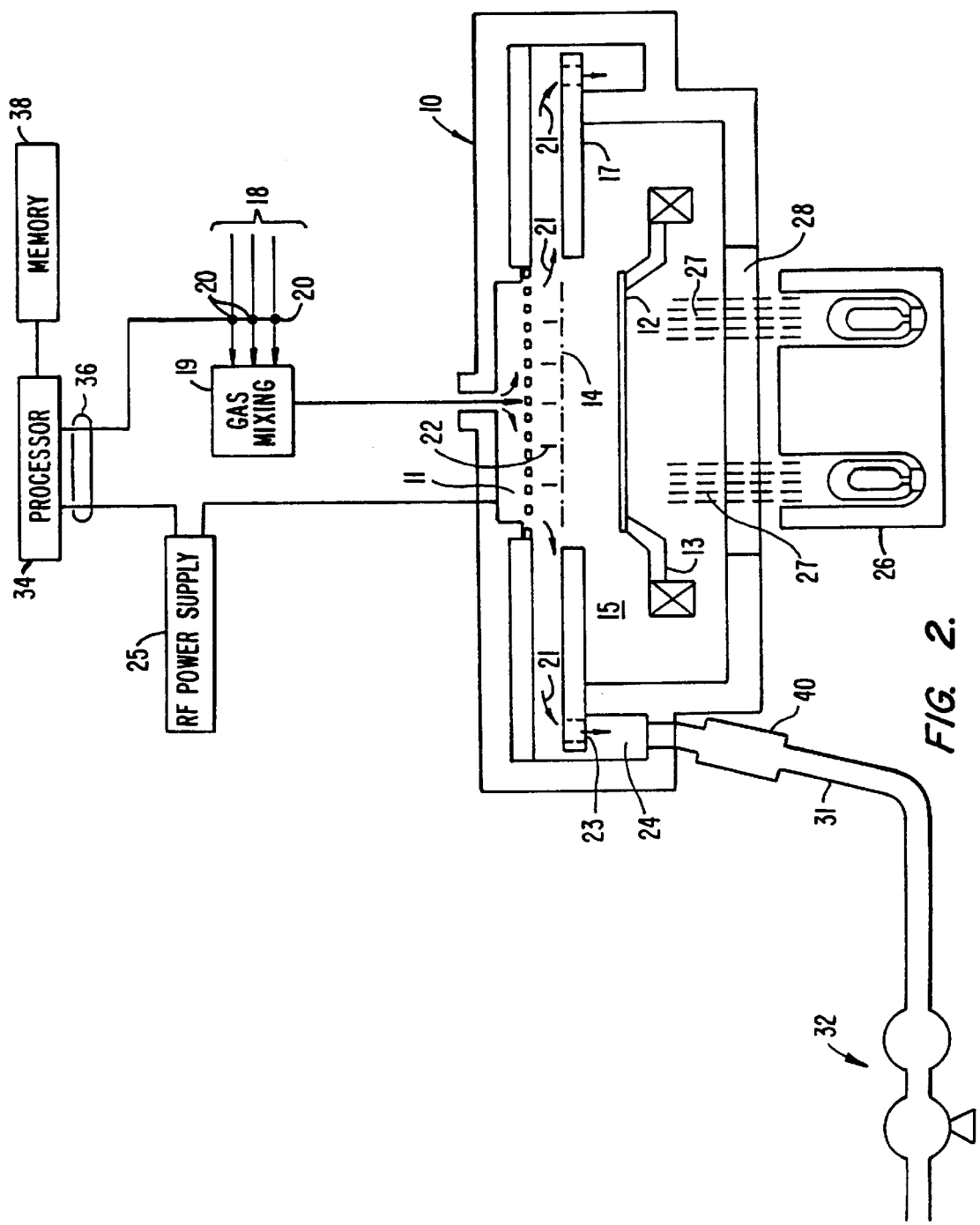
FIG. 2 illustrates one method of connecting the present invention to the chemical vapor deposition apparatus of FIG. 1.

As shown in FIG. 2, which is a cross-sectional view of the simplified CVD apparatus of FIG. 1 fitted with the apparatus of the present invention, the apparatus of the present invention is positioned downstream from the exhaust gas source—the processing chamber. The apparatus may either connect to or replace a portion of the vacuum foreline. In FIG. 2, a downstream plasma cleaning apparatus 40 (hereinafter referred to as "DPA 40" or "the DPA") is fitted between vacuum pump system 32 and vacuum manifold 24 along a portion of vacuum line 31. Because of its position, gases exhausted from vacuum chamber 15 necessarily passes through DPA 40. DPA 40 may be positioned at any location along vacuum line 31, but preferably, DPA 40 is positioned as close as possible to exhaust manifold 24 so that gases exhausted from chamber 15 pass through DPA 40 before passing through any portion of vacuum line 31.

Figure 3:
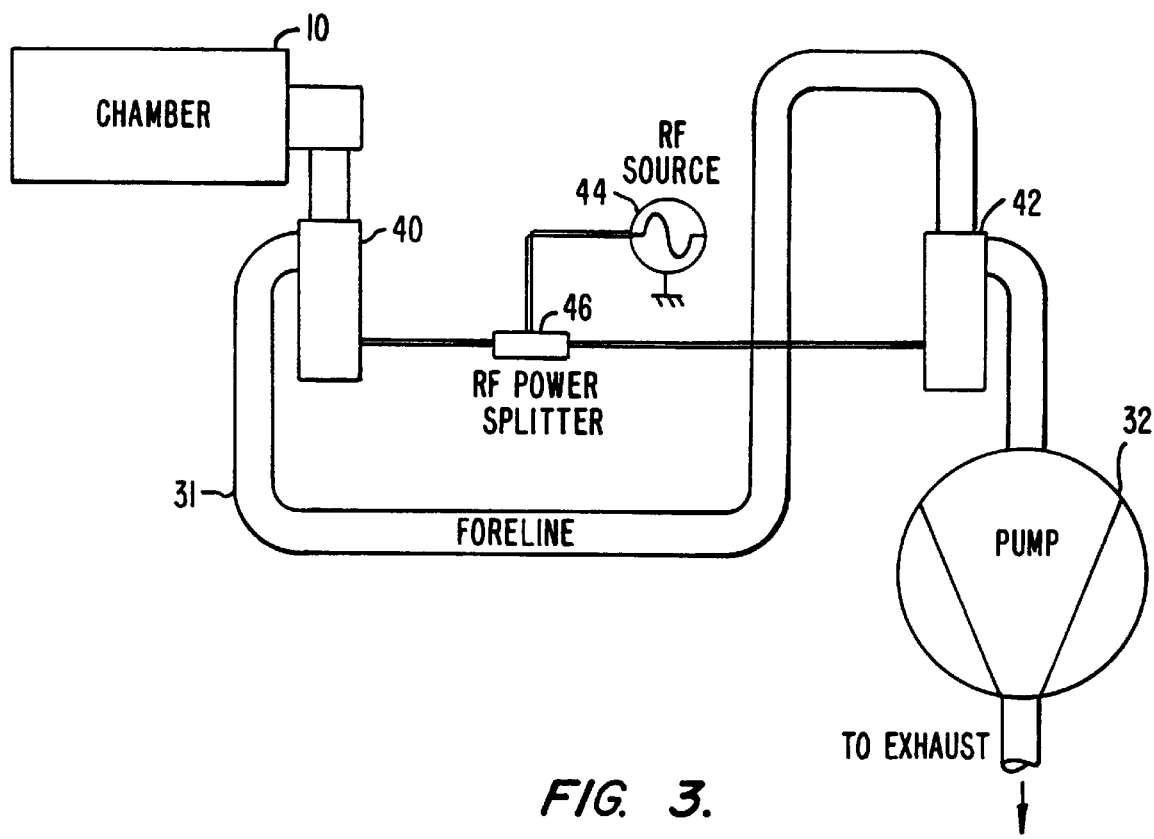
FIG. 3 illustrates a second method of connecting the present invention to the chemical vapor deposition apparatus of FIG. 1.

Also, as shown in FIG. 3, it is possible to connect two or more DPAs to vacuum line 31. Such a configuration might be used, for example, to employ two DPA's optimized for particle collection to further protect vacuum pump 32 from particle and residue build-up. In the configuration shown in FIG. 3, a second DPA 42 is positioned downstream from DPA 40 just before pump 32. If any particulate matter escapes DPA 40, the matter can be trapped and converted into gaseous form within DPA 42. DPAs 40 and 42 can both be driven by a single RF power supply 44 with the power being split by a splitter 46. Optionally, DPAs 40 and 42 may each be driven by separate RF power supplies or may both be driven from the main RF power supply connected to processing chamber 10.

Such a two-DPA configuration may also be used to employ two DPAs optimized toward PFC reduction to further limit emitted PFC gases. Or, alternatively, a two-DPA configuration can include one DPA optimized toward particle reduction and one DPA optimized toward PFC reduction. If separate DPAs optimized for PFC reduction and particle collection, are employed, it is preferable to position the DPA optimized for particle collection in the foreline upstream of the PFC reduction DPA. Such a configuration helps better prevent particle build-up in the entire foreline rather than just a latter section and can also reduce potentially unwanted particle build-up in the PFC-reducing DPA.

Details of various configurations and embodiments of DPA 40 as configured and optimized to reduce particle build-up in the foreline and/or to reduce PFC emissions are discussed below. These embodiments are illustrated for exemplary purposes only. In no way should it be construed that the present invention is limited to these specific configurations or embodiments.

A. Specific Embodiments of DPA 40 Optimized For Particle Reduction

Some embodiments of the present invention are configured and optimized for reducing particle and residue build-up within the foreline as such particles are exhausted from the chamber. As an example of such particulate matter, during the deposition of a silicon nitride film using silane ($SiH_4$), nitrogen ($N_2$) and ammonia ($NH_3$) as precursors, residue in the form of a brown powder composed of $Si_xN_yH_z$, $Si_xH_y$ and elemental silicon has been observed in the foreline. It is believed that this residue build-up is from half-reacted byproducts of the reaction of $SiH_4+N_2+NH_3$. As far as the inventors are aware, silane-based silicon nitride CVD deposition operations are among the substrate processing operations that generate the most particles. Other substrate processing operations may also generate particle build-up and residue, however. For example, similar residues are also formed during the deposition of silicon nitride layers using other precursor gases or liquids such as disilane ($Si_2H_6$) or organic sources. Residue build-up may also occur during the deposition of oxynitride films, silicon oxide, silicon carbide and amorphous silicon films among other layers and may also occur during plasma etching and other process steps.

The particle reduction embodiments of the invention prevent build-up of such residues and particulate matter by trapping the particulate matter in a collection chamber and exciting reactant gases exhausted through the vacuum foreline and the residual and particulate matter within the collection chamber into a plasma state. The plasma reacts with the residue and particulate matter that is trapped in the collection chamber to form gaseous products and byproducts that may be pumped through the DPA and the vacuum line without forming deposits or condensing within the line.

In operation, as deposition gases are exhausted from vacuum chamber 15 through vacuum line 31, particulate matter and residue from the gases are deposited on the interior surface of a gas passageway within the DPA. Removal of the particulate matter and residues may be achieved by activating DPA 40 to form a plasma within the DPA. The DPA is activated to form such a plasma during a clean cycle when etchant gases are exhausted from chamber 15.

When activated, DPA 40 creates a voltage field that forms a plasma from the exhaust (etchant) gases passing through the DPA into a plasma state. The plasma enhances decomposition of the particulate and residual matter within DPA 40 into gaseous products and byproducts that may be pumped out through the foreline thus preventing particle deposition or residue build-up within the foreline. For example, in the case where residue build-up within DPA 40 is in the form of the brown powder comprising $Si_xN_yH_z$, $Si_xH_y$ and elemental silicon as described above in respect to silicon nitride deposition and the etchant gas employed during the clean cycle is a $CF_4$ and $N_2O$ mixture, it is believed that the plasma formed by DPA 40 breaks the residue down into gaseous components such as $SiF_x$, $COF_2$, $F_2$, $SiOF_2$, CO and $CO_2$, NO, O and $O_2$.

In some applications, rather than creating a plasma from etchant gases exhausted into the DPA, DPA 40 actually maintains the plasma formed in the substrate process chamber. That is, in these applications, some or all of the plasma formed in the chamber may still be active downstream of the chamber. This may occur, for example, during a chamber clean operation when a plasma is formed from highly reactive fluorinated species. Constituents from the plasma may be exhausted from the chamber into the foreline and DPA while still in an excited or plasma state. Thus, in these embodiments, the voltage field in DPA 40 may actually maintain a plasma rather than form a new one. Neither the design nor the operation of the DPA needs to be modified depending on whether a plasma is maintained or created within the DPA.

While DPA 40 is activated to form and/or maintain a plasma only during clean cycles in most embodiments, it is possible in other embodiments to sustain a plasma during both deposition and clean cycles in order to further react the CVD gases in other embodiments. In such a configuration, an additional etchant gas can be introduced upstream of the DPA or directly into the DPA during the deposition cycle as described in more detail below.

In addition to collecting residue by normal deposition within DPA 40, various preferred embodiments of DPA 40 are specifically designed to trap particulate matter exhausted from chamber 15 within the DPA so that the matter cannot be deposited downstream of the DPA. Trapping is done using mechanical, electrostatic and/or thermophoretic trapping mechanisms as described in more detail below. Once trapped, particulate matter remains in DPA 40 until it reacts during the clean process with active species in the plasma to form gaseous byproducts that are then pumped through vacuum line 31.

In these embodiments, it is possible to effectively reduce particle build-up without the application of a voltage field that forms or maintains a plasma within the DPA. This is possible, for example, when the ionization of the etchant (e.g., fluorine) is sufficiently high during the chamber clean such that the free radicals generated in the clean plasma have a lifetime long enough to still be in an excited state when exhausted into the DPA. In such an excited state, the free radicals can react with the trapped particulate matter and convert the matter to gaseous products as described above.

A plasma can be generated within DPA 40 using a variety of known techniques such as application of HF or RF power to capacitively coupled electrodes or inductively coupled coils or by microwave or ECR techniques. Specific embodiments of some of these methods are described below in more detail. In each embodiment described below, it is preferable for cost efficiency reasons that the described DPA be designed to be process transparent. That is, DPA 40 is preferably designed to prevent particle build-up within the foreline without requiring the use of any extra clean gas or extra clean time. Also, it is preferable that the DPA not have any adverse effect on film properties such as uniformity, particle contamination, stress and others.

1. The Preferred Embodiment

Figure 4A:
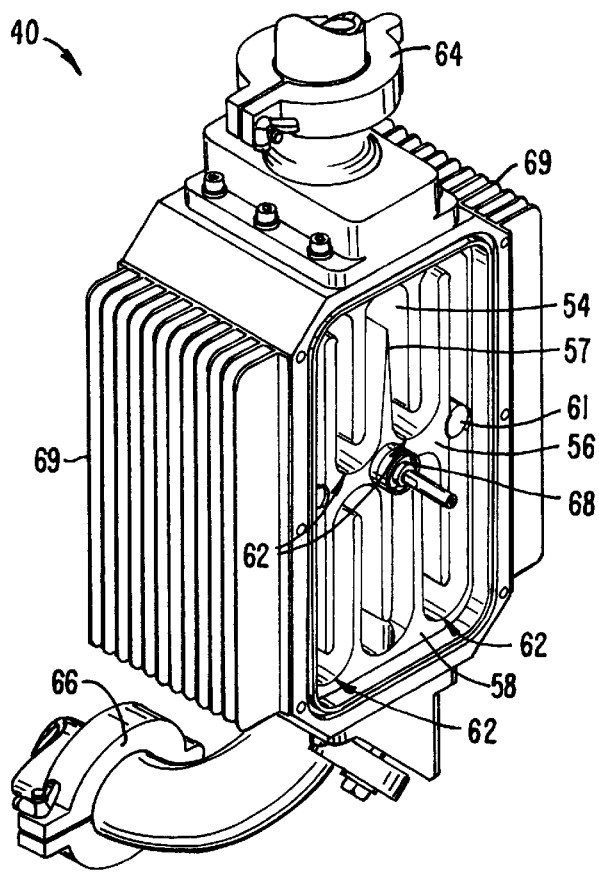
FIG. 4(a) is a perspective view of a preferred embodiment of the apparatus of the present invention optimized for particle reduction (vacuum line cleaning) without a door.
Figure 4B:
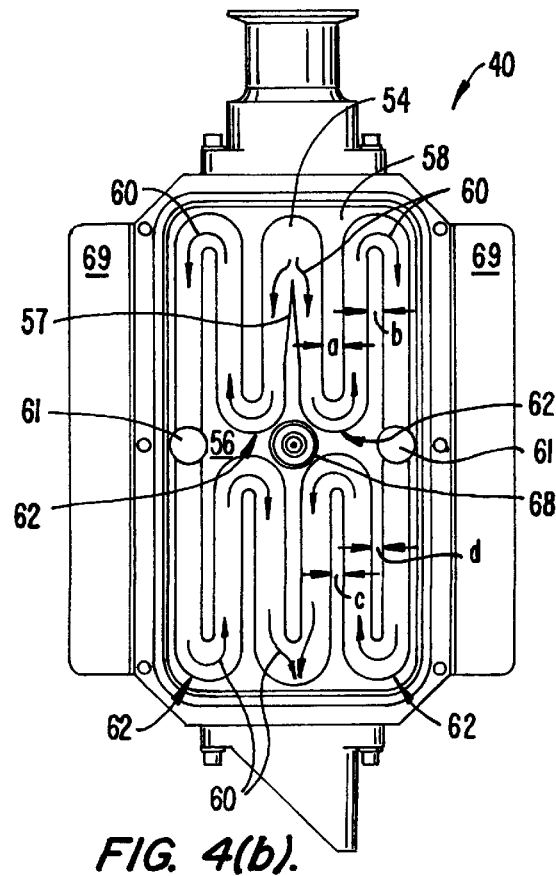
FIG. 4(b) is a front view of the vacuum line cleaning apparatus shown in FIG. 4(a) without a door.
Figure 4C:
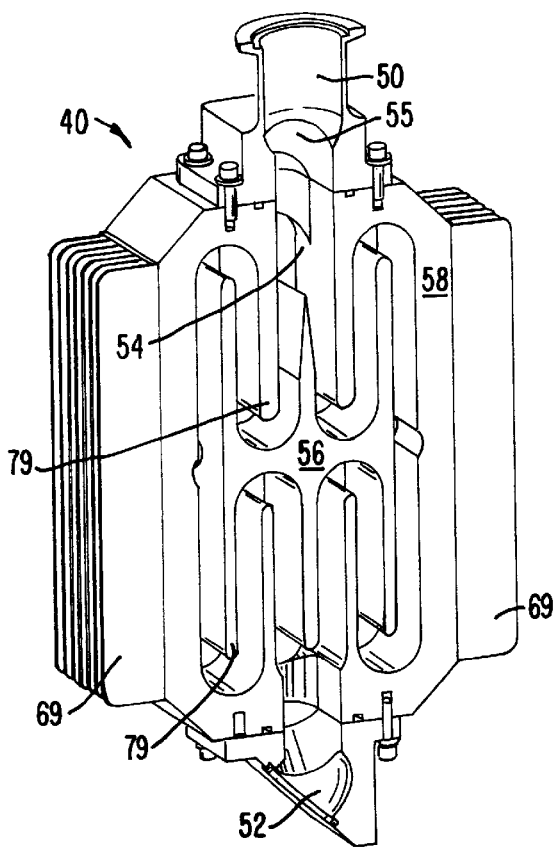
FIG. 4(c) is a front perspective cross-sectional view of the vacuum line cleaning apparatus shown in FIG. 4(a) taken from a plane in the center of the apparatus.
Figure 4D:
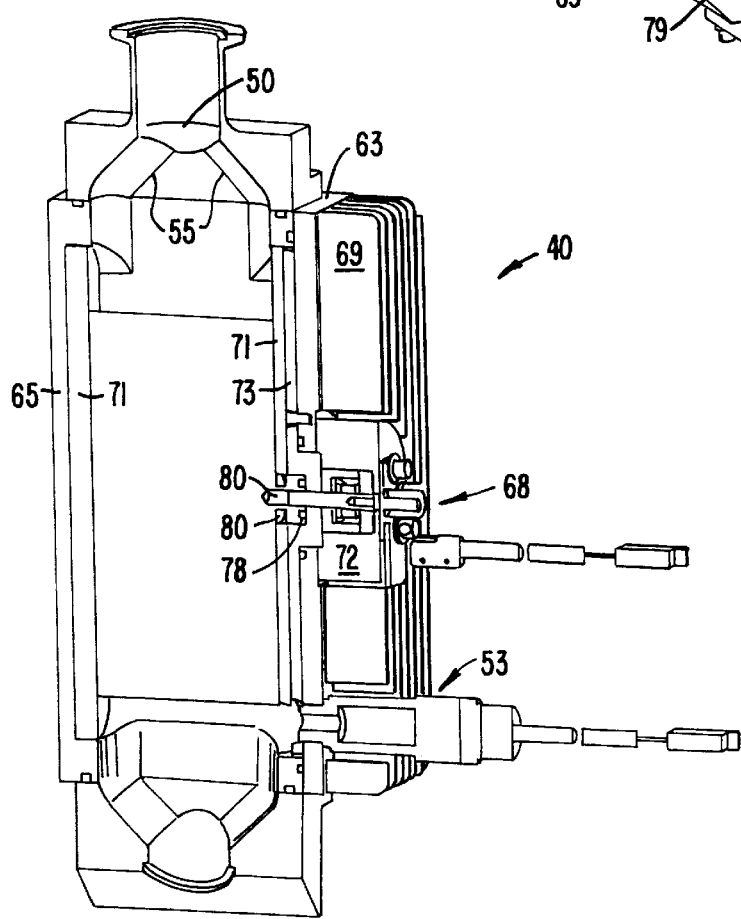
FIG. 4(d) is a side perspective cross-sectional view of the vacuum line cleaning apparatus shown in FIG. 4(a) taken from a plane in the center of the apparatus.
Figure 4E:
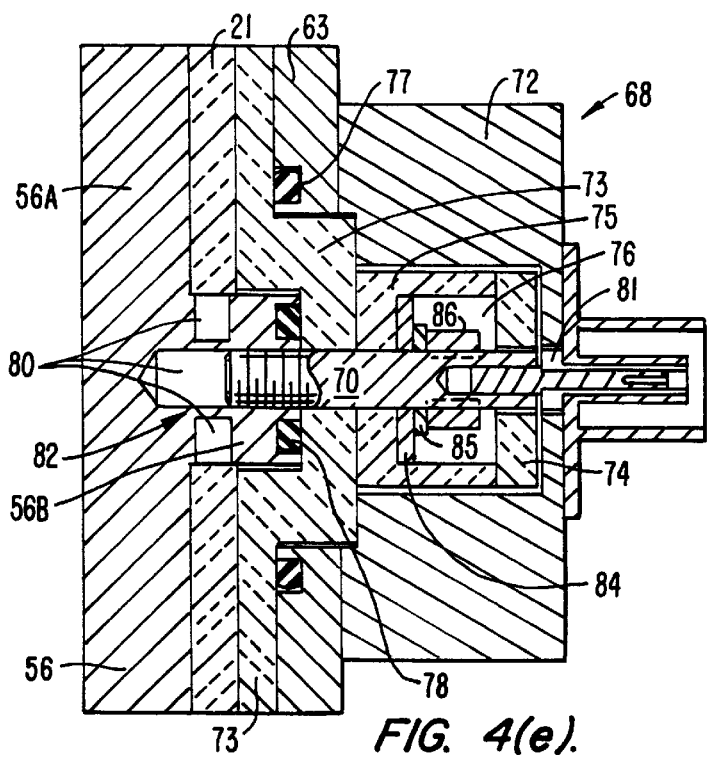
FIG. 4(e) is a cross-sectional view of the power feed through connection to the vacuum line cleaning apparatus shown in FIG. 4(a)
Figure 4F:
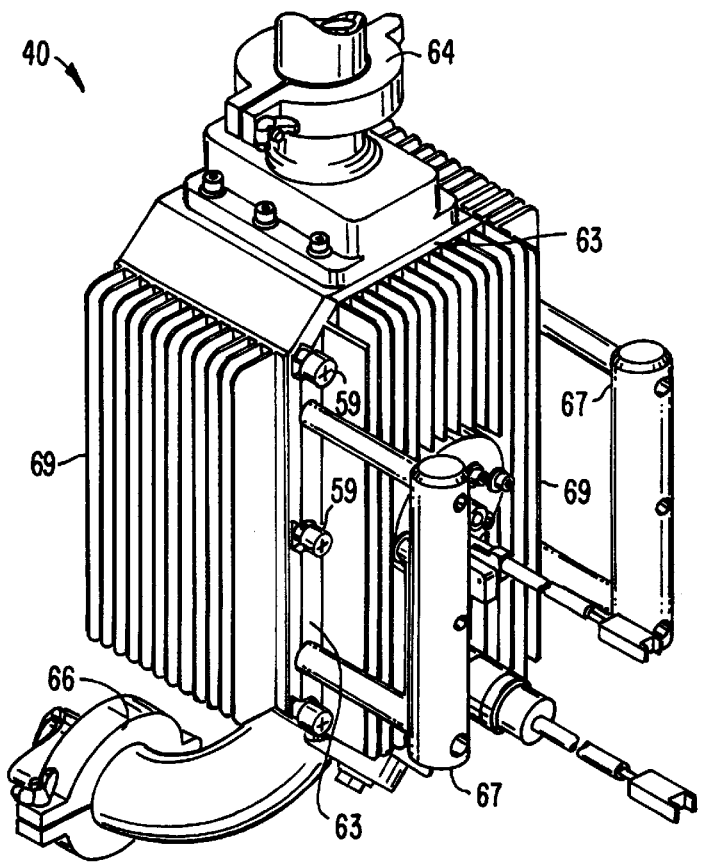
FIG. 4(f) is a perspective view of the vacuum line cleaning apparatus shown in FIG. 4(a) that includes the door.

FIGS. 4(a)–4(f) are various perspective and cross-sectional views of the preferred embodiment of DPA 40 configured and optimized for the abatement of residue and particle build-up. FIG. 4(a) is a front perspective view of DPA 40 having its door removed; FIG. 4(b) is a front plane view of the DPA (with the door removed); FIG. 4(c) is front perspective cross-sectional view taken along a plane in the center of the DPA; FIG. 4(d) is a side perspective cross-sectional view taken along a plane in the center of the DPA; FIG. 4(e) is a cross-sectional view of a power feed through connection to DPA 40; and FIG. 4(f) is a perspective view of DPA 40 having a door and handles attached.

As shown in FIGS. 4(a) to 4(f), DPA 40 includes an inlet 50 and an outlet 52 (see FIG. 4(c)). In between inlet 50 and outlet 52 is a fluid conduit 54 (gas passageway) that is defined by a pair of opposing aluminum electrodes: cathode 56 and anode 58 (see FIG. 4(a)). DPA 40 is connected to the foreline (or directly connected to the processing chamber) through coupling mechanisms 64 and 66 (FIG. 4(a)). For example, in one embodiment DPA 40 is connected directly to the chamber exhaust port by coupling mechanism 64 and the beginning of the foreline is connected to the DPA at coupling mechanism 66. Gases and particulate matter exhausted into the foreline from the substrate processing chamber pass into DPA 40 through inlet 50 and exit from outlet 52.

A removable aluminum door 63 (FIG. 4(d)) encloses gas passageway 54 along with a backplate 65 (FIG. 4(d)). Aluminum door 63 and backplate 65 are electrically coupled to electrode (anode) 58. Electrodes 56 and 58, door 63 and backplate 65 form an enclosed vacuum chamber (fluid conduit 54) that prevents gases exhausted into DPA 40 from escaping. Door 63 and backplate 65 each include a ceramic insulation plate 71 (FIG. 4(d)), which contacts electrodes 56 and 58 to form a seal that prevents gases exhausted through the DPA from migrating outside a gas flow path indicated by arrows 60 (FIG. 4(b)). In a preferred embodiment, a Teflon cushion 73 (FIG. 4(d)) is included in door 63 between the aluminum door and the ceramic insulation layer 71. Teflon cushion 73 has a higher thermal expansion than ceramic insulation layer 71 and is also relatively soft, which allows it to expand without breaking or cracking. When DPA 40 is activated to form a plasma, heat is generated that causes Teflon layer 73 to expand and press ceramic insulation layer 71 against electrodes 56 and 58. This helps ensure an adequate seal at door 63 so that gases do not escape from the DPA.

Door 63 is attached to DPA 40 through screws 59 (FIG. 4(f)) and can be removed with handles 67 (FIG. 4(f)) by removing the screws. Once removed, the interior of DPA 40 may be cleaned or hand wiped with a wet solution such as alcohol and/or vacuumed to remove particle build-up or residue that may occur after extended use or for other reasons. In a preferred embodiment, handles 67 are made from a poor heat conducting material such as plastic.

Electrodes 56 and 58 are electrically separated from each other by four insulative plugs (made from ceramic in a preferred embodiment) 61 (FIG. 4(a)), which are also referred to as cathode retainers. As shown in the Figs., electrodes 56 and 58 have grooves machined in them to house a portion of the cathode retainers. Two cathode retainers 61 are shown in the drawings on the front side of the DPA and the other two are similarly positioned on the backside of the DPA. In one embodiment, cathode retainers 61 are each approximately 1 cm thick. Thus, cathode retainers 61 do not extend the entire width of gas passageway 54 and do not block the gas flow through the passageway.

In the DPA, gas flow follows fluid conduit 54 as indicated by arrows 60 (FIG. 4(b)). Fluid conduit 54 includes two mirror image gas flow paths. An extruding portion of cathode 56 (flow divider 57—see FIG. 4(b)) directs the effluent gas into one of the two flow paths. Approximately half the gas flow is diverted toward the passage on the left side of DPA 40 while the other half is diverted toward the right side of the device.

Fluid conduit 54 is a labyrinthal/serpentine passageway that includes particle collection areas 62 (FIG. 4(a)) that rely in part on gravitational forces to collect and trap particles present in the effluent gas stream, e.g., particles generated during a substrate deposition or other type of processing step. Each particle collection area 62 is a "U"-shaped segment of the gas passageway that is situated so that particles are collected and held within the bottom area of the "U" portion by gravitational forces despite an effluent gas flow path that attempts to drag the particles out of the DPA. Gas flow is directed through each "U" portion by an extruding finger 79 of either cathode 56 or anode 58 as shown in FIG. 4(c). These particle collection areas 62 are collectively referred to as a gravity or mechanical trap and are discussed in more detail below.

Electrodes 56 and 58 form both a parallel plate plasma generation system and an electrostatic particle collector. As part of an electrostatic particle trap, DC power is applied to electrode 56 while electrode 58 is grounded to attract exhausted particulate matter which is electrically charged. The applied DC power creates a voltage field that attracts positively charged particles exhausted through the DPA on one electrode and attracts negatively charged particles on the other. Being grounded, electrode 58 also acts as a Faraday cage for RF shielding. As part of a plasma generation system, RF power is applied to electrode 56. The applied RF power forms a plasma from effluent gases passing through the DPA and etches away particles and residue collected in either the gravity trap areas 62 or along the surface of electrodes 56 and 58.

Figure 5:
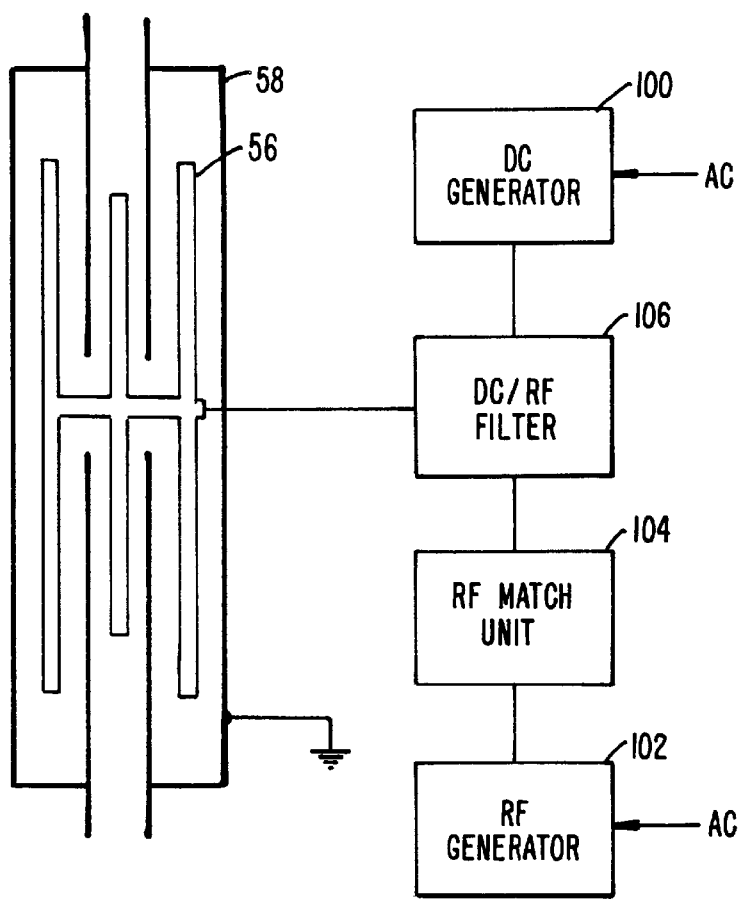
FIG. 5 is an electrical diagram of the circuit connected to and including the electrodes shown in FIG. 4(a)

FIG. 5 is a diagram showing the electrical circuit that includes electrodes 56 and 58. As shown in FIG. 5, electrode 56 is connected to both a DC generator 100 and an RF generator 102 while electrode 58 is grounded. DC generator 100 supplies the DC voltage required by the electrostatic trap, and RF generator 102 supplies the RF power to form a plasma. An RF match circuit 104 matches the generator output impedance to 50Ω to minimize the reflected power, and a DC/RF filter (a low pass RC filter) 106 isolates DC power supply 100 from the RF signal interferences. RF generator 102 can be the same power supply as RF power supply 25 shown in FIG. 2 or can be a separate RF power supply that drives only DPA 40. Additionally, assuming multiple processing chambers are present in a clean room, the multiple DPAs connected to the chambers may all be driven by a separate, dedicated DPA RF power supply that is connected to an appropriate number of RF power splitters.

To ensure complete reaction of material passing through and/or deposited within DPA 40, the DPA must be driven by the RF power supply (e.g., RF generator 102) at a level sufficient to form and/or maintain a plasma. Generally, a power level of between 50–2000 Watts or more can be employed depending on the surface area of the cathode and the desired intensity of the plasma. In an embodiment where the surface area of cathode 58 is about 120 in$^2$, preferably a power level of between 750–1000 Watts (between 6.31 and 8.42 W/in$^2$) is used. The actual power level selected should be determined by balancing a desire to use a high power level to form an intense plasma and a desire to use a low power level to save energy costs and allow use of smaller, less expensive power supplies.

The power supply driving DPA 40 is operated at a frequency range from about 50 KHz to about 200 MHz or more and is preferably operated in the range of about 50 KHz to 60 MHz. Generally, lower frequency power supplies are less expensive to purchase and operate than higher frequency supplies. Accordingly, in the most preferred embodiments, the power supply driving DPA 40 is designed to provide RF frequency of 325 KHz or less. RF power supply can be supplied from either a single frequency RF source or a mixed frequency RF source. The optimal power output and operating frequency of the supply will depend on the application for which the DPA is used and on the volume of the gas to be treated in DPA 40 along with cost considerations.

Electrical connections to DPA 40 are made through a power feed through piece (PFD) 68 (FIG. 4(a)). PFD 68 is shown in detail in FIG. 4(e), which is an enlarged side elevational view of PFD 68. PFD 68 connects DC generator 100 and RF generator 102 to cathode 56 through a connector 70. In a preferred embodiment, connector 70 is a threaded screw that screws directly into cathode 56.

To reduce corrosion at the RF connection and to maintain an adequate electrical connection between screw 70 and cathode 56, the connection should be made at atmospheric pressure. This area of atmospheric pressure is shown as area 76 and includes the area of the threaded screw 70 that contacts cathode 56. An o-ring 78 maintains a seal between cathode 56 and area 76. To prevent o-ring 78 from melting from the intense heat that may be generated during operation of the DPA, a specially designed area is provided to reduce heat transfer from the main portion of cathode 56 (shown as area 56A) to the area of cathode 56 (shown as area 56B) in which o-ring 78 is embedded. This specially designed area includes vacuum areas 80 and a thin portion 82 of cathode 56. Heat generated and/or transferred to area 56A of cathode 56 does not readily transfer to area 56B because vacuum areas 80 mostly isolate cathode area 56B from cathode area 56A. The small portion of cathode 56 (portion 80) that transfers the RF and DC signals from area 56B to area 56A is sufficiently thin to significantly reduce the heat transferred from area 56A to area 56B.

The power feed through connection is housed in an aluminum housing 72 and insulated from housing 72 and door 63 by teflon plate 73 and teflon rings 74, 75 and 81. Housing 72 is electrically connected to anode 58 and door 63. A flat washer 84, lock washer 85 and nut 86 assembly allows clamping of teflon ring 75 and teflon lining 73 to area 56B of cathode 56. This clamping force compresses o-ring 78 to maintain an adequate seal. A second o-ring, o-ring 77, maintains a seal between teflon lining 73 and door 63 so as to not allow escape of gases through power feed through connection 68.

In standard operation, DC power is supplied to electrode 56 during substrate processing steps, such as a CVD step, to enhance the particle trapping capabilities of DPA 40. The voltage applied to electrode 56 varies depending on the application. Typically, the application of between 100–3000 volts creates an effective trapping mechanism. Such DC voltage can be applied at all times during chamber operation (processing and clean steps) or may be stopped during the chamber clean operation when DPA 40 is activated.

Figure 6:
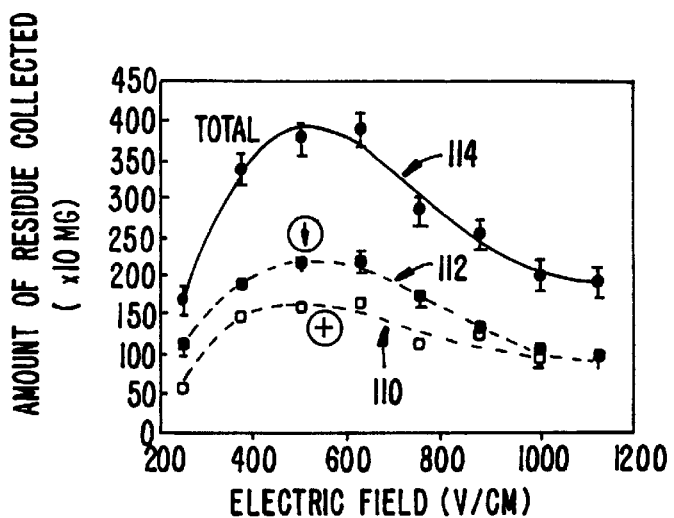
FIG. 6 is a graph showing the effect of an electrostatic collector in one embodiment of the vacuum line cleaning apparatus of the present invention on particles generated by an exemplary silicon nitride deposition step.

In one substrate processing operation, where silicon nitride was deposited from a process gas of $SiH_4$, $N_2$ and $NH_3$ experiments determined that approximately 60%±10% of the generated particles were positively charged while approximately 40%±10% of the generated particles were negatively charged. As shown in FIG. 6, experiments determined that the creation of approximately a 500 volt/cm DC field within DPA 40 provided an optimal electrostatic collector for use with this substrate processing operation.

In FIG. 6, line 110 represents the total accumulation of negatively-charged particles collected on the positively charged electrode from the creation of between a 200–1200 volt/cm electric field between the electrodes, and line 112 represents the total accumulation of positively-charged particles collected on the grounded electrode. Line 114 represents the total accumulation of trapped particles. At voltage fields lower than 500 volts, larger particles may not be effectively trapped by the electrostatic collector, while the creation of higher voltage fields forms a partial plasma. Such plasma formation changes the characteristics of the generated electric field and degrades trapping efficiency.

The electrostatic collector and mechanical (gravity) trap combination provides a particularly effective mechanism to prevent deposition build-up in vacuum line 31. The gravity trap is particularly effective in trapping relatively large particles present in the effluent gas stream because these particles are more likely to be held within exterior tube 62 by gravitational forces. The electrostatic trap, on the other hand, is particularly effective at collecting and trapping smaller particles in the effluent gas stream that may otherwise not be collected by just the gravity trap.

As an example, in the deposition of silicon nitride as described above, particles ranging in size from 1 $\mu$m in diameter to 1 mm in diameter or more have been observed. When these particles are in the exhaust line, two forces of importance act on the particles: a gravitational attraction force ($F_g$) and a neutral drag force ($F_{nd}$) resulting from the gas motion. For large particulate matter, such as particles larger than 100 $\mu$m in diameter, the major interaction is the gravitational force, so the mechanical trap is particularly effective. For smaller particles, however, the drag force of the gas can be higher than the gravitational force. Consequently, the electric field developed between the two electrodes of the electrostatic trap applies a supplementary force ($F_{elec}$), perpendicular to the trajectory of the particulate. This force can be two or more orders of magnitude larger than both the gravitational and drag forces for very small particulates, such as those less than 10 $\mu$m in diameter, resulting in a very high collection efficiency.

Figure 7:
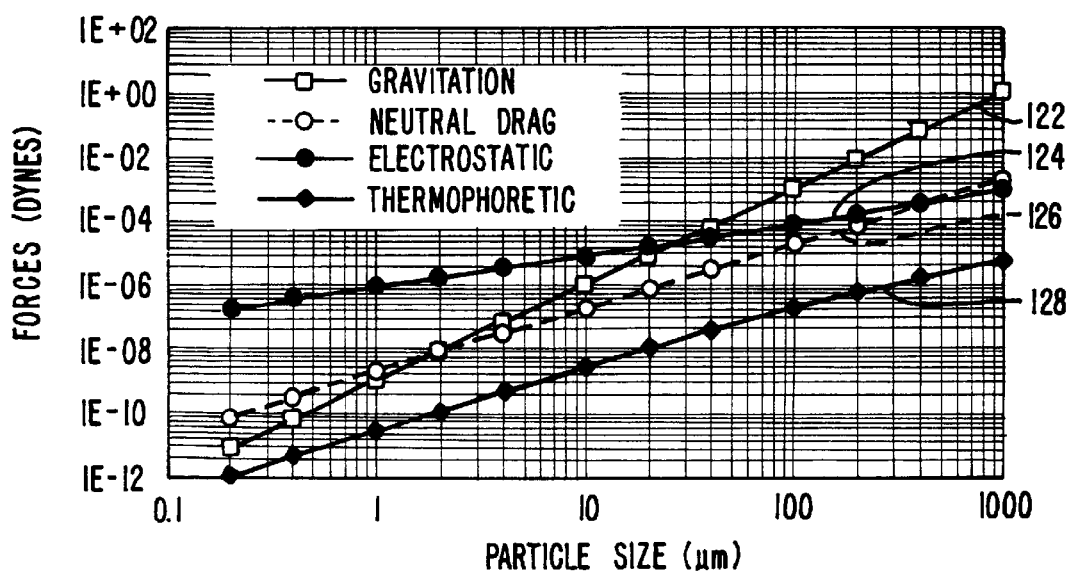
FIG. 7 is a graph showing the effect of electrostatic, gravitational and thermophoretic forces as compared to the neutral drag force on particles within one embodiment of the vacuum line cleaning apparatus of the present invention.

FIG. 7 is a graph showing the effect of the electrostatic and gravitational forces as compared to the neutral drag force on particles according to one embodiment of the present invention. Line 122 shows the gravitational force, line 124 shows the electrostatic force and line 126 shows the particle neutral drag force. As shown, for smaller particles, electrostatic force 124 is greater than the gravitational force 122. For larger particles, gravitational force 122 is dominant over electrostatic force 124. In this embodiment, the forces are such that particles up to about 30 micrometers in diameter are primarily collected by the electrostatic collector, while particles larger than about 30 micrometers are primarily collected by the mechanical trap. Regardless of whether the electrostatic or gravitational force dominates for any given particle, the focal point of FIG. 7 is that DPA 40 is preferably designed so at least one of electrostatic force 124 or gravitational force 122 should be larger than the neutral drag force 126 for a particle of any given size. In such a case, the combination of electrostatic and mechanical trap collectors, ensures that particles of various sizes will be effectively collected.

A fourth force, the thermophoretic force ($F_{th}$), also acts on particles within DPA 40. The thermophoretic force is due to temperature gradients created within the DPA. Such temperature gradients may be created, for example, by formation of a plasma during the plasma-assisted clean process. During plasma formation cathode 56 becomes hotter than anode 58 because of ion bombardment and the Joules effect during plasma formation. In one embodiment, the temperature gradient between cathode 56 and anode 58 is 200° C./cm at a gas temperature of 150° C. The thermophoretic force in this embodiment is shown in FIG. 7 as line 128. While thermophoretic force 128 may not be strong enough to trap particles of between 0.1 to 100 μm in this embodiment, it can contribute to the trapping of both charged and uncharged particles. Also, in other embodiments, a person of ordinary skill in the art would understand how the create larger temperature gradients such that a larger thermophoretic force is created to more effectively aid in particle and residue entrapment.

As previously stated, during a chamber clean operation RF energy is applied to electrode 56 to form and/or maintain a plasma from effluent etching gases exhausted into the DPA. Constituents from the plasma react with the particles and residue trapped within the DPA from one or more previous substrate processing steps. Preferably, the application of RF energy to form this plasma is discontinued during times when etchant gases are not exhausted through the DPA (in such a configuration DPA 40 is referred to as an active, rather than a passive device). Control of the timing aspects of DPA 40 (e.g., switching RF power supply 102 and/or DC power supply 100 ON and OFF) when DPA 40 is configured as an active device is generally performed by processor 34 through the application of control signals sent over control lines 36 shown in FIG. 1. Even though not shown in FIG. 12, such control lines are connected to DPA 40 in such a configuration.

In an alternative embodiment, it is possible to provide a gas supply line directly to DPA 40 for the introduction of an etchant gas separate from and in addition to the etchant gas exhausted from chamber 15 during a clean operation. Such an extra gas supply line can be connected to the DPA, for example, at or near inlet 50. It could also be connected directly to the foreline at a position upstream from the DPA. If such a separate gas line is provided, the additional supply of etchant gas can be supplied to the DPA during a clean sequence only, during a deposition or other substrate processing step only, or it could be continuously supplied during both deposition and clean cycles. In an embodiment where the etchant gas is supplied to the DPA during a substrate processing step, RF energy is applied to electrode 56 during the substrate processing step to form a plasma and further etch deposited material from within the DPA.

The effectiveness of DPA 40 in trapping particles and reducing deposition build-up depends on a number of factors including the amount of particles generated and exhausted from chamber 15, the rate of effluent gas flow through DPA 40, the voltage field created between electrodes 56 and 58, the surface area of electrodes 56 and 58 and the intensity of the plasma generated during the clean phase among others.

Also, a number of other design considerations enhance the effectiveness of DPA 40. For instance, in preferred embodiments, the upper surface of flow divider 57 (FIG. 4(a)) is sharply angled to a single edge. Experiments showed that deposition build-up collects more rapidly at locations where gas flow directly contacts a barrier or other surface within the DPA. The angled surface of flow divider 57 combined with the introduction of the effluent gas through inlet 50 directly above and perpendicular to the single edge of flow divider 57 provides a smaller area of contact for the effluent gas stream entering DPA 40 through inlet 50 and thus minimizes deposition on the upper surface of flow divider 57. In experiments performed without such an angled surface (e.g., a rounded surface), particle build-up collected on the upper surface of divider 57. Depending on the amount of such build-up, it is possible for the build-up to break off and fall into one of collection areas 62. If the particle build-up is sufficiently large, it may not be dissipated by the plasma formed during the normal clean cycle. This could lead to blockage of the gas passageway. Also, if the build-up is dielectric material (e.g., build-up from silicon nitride deposition), the build-up interferes with plasma generation and lessens the strength of the formed plasma. This in turn results in less etching of deposited material and an increased chance of passage blockage. Preferably, the side surfaces of flow divider 57 meet at an angle of 30 degrees or less to prevent such build-up. It is even more preferable that the formed angle be about 10 degrees or less.

Another design feature that lessens particle build up in any one particular area of DPA 40 is the contour of the walls of the portion of gas passageway 54 between inlet 50 and the point at which gas flow is divided into left and right flows. A smooth, contoured transition (or flare out) at inlet 50, as opposed to one with sharp angles, into the gas passageway helps ensure an even distribution of the gas flow into the passageway. This contoured transition from inlet 50 to fluid conduit 54 is referred to as a profiled manifold.

An even gas flow through the profiled manifold helps ensure an equal distribution of gas flow into each of the left and right portions of gas passageway 54 thereby preventing a greater particle build up in one portion of the passageway as compared to the other. The profiled manifold also ensures an even gas distribution throughout the entire width of the electrodes. The contour of a preferred version of the profiled manifold is shown in detail in FIGS. 4(c) and 4(d) as gas passage surfaces 55.

Formation of a uniform plasma helps ensure complete removal of particles and residue collected within DPA 40. To this end, it is useful for the surface area of electrode 56 be approximately the same as the surface area of electrode 58. Experiments performed in a DPA having a difference in surface area between electrodes of between 3:1 and 1.3:1 at various locations indicate that it is possible to form a plasma with uneven surface area electrodes and that such a plasma can adequately remove some material collected within the DPA. In these experiments, however, particle and residue build up was more effectively removed in the area of the DPA where electrode surface area ratio was closer to 1.3:1 rather than 3:1. In further experiments in which the surface area of cathode 56 was within 95 percent of the surface area of the anode (118.79 in² vs. 123.31 in²) 58, plasma formation was more intense and particle removal even more effective. In other embodiments the surface area of the cathode is substantially equivalent to that of the anode.

Another plasma uniformity issue involves the spacing of electrode 56 relative to electrode 58. This spacing should basically remain constant throughout the gas passageway of DPA 40 with the following exception. The voltage breakdown of a plasma is a function of the pressure and distance between electrodes (P×D). For the effluent gas stream to flow through DPA 40, it is necessary that the pressure near inlet 50 be slightly higher than the pressure near outlet 52. To keep the voltage breakdown constant in this preferred embodiment, more space is introduced between the electrodes in the lower portion of DPA 40 than between the electrodes in the upper portion. This spacing variation can be done by, for example, making the protruding fingers of either or both electrode 56 and/or electrode 58 thicker in the upper portions of the DPA as shown in FIG. 4(*b*). In FIG. 4(*b*), fingers of cathode 56 and anode 58 in the upper portion of DPA 40 have thicknesses of a and b, respectively. While the corresponding parts in the lower portion of DPA 40 have thicknesses of c and d, respectively, where a>c and b>d.

Pressure within the DPA also effects plasma formation. Generally, a higher pressure results in a more efficient plasma etching. Thus, operating the DPA at a higher pressure allows lower power requirements than a lower pressure, which in turn results in operating cost savings. A higher DPA pressure can be obtained by positioning a throttle valve in the foreline after the DPA. In such a configuration it is possible to use a single throttle valve downstream from the DPA or preferably dual throttle valves: one upstream of the DPA to control chamber pressure and one downstream to control DPA pressure independent of the pressure within the processing chamber.

Without a throttle valve downstream of the DPA, the pressure within the DPA is generally equal to the pressure of the foreline (between about 0.8–2.5 torr in some PECVD processing apparatuses operated at about 4.5–6 torr). With a throttle valve downstream from the DPA, however, pressure within the DPA can be controlled over a broader range. Of course pressure in the DPA must be less than the pressure within the chamber to maintain an effluent gas stream from the chamber. Increasing the pressure within the DPA also has an unwanted side effect of increasing the neutral drag force of particles exhausted into the DPA, which in turn, reduces the efficiency of the gravitational trap. Thus, the actual pressure set in the DPA should balance plasma efficiency considerations with particle trapping considerations and will depend on the particular application the DPA is employed in.

A pressure sensitive switch 53 (FIG. 4(*d*)) can be included to monitor the pressure within DPA 40. In the event that pressure within the DPA builds-up to undesirable levels, switch 53 sends a signal to processor 34 to turn OFF both the DPA and substrate processing chamber 10. In a preferred embodiment, switch 53 is a half-atmosphere switch that initiates the shutdown procedure when the pressure within DPA 40 increases beyond one half atmosphere (360 torr).

Depending on the RF power used to form a plasma within the DPA, the size of the cathode, the time period over which the DPA is activated and other factors, DPA 40 can generate a substantial amount of heat. To dissipate the heat, DPA 40 can include heat dissipation fins 69 as shown in FIG. 4(*e*). Heat dissipation fins 69 are attached to anode 58.

Heat is generated during plasma formation at cathode 56 by ion bombardment and the Joules effect. Consequently, anode 58 is cooler than cathode 56. Additionally, anode 58 is thermally insulated from cathode 56 by ceramic cathode retainers 61, ceramic lining plate 71 (at the backside and door) and the TEFLON insulator rings in PFD 68. Fins 69 help further cool the anode. Fins 69 are constructed out of a heat conducting material such as aluminum and are the preferred method of cooling DPA 40 in that they are a passive cooling device. For safety reasons it is preferable to design fins 69 so that the exterior of DPA 40 is cooled to at least 75° C. or below.

In a preferred embodiment in which the DPA is outfitted for a DCVD chamber in a P5000 reactor system manufactured by Applied Materials, the fins are positioned on three sides of the DPA, but not on a fourth side. Instead, the fourth side (the backside) of the DPA is placed directly against part of the substrate processing chamber. The degree of cooling provided by fins 69 depends on the size of the fins. In one embodiment where the temperature of the cathode runs between 250–300° C., fins 69 are sufficiently large to cool the exterior of the DPA to about 75° C.

It is also possible to use other methods to cool DPA 40. For example, a cooling system that circulates water around DPA 40 can be used to transfer heat away from the DPA. Such a cooling system is an active cooling mechanism.

2. Test Results Using the Preferred Particle Reduction Embodiment of DPA 40

To prove the effectiveness of the present invention in reducing particle build-up, experiments were performed in which a DPA 40 designed according to the preferred embodiment described above was attached to a Precision 5000 chamber outfitted for 6 inch wafers and designed for CVD deposition of silicon nitride. The Precision 5000 chamber is manufactured by Applied Materials, the assignee of the present invention.

Before experiments were performed testing the effectiveness of the DPA, experiments were performed to determine the composition of residue deposited in the processing chamber by a silicon nitride deposition step followed by a fluorine clean step. The composition of the residue was determined for two different silicon nitride deposition/fluorine clean operations process sequences. In each process sequence, the silicon nitride deposition step was identical while the clean step was based on a $CF_4$ chemistry in the first sequence and on an $NF_3$ chemistry in the second sequence.

The silicon nitride film was deposited on a wafer by subjecting the wafer to a plasma of silane ($SiH_4$), nitrogen $N_2$ and ammonia ($NH_3$) gases. $SiH_4$ was introduced into the chamber at a flow rate of 275 sccm, $N_2$ was introduced into the chamber at a rate of 3700 sccm and $NH_3$ was introduced at a rate of 100 sccm. The plasma was formed at a pressure of 4.5 torr, at a temperature of 400° C., using a 13.56 MHz RF power supply driven at 720 Watts. The silicon nitride deposition process deposited lasted approximately 75 seconds which was sufficient to deposit a film of approximately 10,000 Å on the wafer.

For the first sample, after the silicon nitride deposition step was completed and the wafer removed from the chamber, the chamber was cleaned with a $CF_4$ and $N_2O$ plasma for 120 seconds. The ratio of $CF_4$ to $N_2O$ was 3:1 with the $CF_4$ being introduced at a rate of 1500 sccm and $N_2O$ being introduced at a rate of 500 sccm. During the clean step, the chamber was maintained at a temperature of 400° C. and at a pressure of 5 torr. The plasma was formed with a 13.56 MHz power supply powered at 1000 Watts.

For the second sample, the chamber was cleaned with a plasma formed from $NF_3$ and $N_2O$ and $N_2$ precursor gases. The ratio of $NF_3$ to $N_2O$ to $N_2$ was approximately 5:2:10 with $NF_3$ being introduced at a rate of 500 sccm, $N_2O$ being introduced at a rate of 200 sccm, and $N_2$ being introduced at a rate of 1000 sccm. The chamber was maintained at a temperature of 400° C. and a pressure of 5 torr during the clean step, which lasted for approximately 95 seconds. Plasma formation was achieved with a 13.56 MHz power supply powered at 1000 Watts.

It was found that the color of the residue for the $CF_4$ clean was brownish while the color of the residue sample for the $NF_3$ clean was yellow/white. Residue produced from just an $Si_3N_4$ deposition step was found to be brown, thus it is believed that these results indicate a more complete conversion of the initial brown powder into a yellow/white powder from the $NF_3$ clean. This is believed to be due to extra free fluorine radicals that are generated in the $NF_3$ plasma.

In another series of experiments, three different residue samples were collected: powder collected in the foreline approximately 0.5 m downstream the processing chamber immediately after an $Si_3N_4$ deposition step as described above (sample A); powder collected at the same location as sample A, but after running a $NF_3/N_2O/N_2$ clean plasma as described above (sample B); and powder collected at the inlet of a dry vacuum pump approximately 12 m downstream from the chamber after several days of continuous deposition/clean sequences (powder C). The composition of the powder samples was deduced from Hydrogen Forward Scattering (HFS), X-Ray Photoelectron Spectroscopy (XPS) and X-Ray Diffraction (XRD) analysis. The composition of each of these powders is shown in Table 1.

The amount of accumulated powder in sample B increases with an increase in the distance from the process chamber suggesting that the solid-gas vaporization becomes less and less efficient as gases are travelling along the foreline. This is probably due to the rarefaction of excited species such as F*, $CF_x$, O*, among others while moving away from the chamber. Close to the pump, a mixture of powder A and B exists. This residue (powder C) is yellowish to brown as the distance from the chamber increases.

Chemical analysis shows powder C is an incomplete conversion from powder A. Of interest is the formation of a polymer —(—$CF_2$—$C_2F_4$—O—)x— that can coat the initial brown residues, forming a protective coating and preventing further conversion of the powder collected during deposition. The accumulation of powder C in the foreline of a commercial PECVD silicon nitride system can be more than 500 g after one month of continuous deposition/clean sequences.

After the composition of residue build-up in the chamber was determined, an experiment was performed to determine the grain size of the residual powder. For this experiment, a silicon piece was placed within the foreline to collect material deposited there from the deposition process. It was observed that even after a 15 second deposition process, a residue build-up in the form of a brown powder normally occurs in vacuum line 3. A micrograph showing this residue

TABLE 1

Residue Formation From Silicon Nitride Deposition/Fluorine Clean Processes

| Sample | Residue Type | Residue Composition | | | | | |
|---|---|---|---|---|---|---|---|
| | | C at % | O at % | N at % | Si at % | F at % | H at % |
| A | brown powder | 2.1 | 41 | 8.0 | 33 | 0.9 | 15 |
| B | yellow/white powder | 0 | 1 | 12 | 8.5 | 38.5 | 40 |
| C | orange/brown powder | 0.2 | 6.8 | 13 | 42 | 1 | 37 |

Sample A is the direct solid byproduct of the $Si_3N_4$ deposition chemistry. The powder reflects the composition of the particles generated within the RF plasma. The powder is mostly composed of Si, N, H and oxygen. The oxygen is probably absorbed from air during sample collection. The oxygen cannot be an initial component of the powder because no oxygen-containing gas is employed during deposition. The residue particulates generated in the plasma are most likely highly hydrogenated silicon nitride $Si_xN_yH_z$. This powder is highly reactive. XPS measurements confirm the HFS results and show that, after exposition to air, silicon is present 18% as elemental, 24% as nitride and 58% as oxide. Nitrogen is present 93% as nitride and 7% as ammonium. XRD analysis shows the powder to be amorphous.

Figure 8:
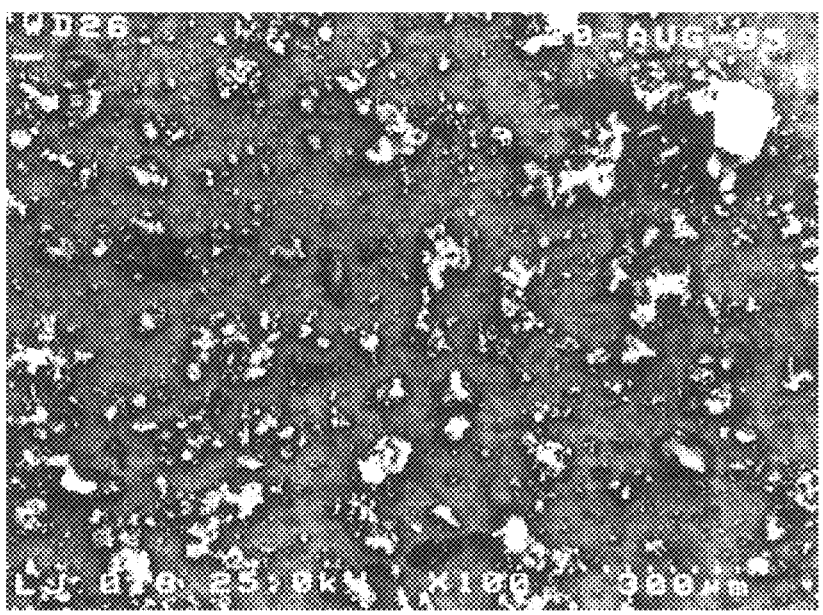
FIG. 8 is a micrograph showing the amount of residue build-up on a silicon piece inside the vacuum foreline after a 15 second silicon nitride deposition process.
Figure 9:
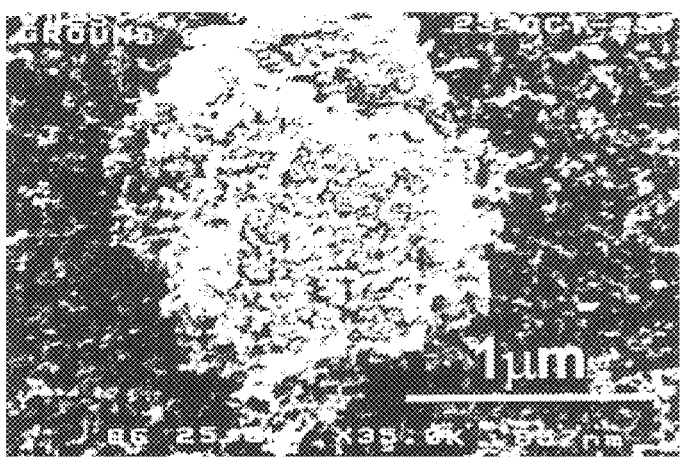
FIG. 9 is a micrograph showing the elementary grain size of one grain of the residue shown in FIG. 8.
Figure 10:
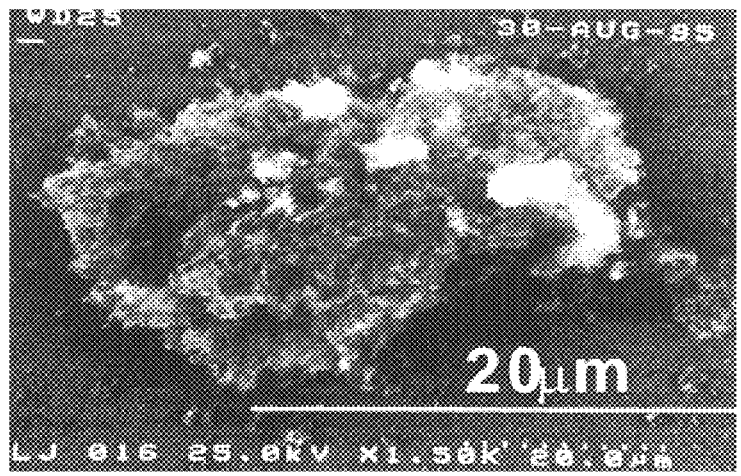
FIG. 10 is a micrograph showing the size of particulate matter deposited on a silicon piece inside the vacuum foreline during an experiment performed prior to testing the present invention.

Sample B is the result of the conversion of powder A after a clean process using an $NF_3/N_2O/N_2$ plasma. The clean process vaporizes completely the residues accumulated inside the deposition chamber, but the conversion is not complete in the foreline, due to limited F* free radicals lifetime. However, this lifetime is long enough so that a partial conversion can happen in the first meters of the foreline. This white powder presents a high F content, accounting for the transformation of $Si_xN_yH_z$ into $(NH_4)SiF_6$ (ammonium hexafluoro silicate, which has been identified using X-Ray Diffraction characterization). The polycrystalline white powder shows a sublimation temperature of 250° C.

build-up is shown as FIG. 8. The brown powder was made up of $Si_xN_yH_z$, $Si_xH_y$, $SiO_x$ and elemental silicon residues. Elementary grains of the residue present a granular and spongy morphology, with a density of 2.3 g/cm$^3$. The spheroid symmetry of the grains is shown in FIG. 9 and indicates that growth can be by homogeneous nucleation. FIG. 10, is a micrograph illustrating the aggregation of four or five elementary grains (15–20 $\mu$m in diameter each) into a typical residue aggregate particle that is approximately 50 $\mu$m in diameter. Further experiments showed that the grain size of the powder increased with deposition time to form aggregates 1.0 mm or larger in diameter for a 90 second deposition step.

A prototype DPA was then employed to prove the effectiveness of the present invention in reducing particle build-up such as that from a silane-based silicon nitride deposition operation. The prototype DPA was constructed according to the embodiment shown in FIGS. 4(a)–(f) and was connected to the exhaust port of a P5000 CVD chamber just before the foreline. In the experiment, the chamber was operated according to a common deposition/clean sequence for silicon nitride that included three sequential 1.0 micron deposition steps (for three separate wafers) followed by a $CF_4/N_2O$ clean step. The deposition/clean cycle was continuously repeated for a 5000 wafer run test.

For the silicon nitride deposition step, the chamber pressure was set and maintained at 4.5 torr, while chamber temperature was set to 400° C. and the susceptor was positioned 600 mils from the gas distribution manifold. Deposition gases included $SiH_4$ introduced at a rate of 190 sccm, $N_2$ introduced at a rate of 1500 sccm and $NH_3$ introduced at a rate of 60 sccm. Single frequency RF power at a frequency of 13.56 MHz was supplied at a power level of 455 Watts to form a plasma and deposit the silicon nitride layer at a rate of approximately 7500 Å/min. Total deposition time for each 1.0 micron layer was about 80 seconds.

For the chamber clean step, chamber pressure was set and maintained at 4.6 torr, chamber temperature was set at 400° C. and the susceptor (without a wafer) was positioned 600 mils from the gas distribution manifold. The clean gas included $CF_4$ introduced at a rate of 1500 sccm and $N_2O$ introduced at a rate of 500 sccm. RF power was supplied to form an etching plasma and etch away material deposited within the chamber. The frequency power supply was operated at 13.56 MHz and driven at 1000 Watts. Total clean time used to clean the chamber after three 1.0 micron silicon nitride layer deposition steps was 110 seconds for the first 3000 wafers. An endpoint detector was then used to optimize the clean time for the final 2000 wafers.

The prototype DPA was approximately 35 cm in length by 14 cm in diameter. Electrodes 56 and 58 provided a total surface area of 242.1 in$^2$ and were machined out of aluminum. The cathode was 3.00 inches wide and had a perimeter of 39.5966 inches.

A DC voltage of 500 volts was created between electrode 56 and electrode 58 to trap electrically charged particles during both the silicon nitride deposition step and the $CF_4$ clean step as described above. The voltage field was created by supplying 500 volts to electrode 56 and grounding electrode 58. As for plasma formation, the DPA device was operated as an active device (i.e., RF power was provided to the DPA to form a plasma during the clean cycle only—RF power was not provided during the deposition steps). Plasma formation was generated by a 325 KHz RF waveform driven at 1000 Watts. Pressure within the DPA was measured at 0.8 torr.

In further testing, the prototype DPA was shown to be 100% effective in preventing particle build-up within the foreline during a 20,000 wafer test run using the above-described silicon nitride deposition/$CF_4$ clean sequence while being transparent to the process. The use of the prototype DPA did not require any additional clean gases or any additional clean time to trap and remove all particulate matter exhausted from the chamber during the experiment. Measurements taken of film characteristics such as thickness, uniformity, stress and refractive index for the deposited silicon nitride films during the experiment showed that there was no noticeable or significant change in any of these characteristics between the 1st and 5000th wafers (or between any wafers in between). Additionally, measurements taken measuring the particle count within the chamber during the experiment also showed there was no increase in particles of diameter 0.16 microns or greater during the wafer run.

3. Helical Coil, Single Tube Embodiment

Other embodiments of DPA 40 that incorporate other plasma formation structures are also possible. For example, in some embodiments, the plasma is created by application of an RF signal to an inductive coil such as a helical resonator coil. A helical coil is compact in size and has the capacity to create a plasma with a relatively high plasma density. Such coils are well known to those of ordinary skill in the art and may be designed according to criteria set forth in any of a number of well known textbooks such as Michael A. Lieberman and Allan J. Lichtenberg, "Principles of Plasma Discharges and Materials Processing," pp. 404–410 John Wiley & Sons (1994), which is hereby incorporated by reference.

The helical resonator coil can be made out of a high conductivity type metal such as copper, nickel, or gold or similar conducting material. To properly resonate the coil, it is important that the length of the coil be about or slightly longer than ¼ of the wavelength of the applied RF signal.

Figure 11:
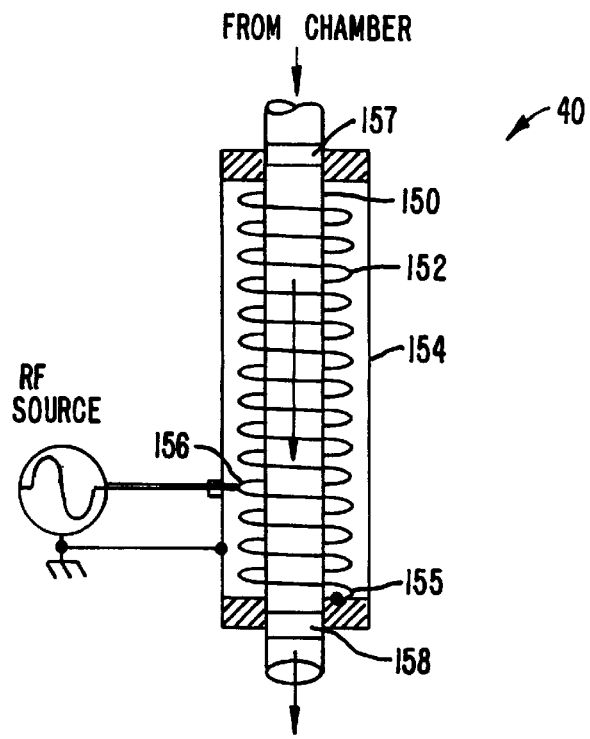
FIG. 11 is a side cross-sectional view of a second embodiment of the vacuum line cleaning apparatus of the present invention.

FIG. 11 is a cross-sectional view of one embodiment of DPA 40 that includes such a coil. In FIG. 11, DPA 40 includes a tube 150 through which exhaust gases from processing chamber 15 flow as they pass through the DPA. Tube 150 is a cylindrical tube made out of an insulating material such as ceramic, glass or quartz. In a preferred embodiment, tube 150 is made out of a ceramic material that does not react with etchant gases, such as fluorine, which is used in the clean steps. Also, tube 150 has approximately the same interior diameter as the interior diameter of vacuum line 31. In other embodiments, tube 150 need not necessarily be in cylindrical form and may instead have angular, planar or elliptical or similarly curved interior surfaces. In these and other embodiments, the interior diameter of tube 150 may also be either larger or smaller than the interior diameter of vacuum line 31.

A coil 152 is wound around the exterior of tube 150 and connected to an RF power supply at one end at point 156 and connected to a ground potential at the other end at point 155. Exhaust gases passing through tube 150 is excited into a plasma state by the application of a voltage from the RF power supply to coil 152. In the plasma state, constituents from the plasma react with material deposited within the tube to form gaseous products that may be pumped out of DPA 40 and vacuum line 31 by pump system 32 as described above. Coil 152 is a standard helical resonator coil as previously discussed and may be wound within the interior of tube 150 rather than external to the tube.

An outer container 154 surrounds tube 150. Container 154 serves at least two purposes. First, it acts as a Faraday cage shielding radiation emission generated by coil 152. Second, if ceramic tube 150 were to break or crack or if the vacuum seal in tube 150 is broken in another manner, container 154 provides a second seal preventing the exhaust gases from escaping. Container 154 can be made out of a variety of metals such as aluminum or steel or other compounds and is grounded for the shielding effect. Upper and lower flanges 157 and 158, respectively, connect DPA 40 to vacuum manifold 24 and vacuum line 31 while maintaining a vacuum seal.

Standard RF power supplies are designed to work off an impedance of 50 ohms as a load. Accordingly, the point of contact for the RF power supply to coil 152 (point 156) should be selected so that coil 152 has an impedance of 50 ohms. If the power supply required another impedance level, point 156 could be chosen accordingly.

Coil 152 is driven by the RF power supply at a power level of 50 Watts or greater and is preferably driven at a level of 500 Watts or greater. Under such conditions, plasma generation is at a maximum and uniformity is not a concern. The actual voltage generated by coil 152 depends on a number of factors such as the power used by the RF power supply, length and winding spacing of coil 152, and the resistance of the coil. Since voltage is spread evenly along the coil, determining the voltage level for the entire coil can be done by determining the level between the points at which the coil is connected to ground and the RF power supply (points 155 and 156). For example, if a particular coil is four times as long as the portion of the coil between points 155 and 156, the total voltage of the coil will be four times the voltage level between points 155 and 156.

The coil, power level, and applied RF frequency should be selected so that a strong, intense plasma is formed within tube 150, but also to ensure that the voltage generated by coil 152 does not exceed a level at which current will arc from the coil to container 154. It is possible to put an insulating material between container 154 and coil 152 if arcing is a problem for a particular DPA. For simplicity of design, however, it is preferable to have the space between container 154 and coil 152 filled with air.

The length and size of DPA 40 can vary. In some applications, DPA 40 can be only 4–6 inches long or even shorter, while in other applications, DPA 40 can be the entire length of vacuum line 31 (4–5 feet or longer) thus replacing the line. A longer DPA will collect and thus be able to remove more particulate matter than a shorter, identically designed DPA. DPA design must balance space considerations with residue collecting efficiency. Shorter DPAs that include an advanced trapping mechanism, however, are able to collect and trap 99.9% of all particulate matter exhausted from the processing chamber making length a less important factor. Because the length of the coil should be slightly longer than ¼ of the RF wavelength, there is a direct relationship between the coil length and RF frequency used. Longer coils require lower frequency RF power signals.

While it was previously described that DPA 40 is preferably turned ON and OFF during specific periods of a processing procedure, the DPA may also be configured as a passive device. As a passive device, DPA 40 is supplied continuously with a sufficient RF power signal so that no special control signals or processor time need be devoted to turning the DPA ON and OFF.

4. A First Helical Coil, Mechanical and Electrostatic Trap Embodiment

Figure 12:
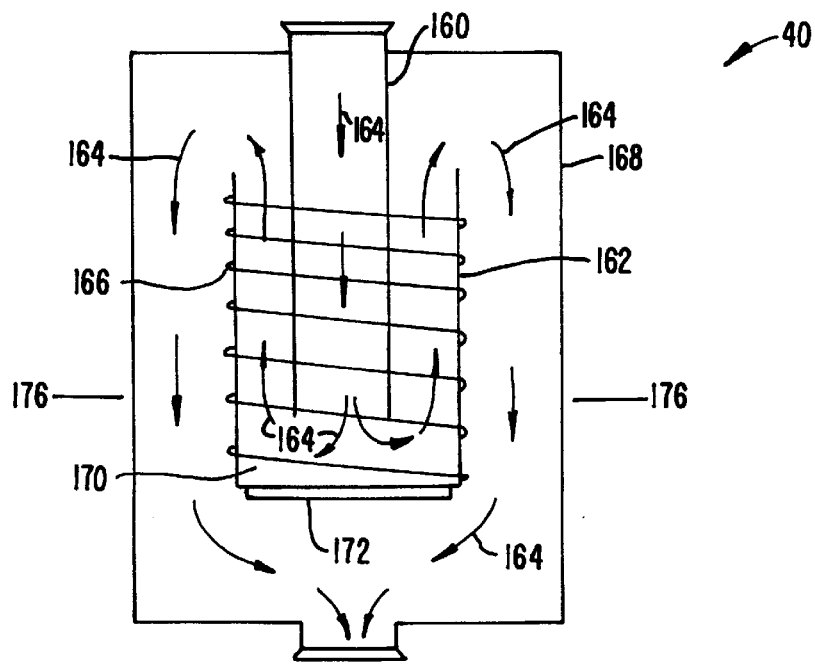
FIG. 12 is a side cross-sectional view of a third embodiment of the vacuum line cleaning apparatus of the present invention.

FIG. 12 is a cross-sectional view of another embodiment of DPA 40. The embodiment of DPA 40 shown in FIG. 12 includes a first inner ceramic tube 160 and a second outer ceramic tube 162. The end of tube 160 is within the cylindrical space of tube 162 so that gas flow through DPA 40 is as shown in arrows 164.

A helical resonator coil 166 is wrapped around the exterior of tube 162 and connected to an RF power supply 168 as described in relation to the embodiment of FIG. 11. Coil 166 could also be wound within the interior of tube 162 or around the exterior or interior of tube 160.

A shell 168, similar to container 150 above, encloses both inner and outer tubes 160 and 162. Outer tube 162 may be supported by connections to either inner tube 160 or shell 168. In either case, it is important that a support structure for outer tube 162 allow the effluent gas stream to pass through DPA 40. To this end, the support structure may be a plane of ceramic material between tubes 160 and 162 having a plurality of perforated holes, may consist or only three of four slender connections or fingers extending between tubes 160 and 162, or may be designed in numerous other equivalent manners. A structure including perforated holes can help collect and trap particulate matter within a collection area 170 described below. The structure should be designed, however, so that the holes are large enough so as to not reduce the flow rate of gases pumped through DPA 40.

The design of this embodiment of DPA 40 enhances the trapping and therefore decomposition of particulate matter.

The design includes collection area 170 of tube 162 that acts as a mechanical trap collecting and holding particles in the exhaust gas stream so that they cannot pass through the remainder of the DPA into vacuum line 31 in a manner similar to traps 62 of FIG. 4(a). The particles are held in the trap and subjected to the plasma until they disassociate or break down under the formed plasma.

The operation of the trap portion of this embodiment of DPA 40 relies in part on gravitational forces that act to hold the particulate matter within the trap despite an effluent gas flow path that attempts to sweep the particles through the DPA device into the vacuum line. Thus, in part, the effectiveness of DPA 40 depends on the ability of exterior tube 162 to prevent particles from leaving tube 162 until they are reacted into gaseous products. To this end, it is important that DPA 40 be positioned so that collection area 170 is downward from the inlet to the DPA and that the length of exterior tube 162 be sufficient to create this trap in combination with gravitational forces.

Increasing the cross-sectional area of the gas passageways along a plane 176 within DPA 40 further helps trap particulate matter. The rate of flow for an effluent gas stream in any given deposition process is generally constant. Thus, increasing the cross-sectional area of one or more of the passageways decreases the velocity of particles in the gas stream which correspondingly reduces the neutral drag force on the particles. A given particle is trapped by gravitational forces within the gravity trap of DPA 40, if the gravitational force on the particle exceeds the neutral drag force.

To further enhance the effectiveness of the mechanical trap, an electrostatic collector 172 can be positioned near collection area 170. Electrostatic collector 172 may be a small electrode connected to a DC or AC power supply. The polarity and amount of charge applied to electrostatic collector 172 is application specific and depends on the polarity type and typical charge level of exhausted particulate material in an individual application.

A variety of different electrostatic trapping devices may be employed in the present invention. Details of another embodiment of such an electrostatic collector are discussed in detail below with respect to FIGS. 13(a), 13(b) and 13(c).

5. A Second Helical Coil Mechanical and Electrostatic Trap Embodiment

Figure 13A:
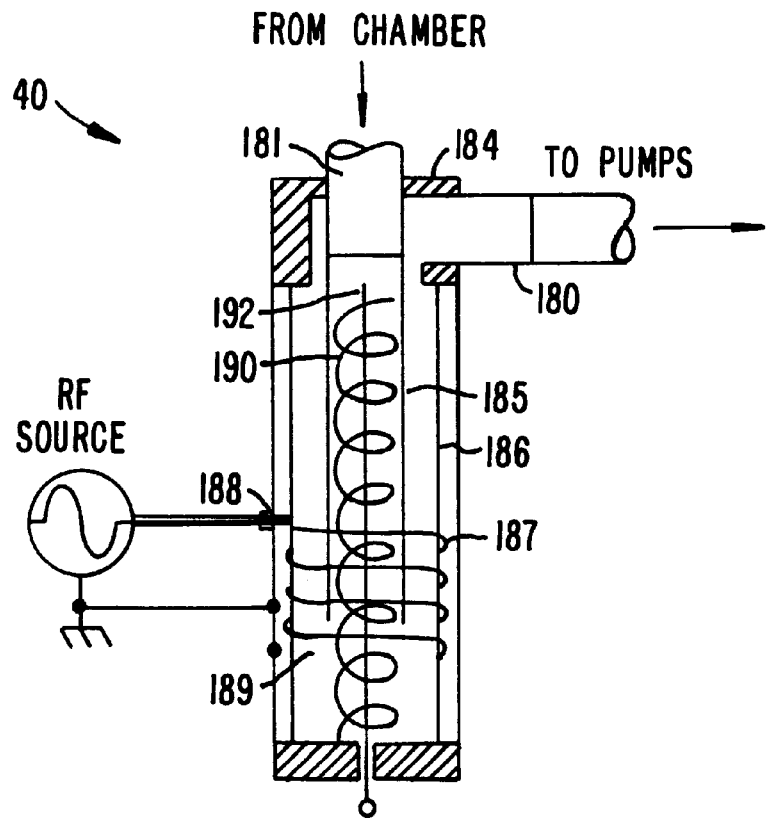
FIG. 13(a) is a side cross-sectional view of a fourth embodiment of the vacuum line cleaning apparatus of the present invention.

FIG. 13(a) is a cross-sectional view of another embodiment of DPA 40. The embodiment of FIG. 13(a) employs a mechanical trap design similar to the embodiment of FIG. 12 and also employs a modified electrostatic trap. Also, effluent gas is exhausted through a side flange 180 located adjacent to upper flange 181 rather than opposite the upper flange. Flange 180 is positioned to create a vacuum seal with outer casing 184 rather than exterior tube 186. Casing 184 is made from a metal or similar material while tube 186 is made out of an insulating material such as ceramic.

RF power is supplied to the DPA of this embodiment through an outer coil 187 that is designed to have an impedance of 50 ohms between the point of connection 188 to the RF supply and point 189 (ground). As above, coil 187 should be designed to have an impedance of 50 ohms so that the coil may be driven by a standard RF power supply. An inner coil 190 is wound within an inner tube 185. Inner coil 190 receives by induction the RF signal supplied on outer coil 187 and creates the voltage field necessary to drive the plasma reaction.

Figure 13B:
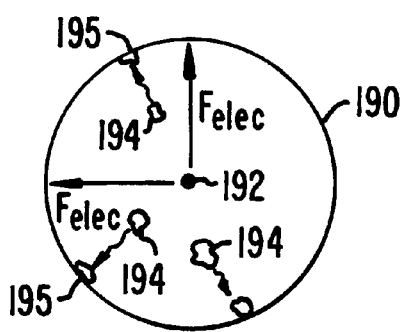
FIGS. 13(b) and 13(c) are diagrams illustrating the effect of the electrostatic trap employed in the apparatus of FIG. 13(a) on a particle exhausted into the apparatus of FIG. 13(a)

A central wire 192 runs through the center of inner tube 185 and a voltage potential is created between central wire 192 and inner coil 190 to electrostatically trap particulate matter passing through the DPA. The voltage potential can be created using numerous different approaches. In each approach, center wire 192 and coil 190 act as electrodes. In one embodiment, center wire 192 is grounded and a positive DC or AC voltage is applied to coil 190. As shown in FIG. 13(b), in the case where exhaust particles 194 are negatively charged, the particles are attracted by the voltage field ($F_{elec}$) created by wire 192 and coil 190 and collect at positions 195 on the positively charged coil. A similar result can be achieved if coil 190 is grounded and a negative voltage is applied to center wire 192. In this case, however, wire 192 repels negatively charged particles toward coil 190.

Figure 13C:
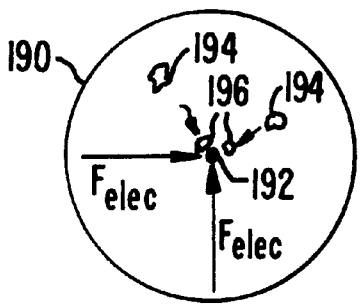

In another embodiment, a positive DC or AC voltage is applied to center wire 192 and coil 190 is connected to a ground potential. In this approach, the negatively charged particles are collected at positions 196 on positively charged wire 192 as shown in FIG. 13(c). A similar result can be achieved if a negative voltage is applied to coil 190 and center wire 192 is grounded. In this case, coil 190 repels the negatively charged particles toward wire 192.

In still other embodiments, neither wire 192 or coil 190 are grounded and instead both are connected to voltage sources that create a positive or negative voltage potential between wire 192 relative to coil 190. Of course, in the case where positively charged particulate matter is present, this matter may be collected on the electrode opposite the electrode the negatively charged matter is collected on.

Also, particles may be collected by electrostatic forces in cases where the particulate matter includes both positively and negatively charged particles. In such a case, positively charged particles are attracted to the lower potential electrode and negatively charged particles are attracted to the higher potential electrode. It is also possible to apply an AC voltage to center wire 192 in such a case. If an AC voltage is connected to center wire 192 and coil 190 is grounded, positive particulate matter is repelled from the wire toward coil 90 during the positive half-cycle. During the negative half-cycle, however, negative particulate matter is repelled from the wire and collected on coil 190. In such a case, the AC voltage period should be larger than the response time of the particles.

In any of the above cases, the electric field between the two electrodes can be between 50 and 5000 volts/cm. Preferably, the electric field is between the electrodes is between 500 volts/cm (DC) to 1000 volts/cm (AC). Whether particles are attracted away from central wire 192 to collect on coil 190 or vice versa depends on the polarity of the particles and the charges applied to coil 190 and wire 192.

Because this design relies on the voltage potential difference created between coil 190 and center wire 192, coil 190 should be positioned inside inner tube 185 to obtain maximum particle collection so as to not be separated from wire 192 by the insulating material of the tube. Being situated inside tube 185, coil 190 and center wire 192 come in contact with a variety of highly reactive species such as fluorine. Accordingly, it is important that coil 190 and wire 192 be made of a suitable conductive material, such as nickel, that does not react with such species. It is important to note that coil 190 carries both a voltage potential to attract or repel particles and RF power signal in this embodiment.

Figure 14A:
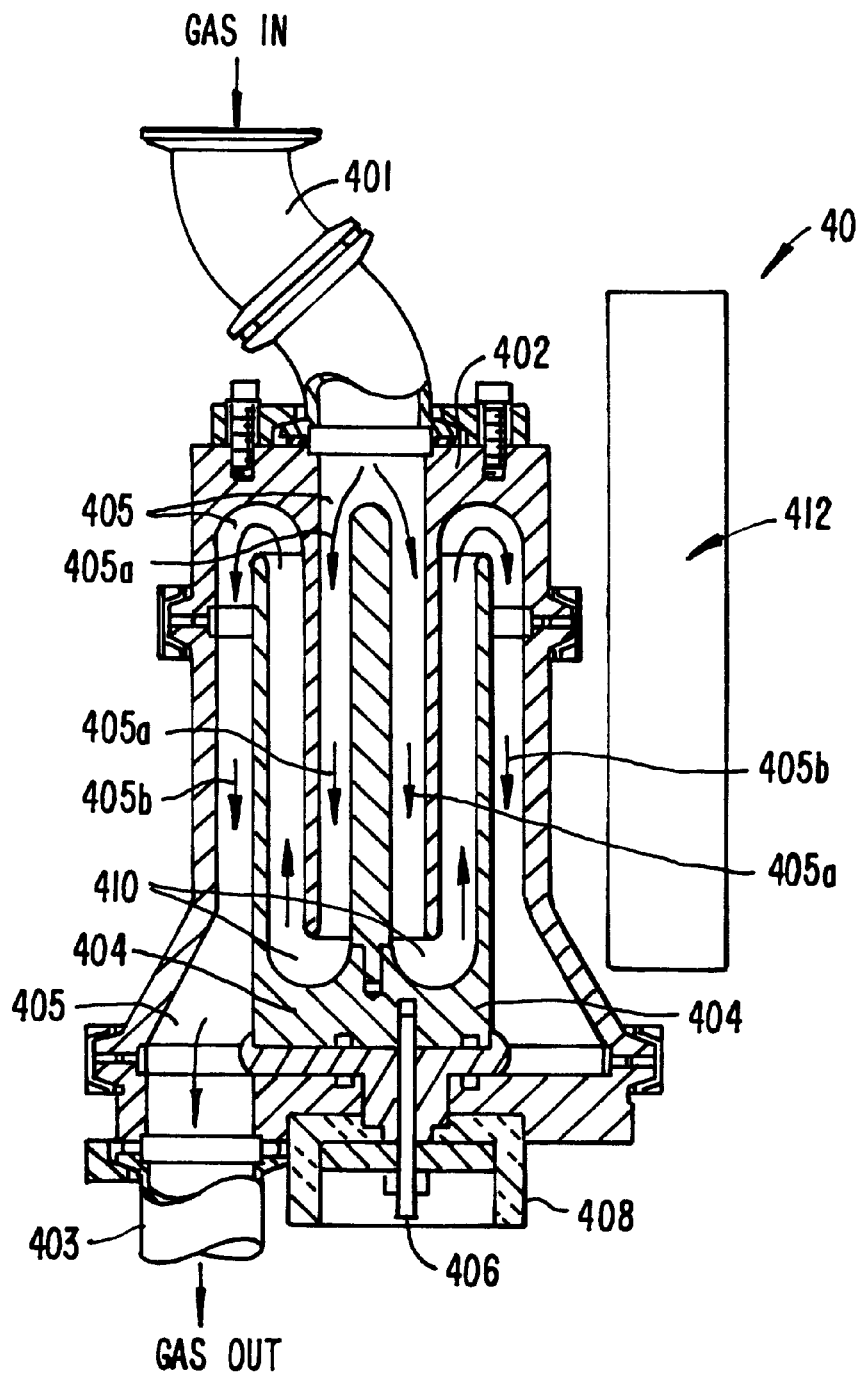
FIG. 14(a) is a side cross-sectional view of still another embodiment of the vacuum line cleaning apparatus of the present invention.
Figure 14B:
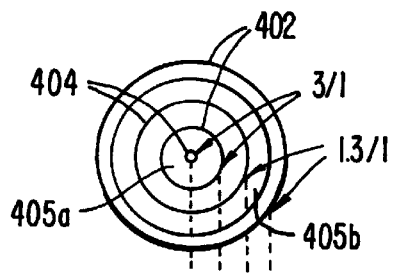
FIG. 14(b) is a diagram showing the surface area ratio of one electrode to another in the embodiment of the vacuum line cleaning apparatus shown in FIG. 14(a)

6. A Third Mechanical and Electrostatic Trap Embodiment Including Parallel Electrodes FIG. 14(a) is a cross-sectional view of another DPA 40 that includes mechanical and electrostatic traps. The embodiment of FIG. 14 is similar to the embodiment shown in FIGS. 4(a)–(c) in that it forms the plasma from RF power applied to a pair of capacitively coupled electrodes. The electrodes in FIG. 14(a), however, are perimetric, cylindrical electrodes 402 and 404 rather than the parallel plate electrodes of substantial equal surface area in the embodiment of FIGS. 4(a)–(f). As shown in FIG. 14(b), because of their cylindrical nature, the ratio of the surface area of electrode 402 to electrode 404 is different in different portions of the DPA. For example, in one embodiment, the ratio of the surface area of electrode 402 to 404 is about 3:1 in inner passage 405a. In this same embodiment, the ratio of the surface area of electrode 402 to 404 is about 1.3:1 in outer passage 405b.

Electrodes 402 and 404 define a gas passageway 405 through which gases exhausted from processing chamber 15 pass. Electrode 402 is grounded while RF and DC power is applied to electrode 404. RF and DC power are supplied to electrode 404 through PFD 406. PFD 406 is insulated from grounded electrode 402 by a teflon insulator 408.

Passageway 405 includes a "U"-shaped gravity trap area 410, which because of the concentric nature of the electrodes is shaped like the bottom half of a circular doughnut. Effluent gases enter gas passageway 405 from inlet 401 and exit through outlet 403.

If appropriate, a DC filter 412 can be positioned between DPA 40 and processing chamber 15 so that the voltage applied to the DPA to help trap electrically charged matter in the effluent gas stream does not interfere with substrate processing operations occurring within the chamber.

Figure 15:
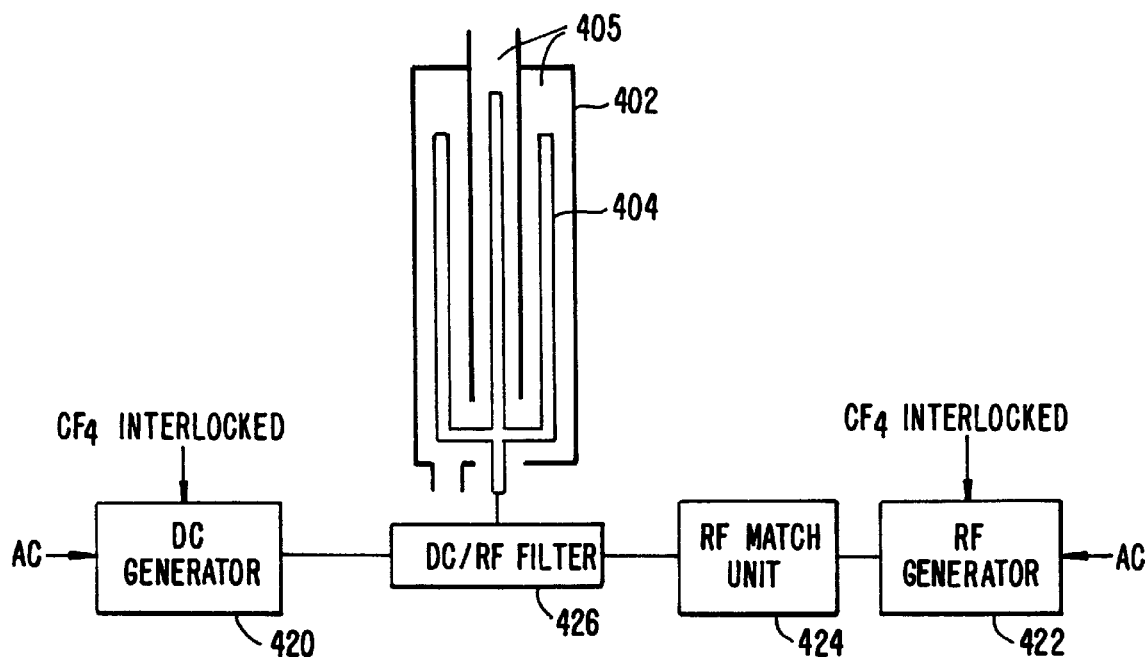
FIG. 15 is an electrical diagram of the embodiment of the vacuum line cleaning apparatus shown in FIG. 14(a)

A diagram showing the electrical circuit that includes electrodes 402 and 404 is shown in FIG. 15. As shown in FIG. 15, electrode 404 is connected to both a DC generator 420 and an RF generator 422 while electrode 402 is grounded. DC generator 420 supplies the DC voltage required by the electrostatic trap, and RF generator 422 supplies the RF power to form a plasma. An RF match circuit 424 matches the generator output impedance to 50Ω to minimize the reflected power, and a DC/RF filter (a 1 mΩ resistor in a preferred embodiment) 426 isolates DC power supply 420 from the RF power supply.

7. A Fourth Mechanical and Electrostatic Trap Embodiment Including Parallel Electrodes FIG. 16(a) is a cross-sectional view of another embodiment of DPA 40 that includes mechanical and electrostatic traps. The embodiment of FIG. 16(a) also includes evenly spaced, parallel electrodes 430 and 432 that form a capacitively coupled plasma from effluent gases exhausted into the DPA. Electrode 430 is connected to an RF and DC power supply in a manner similar to the embodiment of FIG. 14(a) and electrode 432 is grounded.

Each electrode is formed from sheet metal and bent to create gas passageway 435. Effluent gas from chamber 15 enters the gas passageway through an inlet 434 and exits from an outlet 436. Gas passageway 435 includes two gas flow paths, path 435a and path 435b, that are positioned side-by-side and that are initially separated by a portion of electrode 430. Dividing the gas flow passage into two separate passageways in such a manner increases the surface area of electrodes 430 and 432 within a fixed area. Electrodes 430 and 432 should be sufficiently thick so that they do not melt and/or bend under the heat conditions generated by RF plasma formation within the DPA. In other embodiments, electrodes 430 and 432 can be machined out of aluminum.

FIG. 16(b) is a perspective view of the DPA shown in FIG. 16(a). In FIG. 16(b), DPA 40 is encased by an aluminum casing 440 similar to other, already described embodiments of the DPA. Casing 440 includes a door 441 attached to the DPA by screws 442. DPA 40 can be cleaned by removal of this door. Also, RF and DC power is supplied to electrode 430 through a PFD connection 438.

8. A First Microwave Embodiment

Figures 17A, 17B:
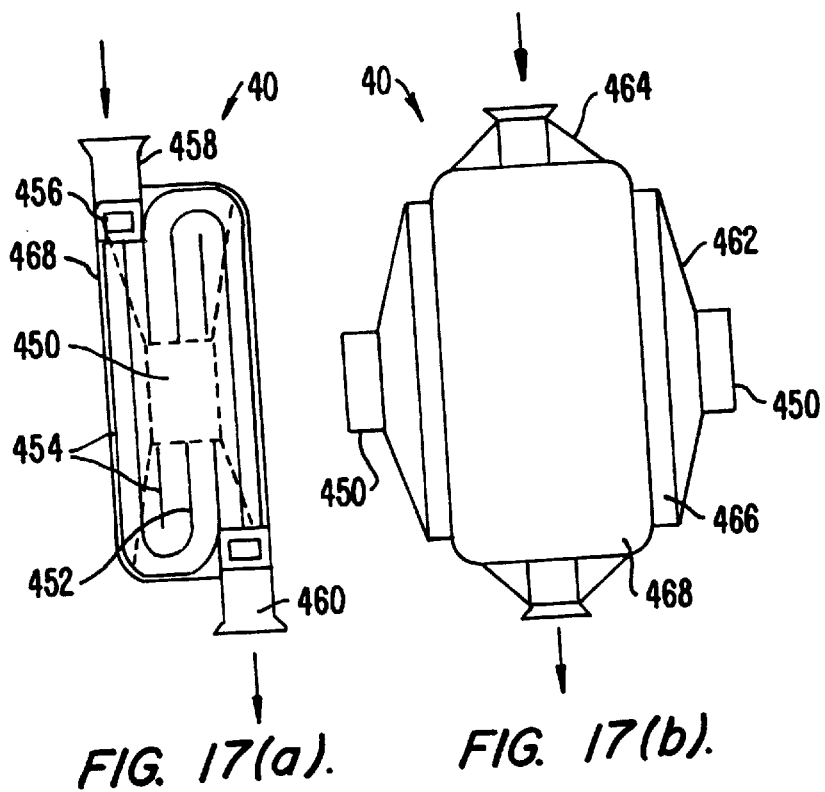
FIG. 17(a) is a side cross-sectional view of an embodiment of the vacuum line cleaning apparatus of the present invention that uses microwave power to form a plasma.
FIG. 17(b) is a front elevational view of the vacuum line cleaning apparatus of FIG. 17(a)

FIG. 17(*a*) is a side cross-sectional view of another embodiment of DPA 40, and FIG. 17(*b*) is a front elevational view of the embodiment shown in FIG. 17(*a*). The embodiment of FIGS. 17(*a*) and (*b*) employs microwave sources to generate a plasma and remove particulate material and residue collected within the DPA. While a number of different microwave sources are available, for purchase and operational cost reasons, a pair of alternatively pulsed magnetrons 450 (e.g., the type of magnetron employed in some microwave ovens) is preferably used. Such magnetrons can be two orders of magnitude or more lower than the price of a CW microwave generator or an RF generator.

Figure 18A:
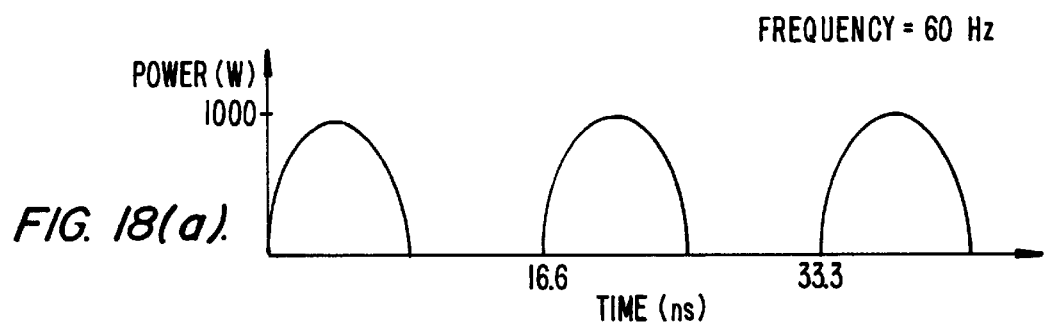
FIGS. 18(a), 18(b) and 18(c) are graphs showing the voltage waveforms generated by the microwave power supply in the apparatus of FIG. 17(a)
Figure 18B:
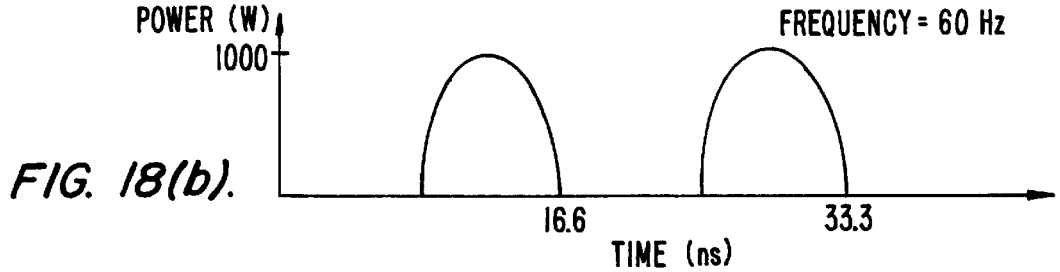
Figure 18C:
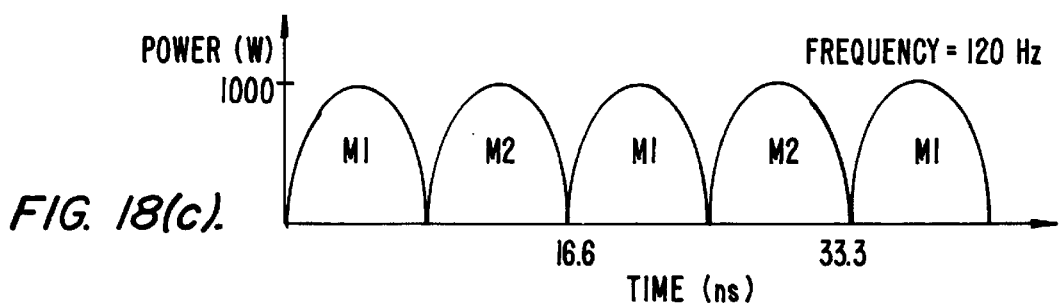

As shown in FIG. 18(*a*), each magnetron 450 generates an alternatively pulsed (60 Hz) electric field (2.45 GHz). By delaying the pulse of one magnetron by a phase difference of 180 degrees in relation to the other magnetron, as shown in FIG. 18(*b*), the two magnetron sources can be constantly pulsed at 120 Hz as shown in FIG. 18(*c*). In FIG. 18(*c*), a first cycle of the waveform (M1) is generated by one of the magnetrons and a second cycle (M2) is generated by the other. The energy generated by the magnetrons can produce an ionization efficiency of close to 90% with a high plasma density. Thus, such a power source results in a higher clean efficiency than capacitively coupled electrodes, which typically produce an ionization efficiency of between 10–20%.

A further advantage of the microwave sources is the reduction of Joules effect heating. Because less heat is generated, electrodes 452 and 454 (FIG. 17(*a*)), which define a gas flow passageway 456, can be readily made out of relatively thin sheet metal. Gas flow passageway 456 starts at an inlet 458 and ends at an outlet 460. The passageway is divided and follows dual paths in a manner similar to gas passageway 435 in the embodiment of FIG. 16(*a*). Also, inlet 458 is flared out into DPA 40 at the start of gas passageway 456 as shown by profile 464 in FIG. 17(*b*).

Magnetrons 450 are positioned on opposing sides of DPA 40. The microwave power is coupled to the reactor by an appropriate waveguide 462 (FIG. 17(*b*)). The magnetrons and waveguide combine to project microwaves through the width of gas passageway 456 so that plasma formation can occur throughout the entire gas passageway. The distance between the sheet metal electrodes may be adjusted according to the wavelength of the microwave so that each node (point of zero intensity) of the electric field is located at the electrode surface (i.e., the distance between the electrode plates should be a multiple of one-half the period of the microwave wavelength). Because of the positioning of magnetrons 450 and waveguide 462, a plasma is formed in all parts of gas passageway 456. A ceramic door 466 (FIG. 17(*b*)) separates the magnetrons and waveguide from electrodes 452 and 454, and an outer casing 468 encloses the DPA and provides a second level seal.

A DC power source (not shown) is coupled to electrode 452 to provide an electrostatic collector as previously described during a deposition or other substrate processing operation. DC power to electrode 452 is switched OFF (by a switch not shown) and the electrode is grounded, however, when magnetrons 450 are activated during a clean operation. Switching electrode 452 to ground during this time is required to prevent arcing, which might otherwise occur.

9. A Second Microwave Embodiment

Figures 19A, 19B:
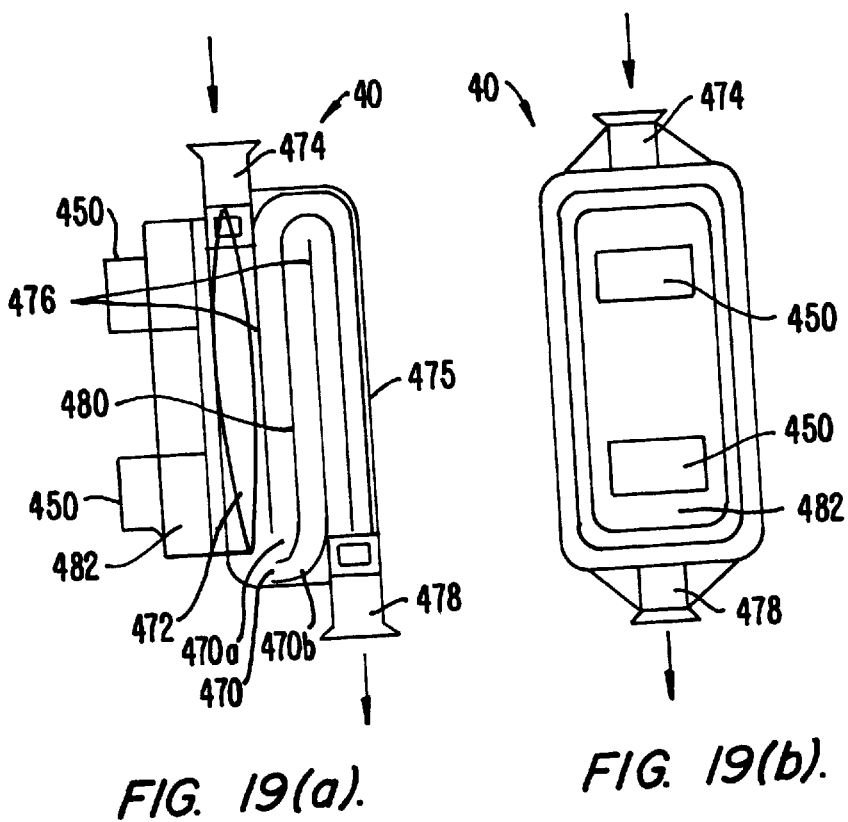
FIG. 19(a) is a side cross sectional view of a second embodiment of the vacuum line cleaning apparatus of the present invention that uses microwave power to form a plasma.
FIG. 19(b) is a front elevational view of the vacuum line cleaning apparatus of FIG. 19(a)

FIG. 19(*a*) is a side cross-sectional view of another embodiment of DPA 40, and FIG. 19(*b*) is a front elevational view of the embodiment shown in FIG. 19(*a*). The embodiment of FIGS. 19(*a*) and (*b*) is similar to the embodiment of FIGS. 17(*a*) and (*b*) in that it employs magnetrons 450 to generate the DPA plasma.

As shown in FIG. 19(*a*), this embodiment of DPA 40, however, the DPA includes an initial module 472 located just downstream of an inlet 474. Module 472 is dedicated toward plasma generation during a clean cycle so that etchant radicals (e.g., CF, and free F when $CF_4$ is employed as an etchant gas) can be generated with increased ionization efficiency. Such generated radicals have a relatively long lifetime and remain active when they are pumped into a second module 475 of the DPA to react with deposited and collected material.

Second module 475 includes gas passageway 470 that is defined by opposing electrodes 476 and 480 constructed from sheet metal in a preferred embodiment. Gas passageway 470 is similar in design to gas passageway 456 in the embodiment of FIGS. 17(*a*) and (*b*). It includes dual passages 470*a* and 470*b* and ends at outlet 478.

A waveguide 482 is coupled to magnetrons 450. The waveguide and magnetrons are positioned so that microwave generation forms the plasma in module 472. An inner wall of anode 476 prevents the microwaves from reaching other portions of gas passageway 470 outside of module 472. Electrode 480 is connected to a DC power supply (not shown) to provide an electrostatic collector similar to those previously described. In this embodiment, DC power to electrode 480 does not need to be switched OFF during the clean cycles. Because no plasma is generated in second module 475, there is no arcing problem.

10. An Additional Particle Reduction Experiment Using a Prototype DPA

Figure 20:
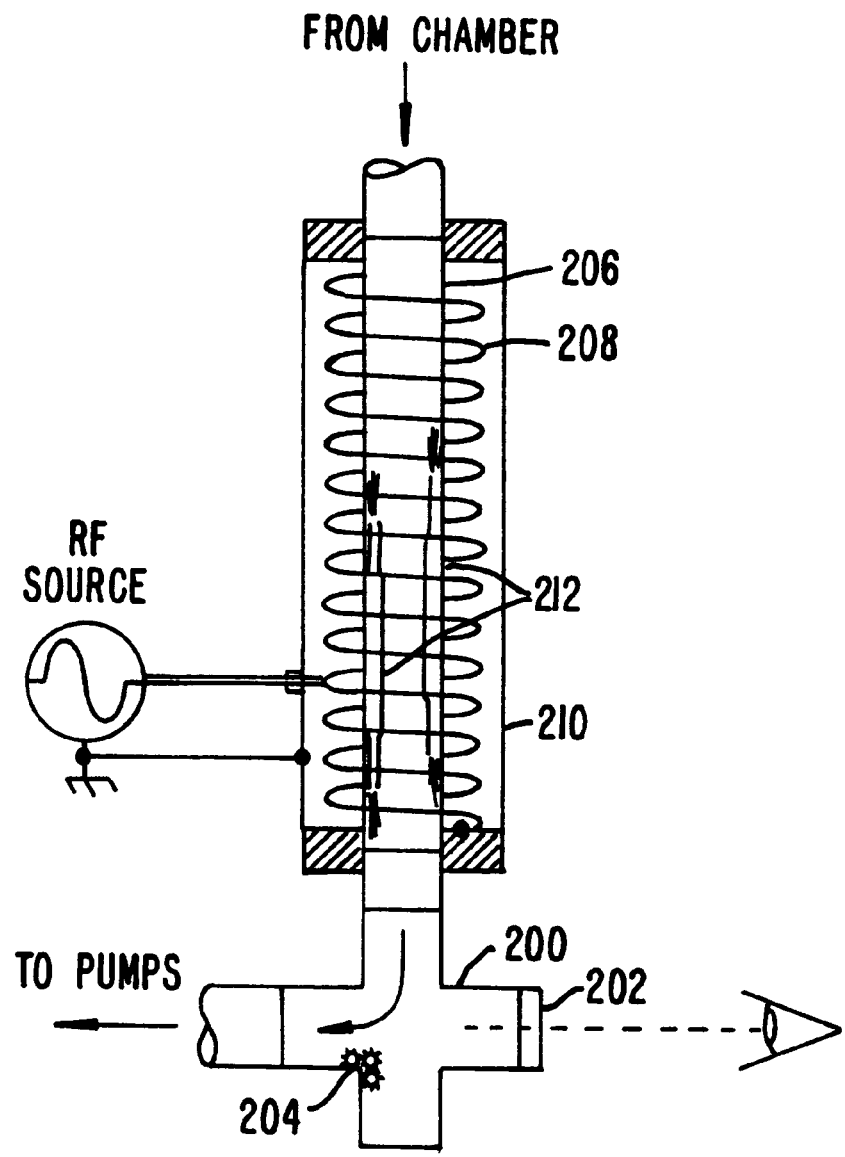
FIG. 20 is a side cross-sectional view of a prototype of one embodiment of the vacuum line cleaning apparatus of the present invention used in performing tests evaluating the effectiveness of the invention.

In another experiment to demonstrate the effectiveness of the present invention, a second prototype DPA 40 was attached to a Precision 5000 chamber outfitted for 8 inch wafers. The second prototype DPA was similar to DPA 40 shown in FIG. 11 except for the design of the lower flange used to connect the DPA to the foreline. A cross-sectional view of this second prototype DPA and lower flange is shown in FIG. 20. As shown in FIG. 20, a lower flange 200 redirected the exhaust gases flowing through the DPA into the foreline at an angle of approximately 90 degrees. The flange also was fitted with a quartz window opposite the foreline connection so that deposition material that built-up on a bottom portion 204 of flange could be observed. As mentioned, this design of the lower flange in the prototype DPA had the added benefit of trapping particulate matter in area 204 in a manner similar to but not as effective as the "U"-shaped passage or mechanical bucket trap designs in the embodiments of DPA 40 shown in FIGS. 4(*a*)–(*f*), 12 and 13(*a*).

The second prototype device included a quartz tube 206 having a coil 208 made out of ⅜ inch copper tubing wrapped around the exterior of the quartz tube. The total length of coil 208 was approximately 25 feet and a 13.56 MHz power supply was driven at various power levels as explained in the description of the experiments below. Quartz tube 206 and coil 208 were sealed within an aluminum container 210. The entire length of the assembly was approximately 14 inches, and the width of the assembly was approximately 4.5 inches.

The effectiveness of the second prototype DPA was tested in three separate experiments. In each experiment 100 wafers were processed in a silicon nitride deposition/$CF_4$ fluorine clean operation sequence performed in a Precision 5000 chamber having the second prototype DPA connected between the vacuum exhaust manifold and the foreline. The second prototype the DPA was kept OFF during the deposition sequence of each experiment and was turned ON and powered by a 13.56 RF power supply during the fluorine clean sequence. When OFF during deposition, particles collected along the interior of tube 206 as shown in FIG. 20 as areas 212. These particles were then removed from tube 206 when the DPA was activated during the clean sequence. The conditions for each of the three experiments are summarized in Table 2 below.

TABLE 2

| | Foreline Cleaning Results | | |
|---|---|---|---|
| | Experiment 1 | Experiment 2 | Experiment 3 |
| RF Frequency | 13.56 MHz | 13.56 MHz | 13.56 MHz |
| RF Power | 200 | 500 | 500 |
| $CF_4$ Flow | 1500 | 2000 | 2500 |
| $N_2O$ Flow | 500 | 500 | 500 |
| Result | Residue #1 in Table 2 | Residue #2 in Table 2 | Residue Exterminated |

In the first experiment, the fluorine clean sequence was 135 seconds and the DPA was driven at 200 Watts. $CF_4$ was introduced into the processing chamber at a rate of 1500 sccm and mixed with $N_2O$ introduced into the chamber at a rate of 500 sccm (a 3:1 ratio). After 100 deposition/clean sequences, the DPA was examined and found to be free of all residue and deposits. In the angular flange at the bottom of the DPA, a small amount of a residue build-up had collected. The atomic concentration of this residue build-up was measured and is summarized in Table 3 below. The majority of silicon in the residue was contained in the form of silicon oxide and approximately half the nitrogen was contained in a silicon nitride film with the other half being in the form of ammonia.

In the second experiment, the fluorine clean sequence was shortened to 120 seconds and voltage at which the DPA was driven was increased to 500 Watts. $CF_4$ was introduced into the processing chamber at a rate of 2000 sccm and mixed with $N_2O$ introduced into the chamber at a rate of 500 sccm (a 4:1 ratio). After 100 deposition/clean sequences, the DPA was examined and found to be free of all residue and deposits. A small amount of a residue build-up had collected in the angular flange. From a visual inspection, the amount of residue build-up was approximately 80% less than the amount of build-up in the first experiment, however.

The atomic concentration of this residue build-up was measured and is also summarized in Table 3 below. As evident from the table, the residue from this experiment contained a significantly higher concentration of fluorine than the residue from the first experiment. The fluorine concentrated residue provides more fluorine species for the plasma and thus makes the residue easier to clean during further DPA activation. It should also be noted that the overwhelming majority of silicon in the residue from this experiment was contained in the form of silicon oxide and the overwhelming majority of nitrogen was present in the form of ammonia.

The third experiment proved that the residue can be completely eliminated from both the DPA and the angular flange where residue tended to collect during the first and second experiments. In this third experiment, the fluorine clean sequence was 120 seconds long and voltage at which the DPA was driven was increased to 500 Watts. The rate at which $CF_4$ was introduced into the processing chamber was increased to 2500 sccm and mixed with $N_2O$ introduced into the chamber at a rate of 500 sccm (a 5:1 ratio). After 100 deposition/clean sequences, the DPA and angular flange were examined and both were found to be free of all residue and deposits.

The results of these experiments in the way of residue presence and composition is summarized in Table 3 below.

TABLE 3

| | Residue Collected at Bottom of DPA | | | | | | | | | | |
|---|---|---|---|---|---|---|---|---|---|---|---|
| | Atomic concentration % | | | | | | Si % present as | | | N % present as | |
| | C | O | N | Si | F | H | elem. | nit. | ox. | nitride | $NH_3$ |
| Residue #1 | 3.4 | 44.8 | 7.4 | 31.4 | 13.1 | N/A | 13.9 | 20 | 66.1 | 48.6 | 51.4 |
| Residue #2 | 4.8 | 20.5 | 15.2 | 19.8 | 39.8 | N/A | 4.2 | 3.3 | 92.5 | 3.7 | 96.3 |
| Residue #3 | NONE | NONE | NONE | NONE | NONE | NONE | NONE | NONE | NONE | NONE | NONE |

B. Specific Embodiments of DPA 40 Optimized For PFC Reduction

Some embodiments of the present invention are configured to and optimized for reducing PFC gases emitted from any process that emits such gases. A DPA so configured may be referred to as a PFC reduction reactor (hereinafter referred to as a "$PR^2$"). For sake of convenience and reference a DPA 40 configured and optimized as a $PR^2$ device is labelled $PR^2$ 240 in the remainder of this application. It is to be understood that $PR^2$ 240 may be connected to a chamber as is DPA 40 shown in FIG. 3.

A silicon oxide film deposition/clean sequence is used as an example of a process for which the present invention may be employed to reduce PFC emissions. It is to be understood, however, that the present invention is not limited to reducing PFC emissions in the following exemplary process sequence, and instead, has applicability to any process that introduces a PFC gas into chamber 15 and to any process where a PFC gas is a byproduct of the processing operation performed in chamber 15. Additionally, the present invention may be used to reduce emission of other substances such as hydrofluorocarbons (HFCs) or similar gases.

In the exemplary deposition/clean process sequence, a silicon oxide film is deposited over a substrate from a process gas including silane ($SiH_4$) and nitrous oxide ($N_2O$) precursor gases. After deposition is complete, the substrate is removed from the chamber and a chamber clean operation is performed to etch and remove unwanted silicon oxide buildup from the chamber walls. The clean operation consists of striking a plasma of $CF_4$ and $N_2O$.

As described above, only a small portion of the $CF_4$ introduced into the chamber during the clean operation actually reacts with material deposited on the chamber walls. The remaining unreacted $CF_4$ is exhausted from the chamber through the foreline along with other gaseous components, products and byproducts of the reaction.

In this example, a $PR^2$ of the present invention forms a plasma from the exhausted $CF_4$. Constituents from the plasma react with a source of silicon such as solid silicon oxide within the $PR^2$ to convert the $CF_4$ gas into less harmful gaseous products and byproducts that do not have the potential damaging effect of PFCs. Some of the reactions that take place inside the $PR^2$ are listed below:

$CF_x + SiO_2 \rightarrow SiF_x + CO_2$ $CF_4 + O_2 \rightarrow CO_2 + 2F_2$ $2CF_4 + O_2 \rightarrow 2COF_2 + 2F_2$ $C + SiO_2 \rightarrow CO + SiO$ $SiO + F_2 \rightarrow SiOF_2$ Of course, the exact reactions and reaction sequences are more complicated, with elementary reactions such as electron impact dissociation of species and gas phase radical recombination taking place. None of the products or byproducts listed above, which are known to be emitted from the $PR^2$, are PFCs. In fact, each of the products and byproducts listed above is water soluble. Thus, all effluent gases emitted from the $PR^2$ of the present invention are PFC-free gases if the PFC conversion reaction is 100 percent efficient.

While the above description is for exemplary purposes only, when PFC gases other than $CF_4$ are introduced into the $PR^2$ of the present invention and a plasma is formed, the plasma of these PFC gases also reacts with the silicon oxide source to form gaseous products that are not PFCs and are less harmful than PFCs.

In operation, when PFC gases are exhausted from vacuum chamber 15 into vacuum line 31, they pass through $PR^2$ 40. Within $PR^2$ 40, the exhausted gases are subject to an electric field that creates and/or maintains a plasma. Constituents from the plasma react with a PFC oxidizing agent such as a silicon and/or oxygen compound within $PR^2$ 40 to convert the effluent PFCs into less harmful gaseous products and byproducts that are not PFCs and that may be pumped out through the foreline. Generally plasma formation is performed ($PR^2$ 40 activated) only during the clean operation of a deposition/clean sequence because it is during this period that effluent PFC gases are present in the exhaust stream. Thus, during the deposition sequence, a plasma is generally not formed within $PR^2$ 40. If, however, PFC gases are emitted from a particular process during a deposition or other process step (e.g., an etch step in which a fluorine gas reacts with carbon containing photoresist to produce a $CF_4$ byproduct), $PR^2$ 240 can be activated to reduce PFC emissions during that time.

The silicon and oxygen within $PR^2$ 240 with which the PFC plasma reacts can be from a variety of different sources. In several embodiments of the present invention, a specially designed filter contains a solid form of a silicon oxide compound such as sand or quartz for the plasma reaction. The silicon filter is placed within the area of $PR^2$ 240 where the plasma is formed. In other embodiments of the present invention, residue exhausted from a silicon oxide, silicon nitride, silicon oxynitride, silicon carbide or similar deposition phase of a deposition/clean process sequence is trapped and collected within $PR^2$ 240 in a manner similar to those described with reference to DPA 40. Typical residue products that may be trapped during such deposition processes include $SiO_2$, SiN, SiON, SiC and similar compounds. Of course, the actual residue collected depends on the gases introduced during deposition or other process step. The collected residue acts as a silicon source for the plasma reaction. Trapping is done using mechanical and/or electrostatic trapping mechanisms in conjunction with thermophoretic forces as described above in relation to FIG. 7, and also as described in more detail below with respect to various embodiments of the present invention. Once trapped, the silicon residue or other particulate matter remains in $PR^2$ 240 until it reacts with active species in the PFC plasma to form gaseous byproducts that are then pumped through vacuum line 31. In still other embodiments of the present invention, silicon containing and/or oxygen containing gases are introduced into $PR^2$ 240 specifically to enhance the decomposition of the effluent PFC gases. The introduction of these silicon and/or oxygen containing gases can be in addition to or in lieu of the use of a silicon filter and/or electrostatic and/or mechanical trapping mechanisms.

The electric field created within $PR^2$ 240 to form the plasma can be generated using a variety of known methods such as applying RF power (in some preferred embodiments HF power (<350 KHz) is used instead of RF power in order to minimize equipment and operating costs) to capacitively coupled electrodes, a hollow cathode reactor, or to inductively coupled coils, microwave devices or ECR techniques can also be used. PFC conversion is directly related to the density of the formed plasma, however, so devices that form a high density plasma such as an inductive coil or hollow cathode reactor are preferred in some embodiments. PFC conversion is also directly related to the power at which the plasma is formed and is inversely related to the residence time of the PFC gases within the $PR^2$ device. Thus, the actual power output of the supply will depend on the application for which the $PR^2$ is used, the density of the plasma, the volume of PFC gas to be treated in $PR^2$ 240 and the residence time of the PFC gases among other factors. Ideally, $PR^2$ 240 generates a plasma sufficient to convert substantially all PFC gas passing through the $PR^2$ into other gases.

Also, $PR^2$ 240 should be designed so that its use is transparent to the process being run. That is, if $PR^2$ 240 is operated during a clean sequence, $PR^2$ 240 should be designed to convert substantially all PFC gases from the exhaust stream to non-PFC gases during the clean sequence without extending the duration of the clean sequence. In such a case, $PR^2$ 240 has no adverse effect on wafer throughput.

RF power can be derived from RF power supply 25 or can be supplied by a separate RF power supply that drives only $PR^2$ 240. In most embodiments, microwave ECR embodiments being a notable exception, it is preferable to use low frequency RF power to operate $PR^2$ 240. The use of a low frequency RF power supply that provides RF power at between approximately 50 KHz to 2 MHz is significantly less expensive to operation than higher RF frequencies such as 13.56 MHz. Assuming multiple processing chambers are present in a clean room, the multiple $PR^2$s connected to the chambers may all be driven by a separate, dedicated $PR^2$ RF power supply that is connected to an appropriate number of RF power splitters.

The length and size of $PR^2$ 240 can vary. In some applications, $PR^2$ 240 can be only 4–6 inches long or even shorter, while in other applications, $PR^2$ 240 can be the entire length of vacuum line 31 (4–5 feet or longer) thus replacing the line. Generally, the residence time of individual molecules will increase with an increase in the length and volume of the $PR^2$. $PR^2$ design must balance space considerations with residue collecting efficiency. Shorter or less voluminous $PR^2$s that include appropriately designed particle trapping mechanisms or filters, however, may be able to convert substantially all the PFC gases exhausted from the processing chamber into less harmful gases making length and volume less important factors.

A number of different embodiments of the apparatus of the present invention may be constructed. Several such embodiments are illustrated below for exemplary purposes. In no way should it be construed that the present invention is limited to these specific embodiments.

Figure 21:
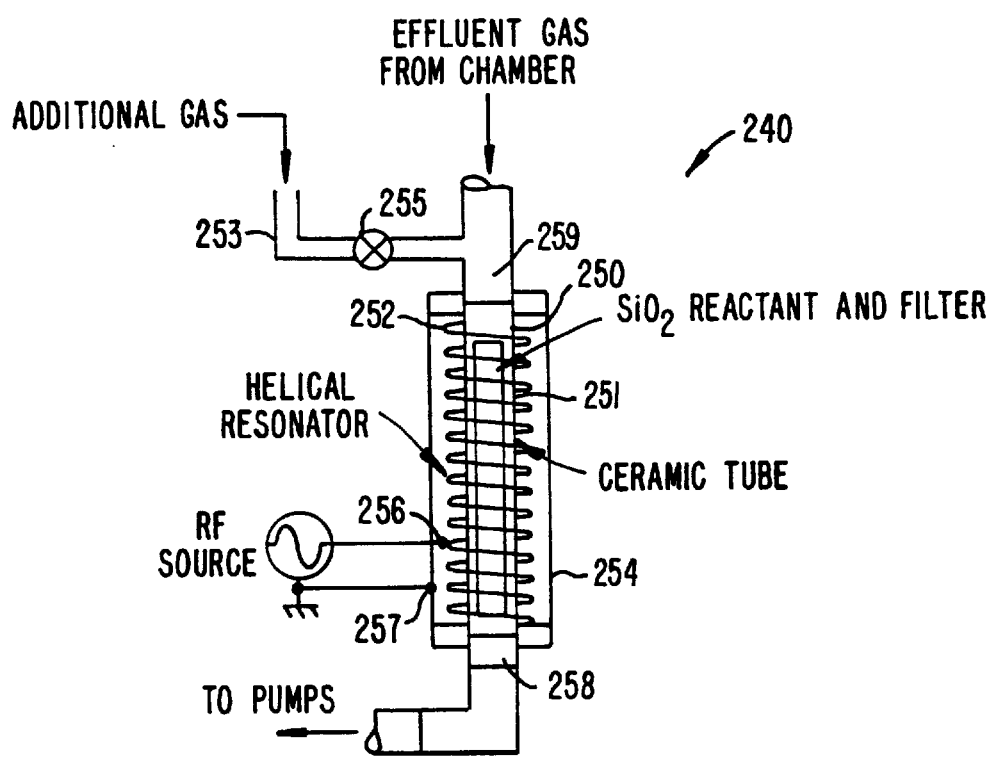
FIG. 21 is a side cross-sectional view of one embodiment of the apparatus of the present invention optimized for PFC reduction.

1. Silicon-Filled Filter Embodiments a) Single Tube, Helical Resonator Embodiment FIG. 21 is a cross-sectional view of a first embodiment of $PR^2$ 240. In FIG. 21, $PR^2$ 240 includes a tube 250 through which exhaust gases from processing chamber 15 flow as they pass through $PR^2$ 240. Tube 250 is a cylindrical tube made out of an insulating material such as ceramic, glass or quartz. In a preferred embodiment, tube 250 is made out of a ceramic material that is does not react with etchant gases, such as fluorine, used in the clean steps. Also, tube 250 has approximately the same interior diameter as the interior diameter of vacuum line 31. In other embodiments, tube 250 need not necessarily be in cylindrical form and may instead have angular, planar or elliptical or similarly curved interior surfaces. In these and other embodiments, the interior diameter of tube 250 may also be either larger or smaller than the interior diameter of vacuum line 231.

A filter 251 is within tube 250. Filter 251 is a porous filter that contains a source of solid silicon available to react with PFC gases under a plasma condition to convert the gases to non-PFC gases. Filter 251 may be a consumable part insertable into tube 250 that may be replaced as its silicon compound is used up. The source of silicon within filter 251 can be any of a number of silicon containing materials. Preferably, the source of silicon is a silicon oxide material such as sand or glass, quartz, flint or onyx. Also, preferably the filter is porous enough so as to not significantly effect the pumping speed or conductance of the foreline.

Use of a silicon oxide material provides both silicon and oxygen with which the PFC plasma may react. In a preferred embodiment, crushed quartz is used as the silicon source. Crushing the quartz increases the total surface area making more silicon available for the reaction. Additionally, the crushed quartz acts as a mechanical filter for solid residue generated during the deposition process and can thus trap additional silicon material for the reaction as such material is exhausted from chamber 15 in processes that produce silicon residues.

A coil 252 is wound around the exterior of tube 250 and connected to an RF power supply at point 256 and connected to a ground potential at point 257. PFC exhaust gases passing through tube 250 are excited into a plasma state by the application of a voltage from the RF power supply to coil 252. In the plasma state, constituents from the exhaust material react with solid silicon oxide reactants in filter 251 to form gaseous products that are not PFCs which are then pumped out of $PR^2$ 240 and vacuum line 31 by pump system 32 as described above.

A gas supply line 253 can supply additional gases which are a source of oxygen and/or silicon to enhance the PFC conversion reaction. Exemplary gases that may be used include $O_2$, $O_3$, $N_2O$, $SiH_4$, or the like. Of course liquid sources such as tetraethylorthosilicate (TEOS) may also be vaporized and introduced through line 53. The rate at which the additional reaction enhancing gas is introduced into $PR^2$ 40 is set by processor 34 controlling a valve 255. Processor 34 is communicatively coupled to valve 255 by a control line not shown.

Coil 252 is an inductive coil such as a helical resonator coil. Such coils are well known to those of ordinary skill in the art and may be designed according to criteria set forth in any of a number of well known textbooks such as Michael A. Lieberman and Allan J. Lichtenberg, "Principles of Plasma Discharges and Materials Processing," pp. 404–410 John Wiley & Sons (1994), which is hereby incorporated by reference. The helical resonator coil can be made out of a high conductivity type metal such as copper, nickel, or gold or similar conducting material. To properly resonate the coil, it is important that the length of the coil be about or slightly longer than ¼ of the wavelength of the applied RF signal. A coil of this length creates a stronger and more intense voltage field that further enhances decomposition of PFC gases. Coil 252 may be wound within the interior of tube 250 rather than external to the tube.

An outer container 254 surrounds tube 250. Container 254 serves at least two purposes. First, it acts as a Faraday cage and shields CVD processing apparatus 10 and other equipment from the radiation generated by coil 252. Second, if ceramic tube 250 were to break or crack or if the vacuum seal in tube 250 is broken in another manner, container 254 provides a second seal preventing the exhaust gases from escaping. Container 254 can be made out of a variety of metals such as aluminum or steel or other compounds and is preferably grounded for shielding effect. Upper and lower flanges 259 and 258, respectively, connect $PR^2$ 240 to vacuum manifold 24 and vacuum line 31 while maintaining a vacuum seal.

Standard RF power supplies are designed with an output impedance of 50 ohms. Accordingly, the point of contact for the RF power supply to coil 252 (point 256) should be selected so that coil 252 has an impedance of 50 ohms. Other course, if the power supply required another impedance level, point 256 should be chosen accordingly.

Coil 252 is driven by the RF power supply at a power level of 50 Watts or greater. The actual voltage generated by coil 252 depends on a number of factors such as the power used by the RF power supply, length and winding spacing coil 252 and the resistance of the coil among other factors. Since voltage is spread evenly along the coil, determining the voltage level for the entire coil can be done by determining the level between the points at which the coil is connected to ground and the RF power supply (points 255 and 256). For example, if a particular coil is four times as long as the portion of the coil between points 255 and 256, the total voltage of the coil will be four times the voltage level between points 255 and 256.

The coil, power level and applied RF frequency should be selected so that a strong, intense plasma is formed within tube 250, but also so that the voltage generated by coil 252 does not exceed a level at which current will arc from the coil to container 254. It is possible to put an insulating material between container 254 and coil 252 if arcing is a problem for a particular $PR^2$. For simplicity of design, however, it is preferable to have the space between container 254 and coil 252 filled with air.

b) Single Tube, Microwave Embodiment

Figure 22:
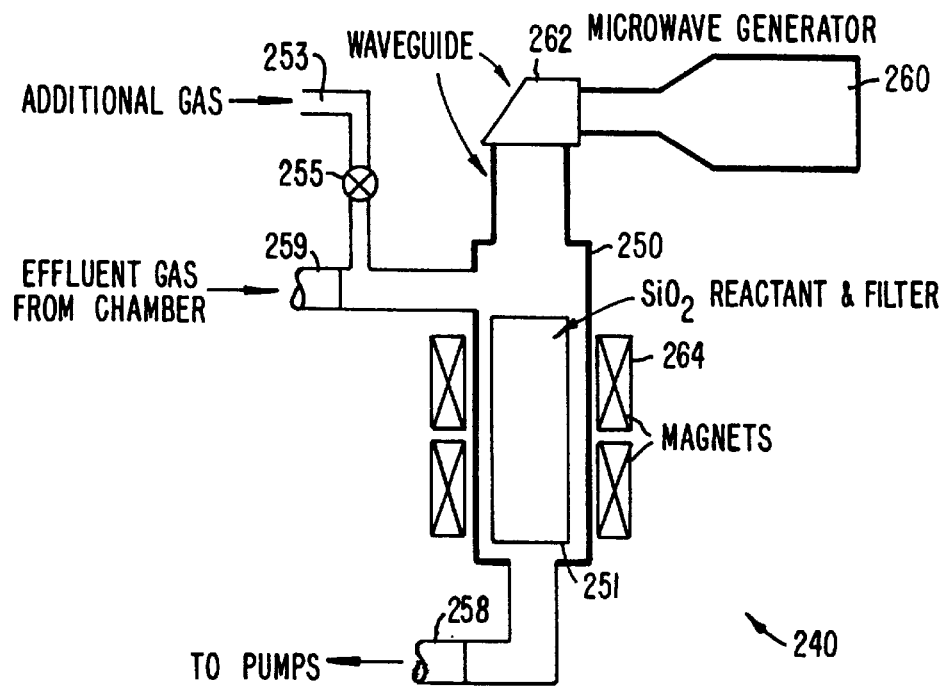
FIG. 22 is a side cross-sectional view of a second embodiment of the PFC reducing apparatus of the present invention.

FIG. 22 is a cross-sectional view of a second embodiment of $PR^2$ 240. The embodiment of $PR^2$ 240 shown in FIG. 22 includes many of the same elements of the embodiment shown in FIG. 21. Accordingly, for convenience, in FIG. 22 and in the remaining figures of this application, like reference numbers are used to refer to like elements. Also for convenience, only new elements of FIG. 22 and other figures are discussed in great detail below when appropriate.

In FIG. 22, a microwave generator 260 and wave guide 262 are used to generate a high density plasma from effluent PFC gases entering PR² 240. Magnets 264 are positioned around the exterior of tube 250 as in electron cyclotron resonance (ECR) devices to further energize gaseous molecules within tube 250 and enhance plasma formation. Constituents from the plasma react with silicon oxide material in filter 251 to convert the PFC gases to non-PFC gases. As in the above described embodiment, additional gases can be added to PR² 240 from gas line 253 to enhance the conversion process.

While not shown, the embodiment of PR² 240 shown in FIG. 22 is preferably encased in an outer casing such as container 254. The outer casing should maintain a second seal so that PFC or other gases passing through tube 250 cannot escape from PR² 240 in case of a leak or other defect in tube 250.

c) Helical Coil Hollow Cathode Reactor

Figure 23:
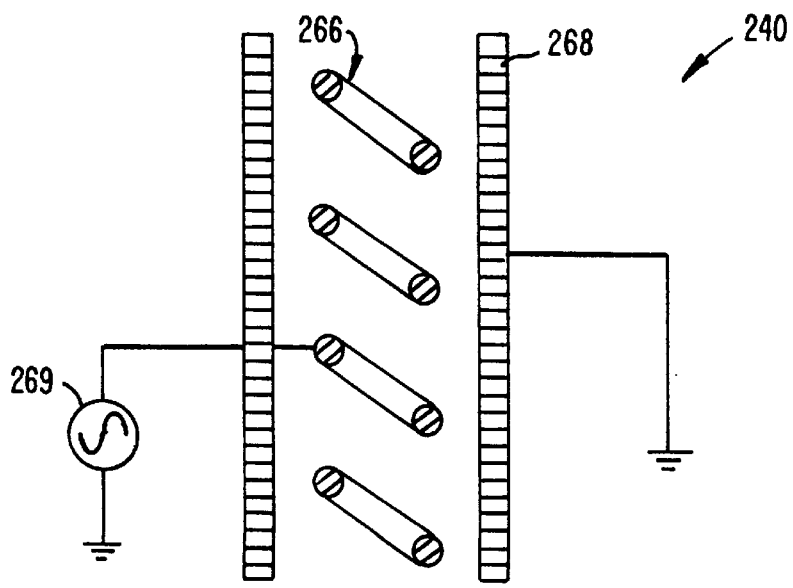
FIG. 23 is a side cross-sectional view of a third embodiment of the PFC reducing apparatus of the present invention.

FIG. 23 is a cross-sectional view of a third embodiment of PR² 240. In FIG. 23, a helical resonator coil 266 is positioned within a cylindrical metal tube 268 to form a helical coil hollow cathode reactor embodiment of PR² 240. Coil 266 is coupled to an HF or RF power source 269 while tube 268 is grounded. The remaining structure of this embodiment of PR² 240 is not shown in FIG. 23. Such structure includes, for example, gas line 253, valve 255, flanges 258 and 259, container 254, etc., and is similar to that of PR² 240 shown in FIG. 17.

When HF or RF power is applied to coil 266, an inductively coupled plasma is formed within the coil from the RF power applied to the coil and a capacitively coupled plasma is formed between the coil and tube 268. Because coil 266 and tube 268 are subject to highly reactive fluorine species from the plasma, they should be made from a suitable conductive material, such as nickel, that does not react with such species. A silicon filter, not shown, can be placed within and/or surrounding coil 266 to provide silicon and oxygen material for the PFC plasma to react with. Additionally, silicon and/or oxygen containing gases may be supplied to the plasma from gas line 253.

d) Multistage Hollow Cathode Reactor

Figure 24:
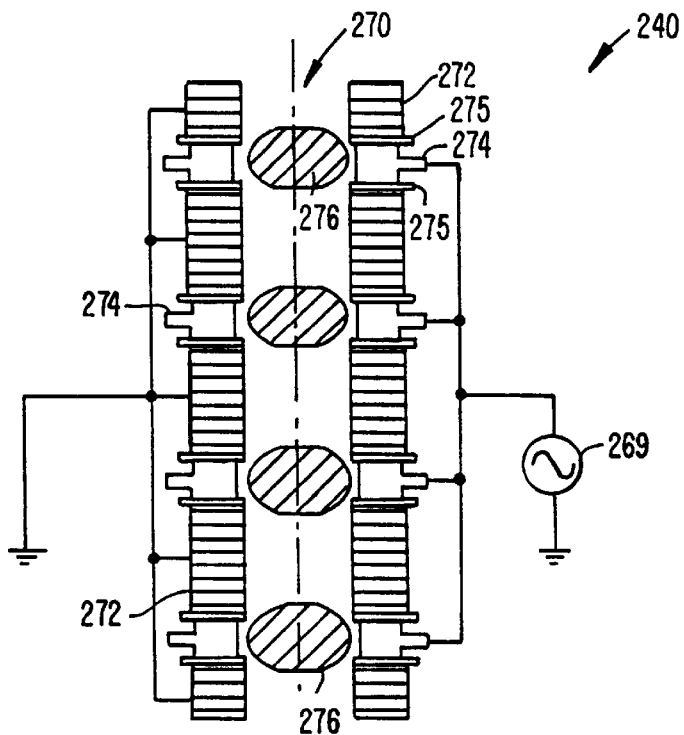
FIG. 24 is a side cross-sectional view of a fourth, preferred embodiment of the PFC reducing apparatus of the present invention.

FIG. 24 is a cross-sectional view of a fourth, more preferred embodiment of PR² 240. In FIG. 24, a cylindrical gas passageway is created by cylindrically shaped anodes 272, cathodes 274 and insulation barriers 275. Cathodes 274 are connected to HF or RF power supply 269 while anodes 272 are grounded. Insulation barriers 275 insulate anodes 272 from cathodes 274. This alternating electrode/cathode configuration creates a multistage hollow cathode reactor in which a high density plasma (on the order of $10^{12}$ ions/cm³) can be formed. Each stage (anode/cathode pair) of the reactor creates the high density plasma within passageway 270 in an area proximate the cathode as shown by regions 276.

To maintain hollow cathode regime and high plasma density, as well as increase molecule residence time within this embodiment of PR² 240, the pressure within passageway 270 can be controlled by a separate throttle valve, not shown, placed in the foreline just after PR² 240. The controlled pressure can range from 100–500 millitorr (base foreline pressure) up to the pressure within the processing chamber (4–20 torr in the case of a PECVD process and up to 700 torr or more for SACVD or APCVD processes) with the actual pressure being set to maximize PFC conversion.

DC power rather than HF or RF power can be supplied to cathodes 274 in other embodiments of this multistage, hollow cathode reactor design. HF or RF power is supplied, however, in preferred embodiments because the directional DC current from a DC power source may etch the electrodes. When an HF or RF supply is used, this sputter etching effect is either significantly lessened or nonexistent. HF power is used in the most preferred embodiments to reduce equipment and operating costs.

As in the hollow cathode reactor design of FIG. 23, a silicon filter, not shown or silicon and/or oxygen containing gases supplied from gas line 253 can be employed to enhance the PFC conversion process as appropriate. Also, structure such as gas line 253, valve 255, flanges 258 and 259, container 254, etc., which is similar to that of PR² 240 shown in FIG. 17, is not shown in FIG. 20.

2. Silicon Particle Trap Embodiments

If the deposition, etch or other process that takes place in chamber 15 before a PFC clean sequence produces a silicon containing residue, certain embodiments of the apparatus of the present invention can trap and collect that residue for use as a silicon source. Thus, these embodiments do not require, but may still employ, a specially designed silicon filter.

Examples of deposition processes that produce silicon residues include but are not limited to TEOS and silane silicon oxide deposition processes and silane silicon nitride deposition processes. In such processes, exhausted silicon residues that may be trapped for PFC conversion reactions include $SiO_2$, SiN, SiON, SiC, amorphous silicon and similar compounds. Of course, the actual residue collected depends on the gases introduced in the deposition, etch or other process employed.

The exhausted residue from these deposition or other process operations is generally the same residue that is collected on and thus eventually cleaned from the chamber walls. Accordingly, the conversion of PFC gases to non-PFC gases in these embodiments results from reactions that are identical to the reactions that take place in the chamber during the clean operation.

a) Single Tube, Helical Resonator Embodiment

Figure 25:
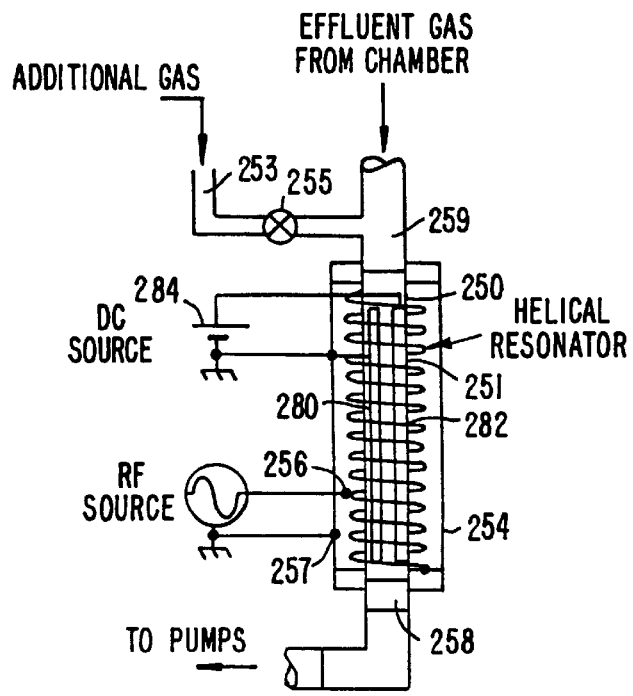
FIG. 25 is a side cross-sectional view of a fifth embodiment of the PFC reducing apparatus of the present invention.

FIG. 25 is a cross-sectional view of a fifth embodiment of PR² 240. The embodiment of PR² 240 shown in FIG. 25 is similar to the embodiment shown in FIG. 21 except that the source of silicon with which constituents from the PFC plasma react is silicon containing residue trapped by an electrostatic collector that includes opposing electrodes 280 and 282 rather than a solid silicon compound within a filter insert. The silicon containing residue is trapped and collected during a deposition or other process step by a voltage potential applied between electrodes 280 and 282 from a DC power source 284. The applied voltage potential makes electrode 282 positively charged compared to electrode 280 (or vice-versa). As residue particles pass through PR² 240, positively charged particles are attracted toward and collect on the more negatively charged electrode 280 and negatively charged particles are attracted toward and collect on the positively charged electrode 282. Depending on the type of deposition process employed and the length of the process, several millimeters or more of silicon containing residue can build up on electrodes 280 and 282.

After the deposition sequence is completed and the clean sequence is initiated, a plasma is formed from PFC gases exhausted into PR² 240 in the same manner as described with respect to FIG. 21. Constituents from the plasma react with the silicon residue collected on electrodes 280 and 282 to produce non-PFC products and byproducts. The voltage potential between electrodes 280 and 282 may be maintained during the clean sequence to ensure that particles collected along the electrodes remain there until they react with the PFC plasma. The voltage potential is preferably switched off during the clean sequence, however, if clean or other gases used for a particular process etch the electrodes. Being situated inside tube 250, electrodes 280 and 282 come in contact with a variety of highly reactive species such as fluorine. Accordingly, it is important that electrodes 280 and 282 be made of a suitable conductive material, such as nickel, that does not react with such species.

A variety of different electrostatic trapping devices may be employed in this and other embodiments of the present invention. For example, a negatively charged DC or an AC voltage may be applied to electrode 282 rather than a positive DC voltage. In still other embodiments, both electrode 280 and 282 are connected to voltage sources that create a positive or negative voltage from electrode 280 relative to electrode 282. The present invention is not limited to any particular electrostatic collection device.

b) Single Tube, Microwave Embodiment

Figure 26:
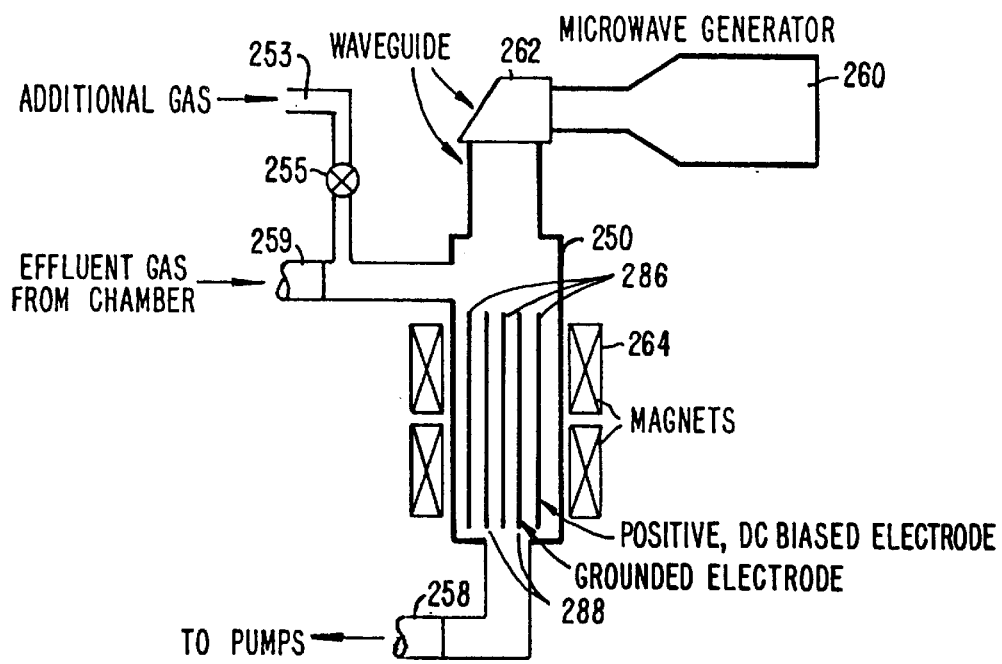
FIG. 26 is a side cross-sectional view of a sixth embodiment of the PFC reducing apparatus of the present invention.

FIG. 26 is a cross-sectional view of a sixth embodiment of $PR^2$ 240. In FIG. 26, electrodes of opposite polarity (electrodes 286 and 288) are alternately arranged within the cylindrical volume of tube 250 to form an electrostatic collection device as described above. Silicon containing and oxygen containing residues or similar matter is collected upon the surface of electrodes 286 and 288 during a deposition sequence.

As in the embodiment of $PR^2$ 240 shown in FIG. 22, the embodiment of FIG. 26 forms a high density plasma from PFC gases passing through the device by application of microwave power from microwave generator 260 and wave guide 262. Magnets 264 are positioned around the exterior of tube 250 as in electron cyclotron resonance (ECR) devices to further energize gaseous molecules within tube 250 and enhance plasma formation. Constituents from the plasma react with silicon and/or oxide residue that is collected on electrodes 286 and 288 to convert the PFC gases to non-PFC gases. Additional gases can be added to $PR^2$ 240 from gas line 253, not shown, to enhance the conversion process.

Also not shown in the embodiment of $PR^2$ 240 shown in FIG. 26 is container 254 or a similar casing mechanism that forms a second seal so that PFC or other gases passing through tube 250 cannot escape from $PR^2$ 240 in case of a leak or other defect in the tube.

c) Inner and Outer Cylindrical Tube Embodiment

Figure 27:
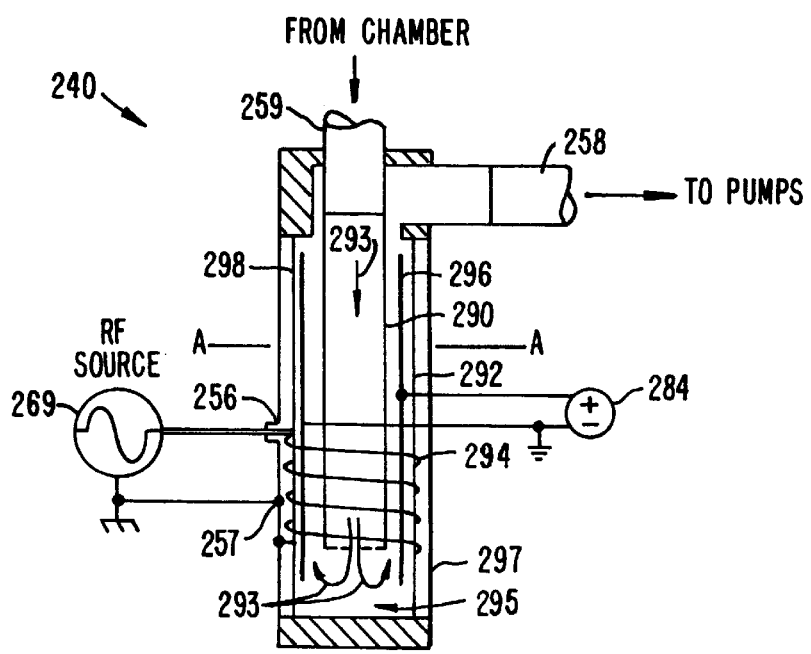
FIG. 27 is a side cross-sectional view of a seventh embodiment of the PFC reducing apparatus of the present invention.

FIG. 27 is a cross-sectional view of a seventh embodiment of $PR^2$ 240. The embodiment of $PR^2$ 240 shown in FIG. 27 includes a first inner ceramic tube 290 and a second outer ceramic tube 292. The end of tube 290 is within the cylindrical space of tube 292 so that gas flow through $PR^2$ 240 is as shown in arrows 293.

A helical resonator coil 294 is wrapped around the exterior of tube 292 and connected to an RF power supply 269 as described in relation to the embodiment of FIG. 21. Coil 294 could also be wound within the interior of tube 92 or around the exterior or interior of tube 90.

A shell 297, similar to container 254 above, encloses both inner and outer tubes 290 and 292. Outer tube 292 may be supported by connections to either inner tube 290 or shell 297. In either case, it is important that a support structure for outer tube 292 allow the effluent gas stream to pass through $PR^2$ 240. To this end, the support structure may be a plane of ceramic material between tubes 290 and 292 having a plurality of perforated holes, may consist or only three of four slender connections or fingers extending between tubes 290 and 292, or may be designed in numerous other equivalent manners. A structure including perforated holes can help collect and trap silicon residue or other particulate matter within a collection area 295 described below. As would be understood by a person of ordinary skill in the art, the structure should be designed so that the holes are large enough so as to not reduce the flow rate of gases pumped through $PR^2$ 240.

The design of this embodiment of $PR^2$ 240 enhances the trapping and collection of silicon residue or other particulate matter exhausted during a deposition step. The design includes collection area 295 of tube 292 that acts as a mechanical trap collecting and holding residue and particles in the exhaust gas stream. The residue and particles are held in the trap and are thus available to react with constituents of the PFC plasma formed during the clean sequence.

The operation of the mechanical trap portion of this embodiment of $PR^2$ 240 relies in part on gravitational forces that act to hold the particulate matter within the trap despite an effluent gas flow path that attempts to sweep the particles through the $PR^2$ device into the vacuum line. Thus, in part, the effectiveness of $PR^2$ 240 depends on preventing particles from leaving tube 292 until they are reacted into gaseous products. To this end, it is important that $PR^2$ 240 be positioned so that collection area 295 is downward from the inlet to the $PR^2$ and that the length of exterior tube 292 be sufficient to create this trap in combination with gravitational forces.

Increasing the cross-sectional area of the gas passageways along a plane AA within $PR^2$ 240 further helps trap particulate matter. The rate of flow for an effluent gas stream in any given deposition process is generally constant. Thus, increasing the cross-sectional area of one or more of the passage ways decreases the velocity of particles in the gas stream which correspondingly reduces the neutral drag force on the particles. A given particle is trapped by gravitational forces within the gravity trap of $PR^2$ 240, if the gravitational force on the particle exceeds the neutral drag force.

Figure 28A:
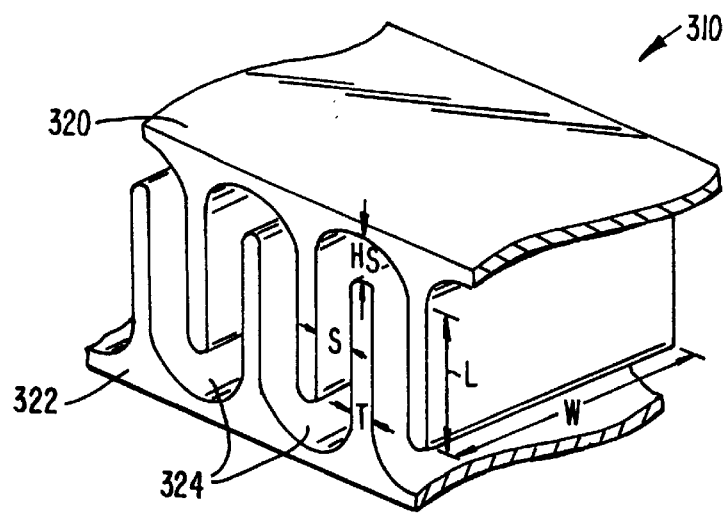
FIG. 28(a) is a side perspective cross-sectional view of a gas passage module employed in other embodiments of the PFC reducing apparatus of the present invention.

To further enhance the effectiveness of the mechanical trap, an electrostatic collector 272 including electrodes 296 and 298 connected to DC power supply 284 can be employed as discussed with respect to FIG. 25.

d) A Labyrinthal Embodiment Including Mechanical and Electrostatic Trapping Mechanisms FIG. 28(a) is a side perspective cross-sectional view of a gas passage module 310 employed in other preferred embodiments of the PFC reducing apparatus of the present invention. In FIG. 28(a), a pair of opposing electrodes 320 and 322 define a gas passageway (fluid conduit) through which gases exhausted from processing chamber 15 pass. Module 310 includes both electrostatic and mechanical trapping mechanisms to ensure that all particulate matter exhausted from chamber 15 is trapped and collected within the module.

The electrostatic trap is formed by the application of a DC voltage to one of the electrodes as described above in relation to FIG. 25. In this manner, positively charged particles are collected on one electrode and negatively charged particles are collected on the other.

The mechanical trap further collects silicon particles and residue by relying in part on gravitational forces to collect particles in collection areas 324. Each collection area 324 includes a "U"-shaped segment of the gas passageway that is situated so that particles are collected and held within the bottom area of the segment despite an effluent gas flow path that attempts to sweep the particles through the $PR^2$ device into the vacuum line. Of course, module 310 could be turned upside down so that collection areas 324 are on the opposite side of the module.

During the clean sequence, RF power is applied to one of the electrodes to create a capacitively coupled plasma of PFC gases passing through the module. Preferably, electrodes 320 and 322 are designed to have substantially equivalent surface areas. Such a design allows for a uniform plasma to be struck throughout the entire area/path defined by the electrodes. As in the above embodiments, constituents from the plasma react with the collected silicon particles and residue to convert the PFC gases into non-PFC gases.

The electrostatic collector and mechanical trap combination provides a particularly effective mechanism to collect silicon residue exhausted from chamber 15. In fact, such a combination can provide a collection efficiency of close to 100% thus having the additional benefit of eliminating or preventing deposition build up in vacuum line 331. As described above with respect to FIG. 6 and DPA 40, the mechanical trap section is particularly effective in trapping relatively large particles present in the effluent gas stream because these particles are more likely to be held within collection chamber 324 by gravitational forces. The electrostatic trap, on the other hand, is particularly effective at collecting and trapping smaller particles in the effluent gas stream that may otherwise not be collected by just the mechanical trap. Also, previously described, thermophoretic force due to a temperature gradient between the electrodes can also be employed to trap particles.

Figure 28B:
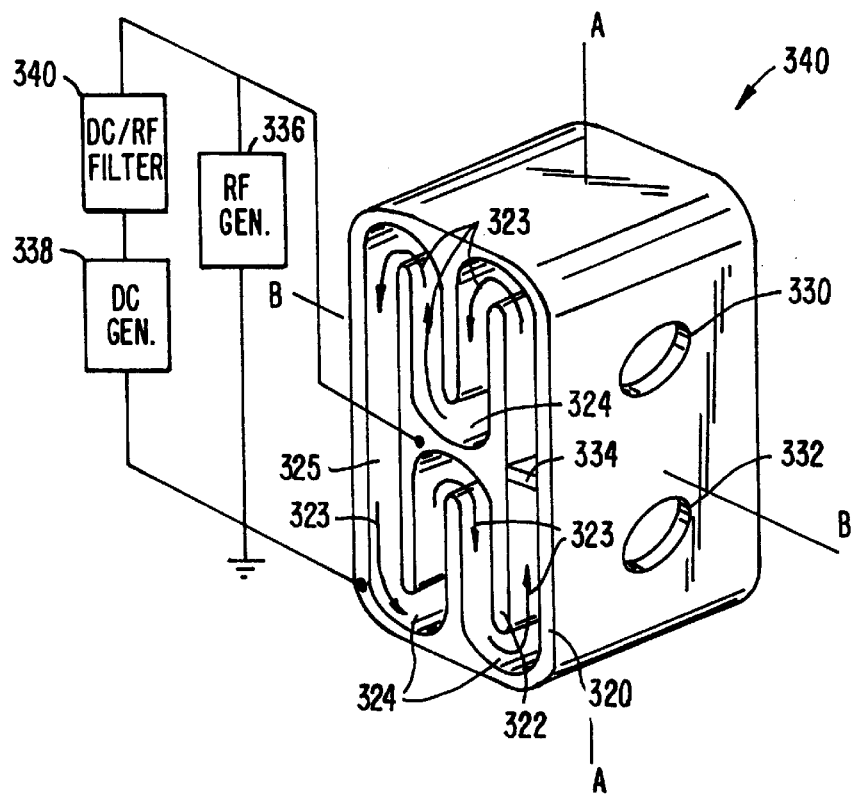
FIG. 28(b) is a side perspective cross-sectional view of an embodiment of the PFC reducing apparatus of the present invention employing the gas passage module design of FIG. 28(a)

The module shown in FIG. 28(a) may be employed as part of a variety of other embodiments of $PR^2$ 340. One example of such an embodiment is shown in FIG. 28(b), which is a side perspective cross-sectional view of an embodiment of the PFC reducing apparatus of the present invention employing a portion of the gas passage module design of FIG. 28(a) stacked on top of another similar portion of the module. Of course other designs with the module shown in FIG. 28(a) or similar modules are possible. For example, three, four or more modules may be placed in sequence to create a relatively long gas passageway having an increased electrode surface area for particle collection. Also, three, four or more modules may be stacked on top of each other and connected in a manner similar to the embodiment shown in FIG. 28(b). Module 310 may also be fitted with a filter element that contains an additional source of silicon for which constituents from the PFC plasma may react. The possibilities for other design variations based on module 310 are almost endless.

In FIG. 28(b) effluent gas from chamber 15 enters $PR^2$ 340 through inlet 330 and exits through outlet 332. A divider 334 ensures that gas flows through the labyrinthal passageway defined by electrodes 320 and 322 according to arrows 323. When $PR^2$ 340 is oriented vertically, inlet 330 side up along axis AA, larger particles exhausted through the passageway tend to collect in collection areas 324 under gravitational forces. While if $PR^2$ 340 is oriented vertically, inlet 340 side up along axis BB, larger particles exhausted through the passageway tend to collect in collection area 325.

DC generator 338 supplies a positive DC voltage to electrode 322 during both deposition and clean sequences while electrode 320 is grounded. Thus, negatively charged particles tend to collect on the surface of electrode 322 and positively charged particles tend to collect on the surface of electrode 320.

As in the other embodiments, an RF generator 336 provides RF power to electrode 322 during the clean sequence to form a plasma from effluent PFC gases in the passageway between electrodes 320 and 322. The plasma reacts with silicon collected in collection areas 324 or 325 and along electrodes 320 and 322 to convert the PFC gases to non-PFC gaseous products and byproducts. A DC/RF filter 340 prevents the RF power supply from interfering with DC generator 338. DC and RF power could be applied to electrode 320 rather than 322; however, for safety and radiation issues it is preferred that electrode 320 is grounded.

3. Experimental Use and Test Results Related to PFC Reduction DPAs

To demonstrate the effectiveness of the present invention, experiments were performed in which a prototype $PR^2$ 340 was attached to a Precision 5000 chamber outfitted for 8 inch wafers. The Precision 5000 chamber is manufactured by Applied Materials, the assignee of the present invention.

In the experiments, the prototype $PR^2$ was similar to $PR^2$ 340 of FIG. 21, except that filter 351 was not included within ceramic tube 350 and an additional gas supply line 353 did not exist. The total length of the $PR^2$ was about 25 inches and the diameter of tube 350 was about 1.5 inches. The $PR^2$ was attached to the Precision 5000 chamber immediately after the throttle valve, downstream of the chamber.

The experiments analyzed effluent gases emitted from a $CF_4$ and $N_2O$ clean sequence in three different steps. The effluent gases were monitored during each step using an MKS 300 Series Residual Gas Analyzer (RGA) manufactured by MKS Corporation. The measurements were performed just before the vacuum pump, approximately 20 feet downstream from the chamber. Thus, only stable species were considered to be detected by the RGA. Because mass spectra analysis is fairly complicated, a deposition step was not performed before the clean sequence.

The conditions for the experiments were as follows. The pressure within the chamber was set and maintained at 2 torr, which resulted in a corresponding pressure of 0.5 torr in the $PR^2$. $CF_4$ and $N_2O$ were introduced into the chamber at a rate of 500 sccm each. The plasma formed in the chamber was driven by a 13.56 MHz RF power supply at 1000 Watts (RF1), while the plasma formed in the $PR^2$ was driven by a 13.56 MHz RF power supply at 900 Watts (RF2).

For the first step of the experiment, the clean gases were introduced into the chamber and allowed to flow through the chamber and $PR^2$ without a plasma being formed. In the second step, a plasma was formed within the Precision 5000 chamber, but not within the $PR^2$. In the third step, a plasma was formed in both the chamber and $PR^2$. The results of these experiments are shown in FIG. 29(b). The first step helped determine the spectra emitted from the process and set the basis for a relative analysis of $CF_4$ emissions.

Figure 29A:
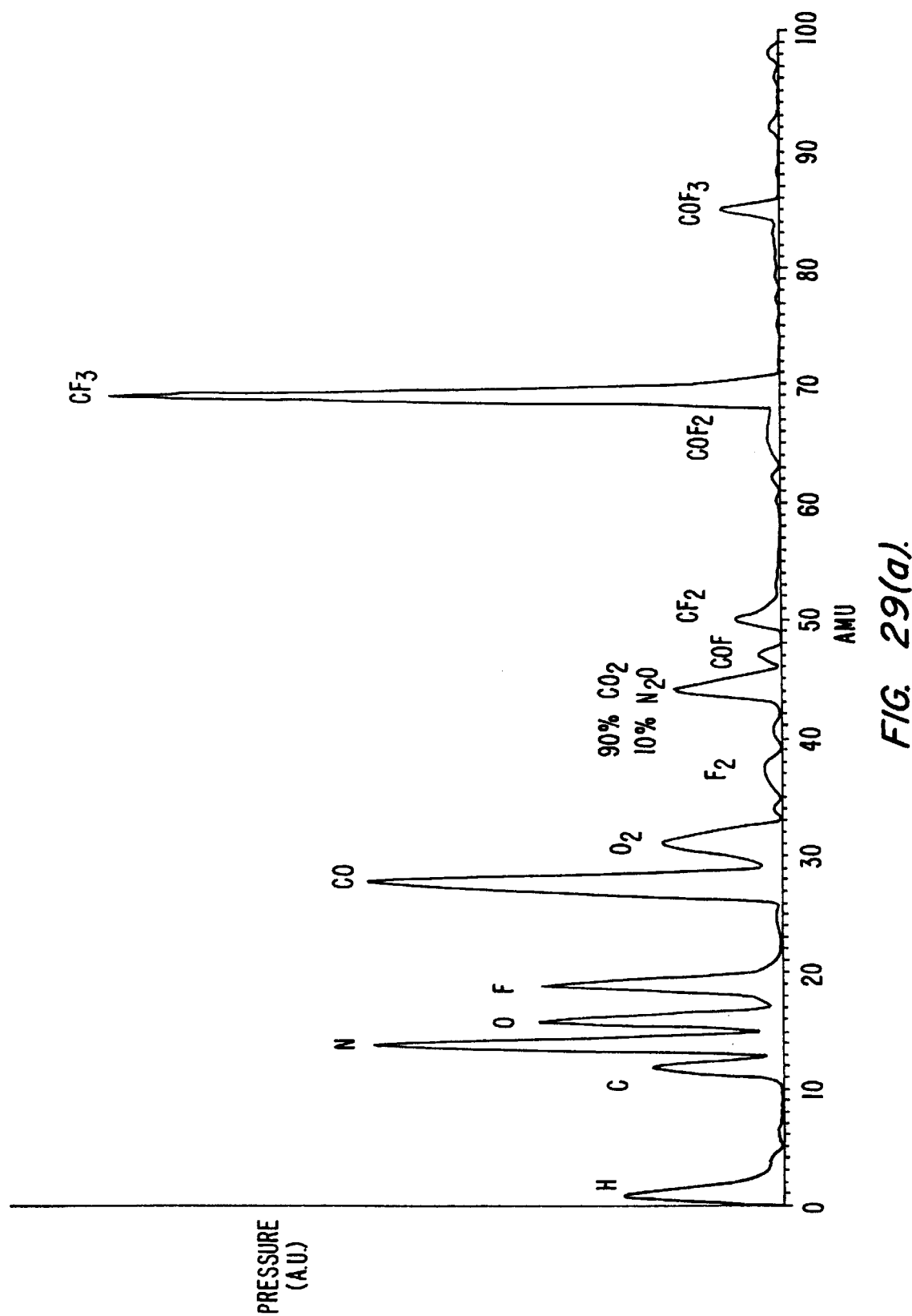
FIG. 29(a) is a graph showing mass spectrum data obtained after a formation of a plasma from $CF_4$ and $N_2O$ clean gases.
Figure 29B:
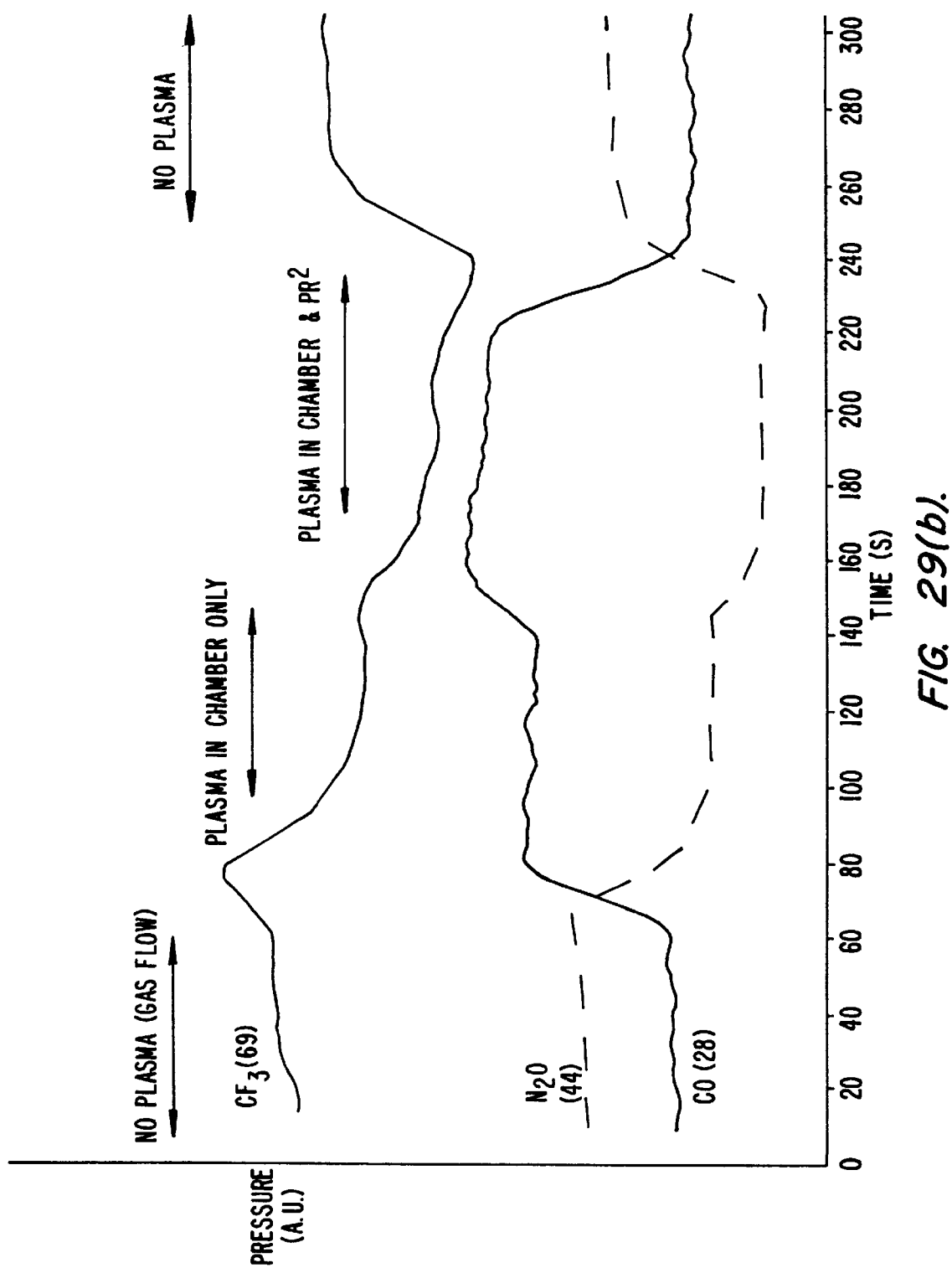
FIG. 29(b) is a graph showing the evolution peaks of specific gases measured during an experiment designed to test one embodiment of the present invention.

FIG. 29(a) shows the mass spectrum obtained when a plasma was formed from the clean gases in both the chamber and $PR^2$. It is important to note the RGA device detects gases by ionizing them. Thus, detection of $CF_3^+$, $CF_2^+$ and $CF^+$ ions represents effluent $CF_4$. In FIG. 29(a), peaks (indicated in parenthesis) were detected corresponding to $C^+$ (12), $N^+$ (14), $O^+$ (16), $F^+$ (19), $CF^+$ (31), $O_2^+$ (32), $F_2^+$ (38), $N_2O^+$ (44), $CF_2^+$ (50) and $CF_3^+$ (69). Each peak corresponds to a product of the decomposition of the initial gaseous reactants, $CF_4$ and $N_2O$. The peaks corresponding to $CO^+$ (28), $CO_2^+$ (44), $COF^+$ (47), $COF_2^+$ (66) and $COF_3^+$ (85) correspond to the byproducts of the reaction occurring in the chamber and the $PR^2$. A possible misinterpretation could occur due to the overlapping of $CO_2^+$ and $N_2O^+$ (line 44). By recording the spectra of $CF_4$ and $N_2O$ alone and recording the response with no plasma and when RF1 and RF2 are on, however, we are able to determine that the peak at line 44 represents 90% $CO_2^+$ and 10% $N_2O^+$.

Qualitatively, the abatement of $CF_4$ is observed when the response of $CF_3^+$ (69), $CF_2^+$ (50), $CF^+$(31) peaks decrease. Further evidence of decomposition is observed when the response of the peaks corresponding to $N_2O$ decreases. The response of the gaseous byproducts of the reaction $CO^+$ (28), $CO_2^+$ (44), $COF^+$ (47), $COF_2^+$ (66) and $COF_3^+$ (85) increases proportionally to the $CF_4$ abatement.

FIG. 29(*b*) shows the evolution peaks of specific gases measured by the RGA during each of the three steps of the experiment. Specifically, FIG. 12(*b*) shows the response of peaks 44 ($N_2O^+$), 69 ($CF_3^+$) and 28 ($CO^+$). The first 80 seconds shown in FIG. 29(*b*) show the response of the peaks of these gases when no plasma is formed within the chamber or within the $PR^2$. During the next 80 seconds, a plasma is formed within the chamber only, and finally, a plasma is formed in the chamber and $PR^2$ during seconds 160 to 240.

As evident from FIG. 29(*b*), when a plasma is struck within the chamber, the amount of $CF_4$ and $N_2O$ emitted decreases and the amount of CO (the main byproduct of $CF_4$ conversion process) emitted increases. Activating $PR^2$ 40 (and thus forming a plasma within $PR^2$ 40) further reduces $CF_4$ emissions and results in a total $CF_4$ abatement of about 30%.

In another experiment, for which the results are not shown, a total abatement of about 50% was achieved by increasing the pressure within the $PR^2$ to about 2 torr. Thus, these preliminary experiments show that the apparatus of the present invention is successful in PFC abatement. Further abatement can be achieved by incorporating one or more of the additional $PR^2$ features discussed within this application. Also, because $CF_4$ is generally recognized as one of the most difficult of the PFC gases to convert, the results of further experiments should produce even better results for conversion of most other PFC gases.

Having fully described several embodiments of the present invention, many other equivalent or alternative devices for and methods of removing particulate matter from a vacuum line according to the present invention will be apparent to those skilled in the art. Also, many other equivalent or alternative devices for and methods of reducing PFC emissions from a processing chamber according to the present invention will be apparent to those skilled in the art. Additionally, although the present invention has been described in some detail by way of illustration and example for purposes of clarity and understanding, it will be obvious that certain changes and modifications may be practiced. For example, while in one embodiment a mechanical particle trap of the present invention was described with respect an inner passageway surrounded by an outer passageway, such a trap could be created with a first passageway, not perimetrically contained within a second passageway, but instead extending away from or upward from the first passageway. In another example, the gas passageways in any of the embodiments disclosed can be designed to be labyrinthally shaped (and thus include gravitational traps) in a manner similar to the passageways shown in and discussed with respect to FIGS. 28(*a*) and 28(*b*) or in other manners. The silicon particle trapping embodiments could include a separate filter element filled with quartz or other silicon containing compound to enhance PFC decomposition if the amount of silicon residue collected on the electrodes is insufficient. Also, embodiments without a silicon filter and without a particle trapping system are possible. In these embodiments, gases such as $SiH_4$ or $O_2$ for the PFC conversion reaction are introduced into $PR^2$ 340 through a gas supply line such as line 253. Additionally, magnetrons, such as those employed in the embodiments of DPA 40 shown in FIGS. 17(*a*) and (*b*) and 19(*a*) and (*b*), can be employed to form the plasma in various embodiments of $PR^2$ 40. These equivalents and alternatives along with the understood obvious changes and modifications are intended to be included within the scope of the present invention.

What is claimed is:

1. An apparatus for collecting particles exhausted from a substrate processing chamber, the apparatus comprising:

a collection chamber having an inlet and an outlet and a fluid conduit therebetween, the fluid conduit being at least partially defined by first and second electrodes each having opposing surfaces, wherein the fluid conduit is structured and arranged to direct gas flow around at least one bend of the fluid conduit defining a collection area that inhibits egress of the particulate matter from the collection chamber;

a plasma generation system, operatively coupled to supply power to at least one of the electrodes to form or maintain a plasma within said fluid conduit; and an electrostatic particle trapping system, operatively coupled to apply a voltage between the electrodes to collect particulate matter on the opposing electrode surfaces.

2. The apparatus of claim 1 wherein the opposing electrode surface of said first electrode has a surface area within 95 percent of the surface area of the opposing electrode surface of said second electrode.

3. The apparatus of claim 1 wherein the fluid conduit includes first and second at least partially vertical passages communicating the collection area with the inlet and outlet, respectively, for inhibiting egress of the particulate matter from the collection chamber.

4. The apparatus of claim 3 wherein the fluid conduit formed between the opposing electrode surfaces defines a plurality of collection areas formed sequentially within the fluid conduit between the inlet and the outlet.

5. The apparatus of claim 4 wherein said opposing electrode surfaces define a serpentine fluid conduit.

6. The apparatus of claim 5 wherein the first and second electrodes each comprise a base wall portion and a plurality of wall members extending substantially vertically from the base wall portion and having an end remote from the base wall portion, the wall members being spaced apart from each other to define channels therebetween, the wall members of each electrode extending into the channels of the other electrode to form the fluid conduit therebetween.

7. The apparatus of claim 6 wherein the wall members of the first electrode extend downward from the base wall portion and the wall members of the second electrode extend upward from the base wall portion, each collection area being formed between a pair of the wall members of the second electrode and the end of one of the wall members of the first electrode.

8. The apparatus of claim 6 wherein said fluid conduit includes a left serpentine portion and a right serpentine portion, which is a mirror image of said left portion, and wherein a center one of said wall members of said second electrode divides said fluid conduit into said left and right portions.

9. The apparatus of claim 5 wherein
   said second electrode includes a base portion and a plurality of first and second wall members extending vertically away from said base portion, said plurality of first wall members extending upward from said base portion and said plurality of second wall members extending downward from said base portion, each of the first and second pluralities of wall members being spaced apart from each other to define channels therebetween; and said first electrode includes upper and lower base portions and a plurality of third and fourth wall members, said plurality of third wall members extending vertically away from said upper base portion into the channels defined by the first plurality of wall members to form an upper portion of the fluid conduit therebetween, said plurality of fourth wall members extending vertically away from said lower base portion into channels defined by the second plurality of wall members to form a lower portion of the fluid conduit therebetween.

10. The apparatus of claim 9 wherein said first plurality of wall members includes a center wall member that divides gas flow through said fluid conduit into left and right portions.

11. The apparatus of claim 10 wherein said left portion of said fluid conduit is a mirror image of said right portion.

12. The apparatus of claim 1 wherein said plasma generation system is configured to supply RF energy to said second electrode, said electrostatic particle trapping system is configured to supply a DC voltage to said second electrode and said first electrode is grounded.

13. The apparatus of claim 1 wherein said fluid conduit includes a serpentine section structured and arranged to direct gas flow around a plurality of bends such that gases reverse direction in said fluid conduit at least once while flowing from said inlet to said outlet.

14. An apparatus for collecting particles exhausted from a substrate processing chamber, the apparatus comprising:

first and second electrodes each having opposing surfaces defining a serpentine fluid conduit therebetween, the fluid conduit having an inlet, and outlet and a plurality of collection areas formed sequentially within the fluid conduit between the inlet and the outlet, wherein the fluid conduit is structured and arranged to direct gas flow through the fluid conduit so that gravitational forces act to collect particulate matter flowing through the fluid conduit and inhibit egress of the particulate matter from the collection areas wherein the fluid conduit includes first and second at least partially vertical passages communicating each collection area with the inlet and outlet;

wherein said second electrode includes a base portion and a plurality for first and second wall members extending vertically away from said base portion, said plurality of first wall members extending upward from said base portion and said plurality of second wall members extending downward from said base portion, each of the first and second pluralities of wall members being spaced apart from each other to define channels therebetween;

wherein said first electrode includes upper and lower base portions and a plurality of third and fourth wall members, said plurality of third wall members extending vertically away from said upper base portion into the channels defined by the first plurality of wall members to form an upper portion of the fluid conduit therebetween, said plurality of fourth wall members extending vertically away from said lower base portion into channels defined by the second plurality of wall members to form a lower portion of the fluid conduit therebetween; and wherein the distance between said opposing electrode surfaces in said upper portion of said fluid conduit defined by said first and third pluralities of wall members is shorter than the distance between said opposing electrode surfaces in said lower portion of said fluid conduit defined by said second and fourth pluralities of wall members.

15. An apparatus for collecting particles exhausted from a substrate processing chamber the apparatus comprising:

first and second electrodes each having opposing surfaces defining a serpentine fluid conduit therebetween, the fluid conduit having an inlet, and outlet and a plurality of collection areas formed sequentially within the fluid conduit between the inlet and the outlet, wherein the fluid conduit is structured and arranged to direct gas flow through the fluid conduit so that gravitational forces act to collect particulate matter flowing through the fluid conduit and inhibit egress of the particulate matter from the collection areas, wherein the fluid conduit includes first and second at least partially vertical passages communicating each collection area with the inlet and outlet;

wherein said second electrode includes a base portion and a plurality of first and second wall members extending vertically away from said base portion, said plurality of first wall members extending upward from said base portion and said plurality of second wall members extending downward from said base portion, each of the first and second pluralities of wall members being spaced apart from each other to define channels therebetween;

wherein said first electrode includes upper and lower base portions and a plurality of third and fourth wall members, said plurality of third wall members extending vertically away from said upper portion into the channels defined by the first plurality of wall members to form an upper portion of the fluid conduit therebetween, said plurality of fourth wall members extending vertically away from said lower base portion into channels defined by the second plurality of wall members to form a lower portion of the fluid conduit therebetween;

wherein said first plurality of wall members includes a center wall member that divides gas flow through said fluid conduit into left and right portions; and wherein said center wall members of said second electrode includes an upper edge having an angle of 30 degrees or less.

16. The apparatus of claim 15 wherein said upper edge of said center wall member of said second electrode has an angle of 10 degrees or less.

17. An apparatus for minimizing deposition in an exhaust line, the apparatus comprising:

a first electrode comprising an electrode wall enclosing an inner chamber therein, the electrode wall defining an inlet and an outlet in communication with the inner chamber;

a second electrode disposed within the inner chamber but not in electrical contact with said first electrode, the first and second electrodes having opposing surfaces defining a fluid conduit therebetween, the fluid conduit communicating the inlet with the outlet and defining one or more collection areas therebetween, the fluid conduit being structured and arranged to direct gas flow around at least one bend of the fluid conduit defining a collection area that inhibits egress of particulate matter from the apparatus;

means, operatively coupled to the first and second electrodes, for applying a voltage between the electrodes to collect electrically charged particulate matter on the opposing electrode surfaces; and means, operatively coupled to supply RF power to at least one of the electrodes to form a plasma within said fluid conduit.

18. The apparatus of claim 17 wherein said fluid conduit includes a serpentine section structured and arranged to direct gas flow around a plurality of bends such that gases reverse direction in said fluid conduit at least once while flowing from said inlet to said outlet.

19. An apparatus for minimizing deposition in an exhaust line, the apparatus comprising:

a first electrode comprising an electrode wall enclosing an inner chamber therein, the electrode wall defining an inlet and an outlet in communication with the inner chamber;

a second electrode disposed within the inner chamber but not in electrical contact with said first electrode, the first and second electrodes having opposing surfaces defining a fluid conduit therebetween, the fluid conduit communicating the inlet with the outlet and defining one or more collection areas therebetween, the fluid conduit being structured and arranged in direct gas flow around at least one bend of the fluid conduit defining a collection area that inhibits egress of particulate matter from the apparatus;

a first power supply operatively coupled to the first and second electrodes, configured to apply a voltage between the electrodes to collect electrically charged particulate matter on the opposing electrode surfaces; and a second power supply operatively coupled to supply RF power to at least one of the electrodes to form a plasma within said fluid conduit.

20. The apparatus of claim 19 wherein the first electrode comprises a perimetrical wall and one or more substantially vertical wall members extending from the perimetrical wall into the inner chamber, the wall members each having an end remote from the perimetrical wall.

21. The apparatus of claim 20 wherein the second electrode comprises a base portion and one or more substantially vertical wall members extending from the base portion, the wall members each having an end remote from the base portion.

22. The apparatus of claim 21 wherein the vertical wall members of the first and second electrodes are spaced apart from each other to define channels therebetween, the vertical wall members of each electrode extending into the channels of the other electrode to form the fluid conduit therebetween.

23. The apparatus of claim 22 wherein each collection area is formed between a pair of the vertical wall members of one of the electrodes and the end of one of the vertical wall members of the other of the electrodes.

24. The apparatus of claim 23 wherein the perimetrical wall of the first electro comprises upper and lower wall portions, the wall members of the first electrode extending downward from the upper portion and upward from the lower portion into the inner chamber, the base portion of the second electrode being positioned between the downward and upward extending walls of the first electrode to form an upper fluid conduit portion above the base portion and a lower fluid conduit portion below the base portion.

25. The apparatus of claim 24 wherein the first electrode inlet is in communication with the upper fluid conduit portion and the first electrode outlet is in communication with the lower fluid conduit portion, the electrodes further defining a substantially vertical passage communicating the upper and lower fluid conduit portions with each other.

26. The apparatus of claim 19 wherein said second power supply is configured to supply RF energy to said second electrode, said first power supply is configured to supply a DC voltage to said second electrode and said first electrode is grounded.

27. The apparatus of claim 19 wherein said first and second electrodes are in physical contact with and separated by a plurality of ceramic insulators that allow gas flow through the fluid conduit.

28. The apparatus of claim 19 wherein said first and second power supplies are coupled to said second electrode through a filter that isolates the first power supply from the second power supply.

29. The apparatus of claim 19 wherein said fluid conduit includes a serpentine section structured and arranged to direct gas flow around a plurality of bends such that gases reverse direction in said fluid conduit at least once while flowing from said inlet to said outlet.

30. An apparatus for collecting particles exhausted from a substrate processing chamber, the apparatus comprising:

a collection chamber having an inlet and an outlet and a fluid conduit therebetween, the fluid conduit being at least partially defined by first and second electrodes each having opposing surfaces, wherein the fluid conduit is structured and arranged to direct gas flow toward a protrusion extending toward said inlet that divides gas flow through said fluid conduit into separate gas paths with each gas path including at least one bend of the fluid conduit to inhibit egress of the particulate matter from the collection chamber wherein said protrusion includes an upper edge having an angle of 30 degrees or less.

31. The apparatus of claim 30 wherein the angle of said upper edge is 10 degrees or less.

32. The apparatus of claim 31 wherein said protrusion is part of said second electrode.

33. The apparatus of claim 30 wherein said fluid conduit includes a serpentine section structured and arranged to direct gas flow around a plurality of bends such that gases reverse direction in said fluid conduit at least once while flowing from said inlet to said outlet.

34. An apparatus for collecting particles exhausted from a substrate processing chamber, the apparatus comprising:

a collection chamber having an inlet and an outlet and a fluid conduit therebetween, the fluid conduit being at least partially defined by first and second electrodes each having opposing surfaces, wherein the fluid conduit is structured and arranged to direct gas flow around at least one hand of the fluid conduit to inhibit egress of particulate matter from the collection chamber and wherein said fluid conduit includes a first portion in proximity to said inlet and a second portion in proximity to said outlet, wherein the distance between said opposing electrodes in said first portion is shorter than the distance between said opposing electrodes in said second portion.

* * * * *